US010566951B2

(12) United States Patent
Nosaka

(10) Patent No.: US 10,566,951 B2
(45) Date of Patent: Feb. 18, 2020

(54) RADIO-FREQUENCY FILTER CIRCUIT, MULTIPLEXER, RADIO-FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/186,839

(22) Filed: Nov. 12, 2018

(65) Prior Publication Data

US 2019/0081613 A1 Mar. 14, 2019

Related U.S. Application Data

(63) Continuation of application No. PCT/JP2017/019787, filed on May 26, 2017.

(30) Foreign Application Priority Data

May 27, 2016 (JP) .................................. 2016-106772

(51) Int. Cl.
*H03H 9/64* (2006.01)
*H03F 3/19* (2006.01)
(Continued)

(52) U.S. Cl.
CPC ................. *H03H 9/64* (2013.01); *H03F 3/19* (2013.01); *H03H 7/075* (2013.01); *H03H 7/461* (2013.01);
(Continued)

(58) Field of Classification Search
CPC .......... H03H 9/64; H03H 7/461; H03H 9/703; H03H 7/075; H03H 9/14541; H03H 9/72;
(Continued)

(56) References Cited

U.S. PATENT DOCUMENTS 9,041,484 B2 * 5/2015 Burgener ............... H03H 9/542
333/101
2009/0251235 A1 10/2009 Belot et al.
(Continued)

FOREIGN PATENT DOCUMENTS

JP 2016-054374 A 4/2016
JP 2016-072808 A 5/2016
(Continued)

OTHER PUBLICATIONS

International Search Report for International Application No. PCT/JP2017/019787 dated Aug. 22, 2017.
(Continued)

*Primary Examiner* — Eugene Yun
(74) *Attorney, Agent, or Firm* — Pearne & Gordon LLP

(57) ABSTRACT

A filter includes a series arm circuit connected between an input-output terminal and an input-output terminal and a parallel arm circuit connected between a ground and a node. The parallel arm circuit includes a first circuit and a second circuit. The first circuit has a parallel arm resonator. The second circuit is connected in parallel with the first circuit and has a parallel arm resonator. At least one of the first and second circuits includes a variable frequency circuit. The variable frequency circuit is connected in series with the parallel arm resonator or the parallel arm resonator included in the corresponding one of the first and second circuits. The variable frequency circuit has an impedance element and a switch connected in parallel with each other. The parallel arm resonator has a resonant frequency different from the parallel arm resonator and an anti-resonant frequency different from the parallel arm resonator.

24 Claims, 27 Drawing Sheets

(51) Int. Cl.
*H03H 7/075* (2006.01)
*H03H 7/46* (2006.01)
*H04B 1/40* (2015.01)
*H03H 9/72* (2006.01)
*H03H 9/145* (2006.01)
*H03H 9/70* (2006.01)

(52) U.S. Cl.
CPC ......... *H04B 1/40* (2013.01); *H03F 2200/451* (2013.01); *H03H 9/14541* (2013.01); *H03H 9/703* (2013.01); *H03H 9/72* (2013.01)

(58) Field of Classification Search
CPC .. H03H 7/46; H03H 7/01; H03F 3/195; H03F 3/68; H03F 3/19; H03F 2200/249; H03F 2200/111; H03F 2200/417; H03F 2200/421; H03F 2200/451; H04B 1/525; H04B 1/40; H04B 1/38
USPC .......................................................... 455/73
See application file for complete search history.

(56) References Cited

U.S. PATENT DOCUMENTS

2010/0188166 A1   7/2010  Hara et al.
2012/0188026 A1*  7/2012  Yamaji ............... H03H 9/14535
                                                   333/133

FOREIGN PATENT DOCUMENTS

KR   10-2010-0087617 A   8/2010
WO      2014/034222 A1   3/2014

OTHER PUBLICATIONS

Written Opinion for International Application No. PCT/JP2017/019787 dated Aug. 22, 2017.

* cited by examiner

FIG. 5C
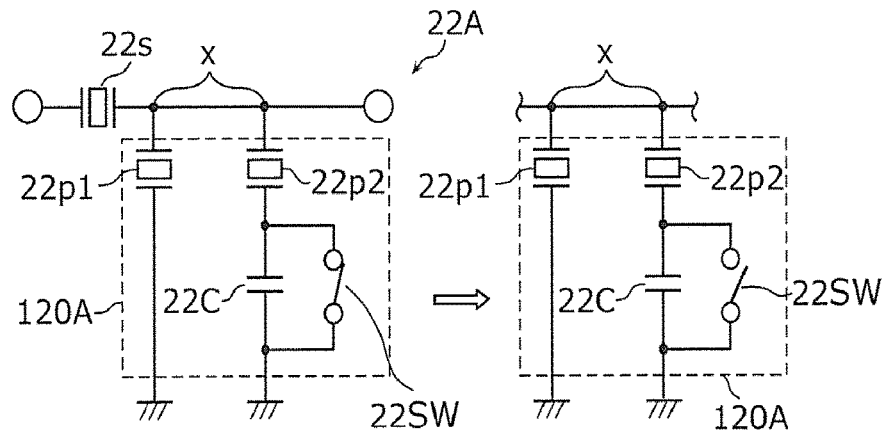
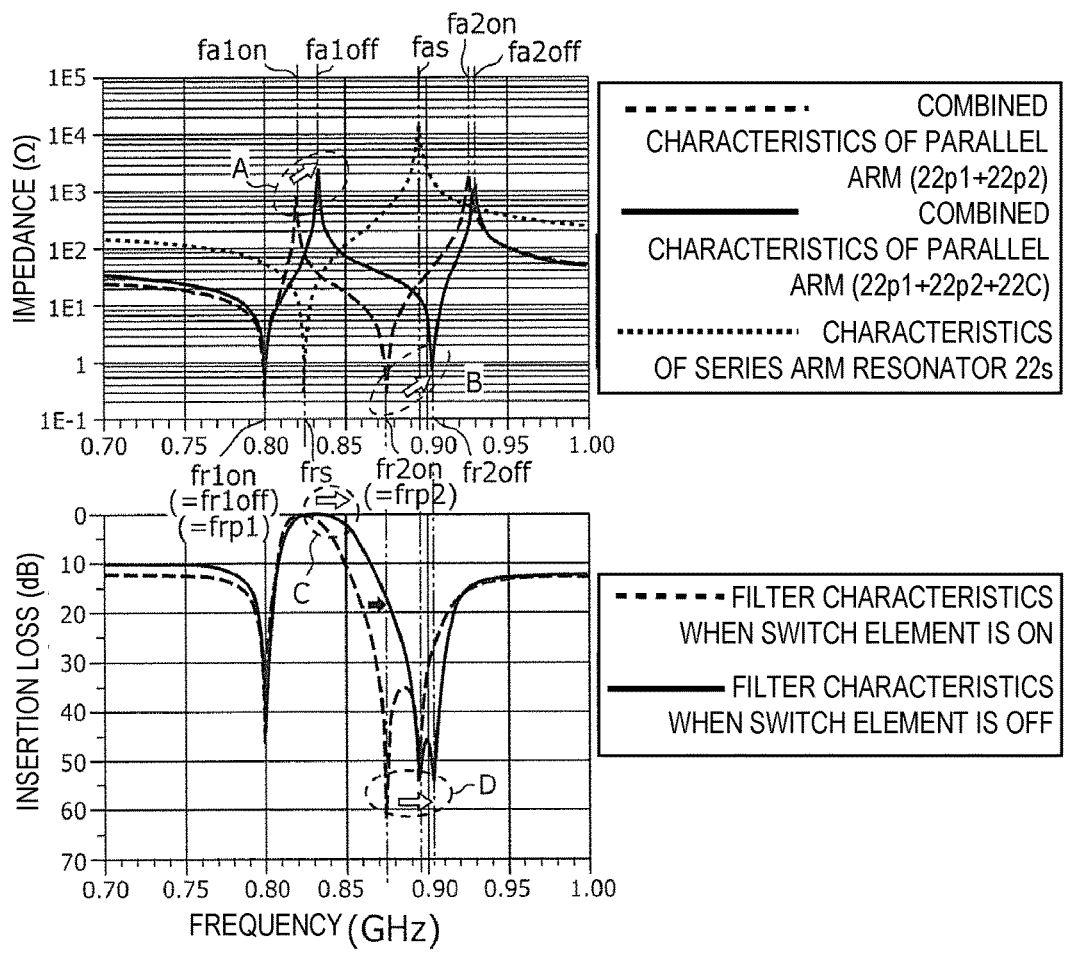

FIG. 10
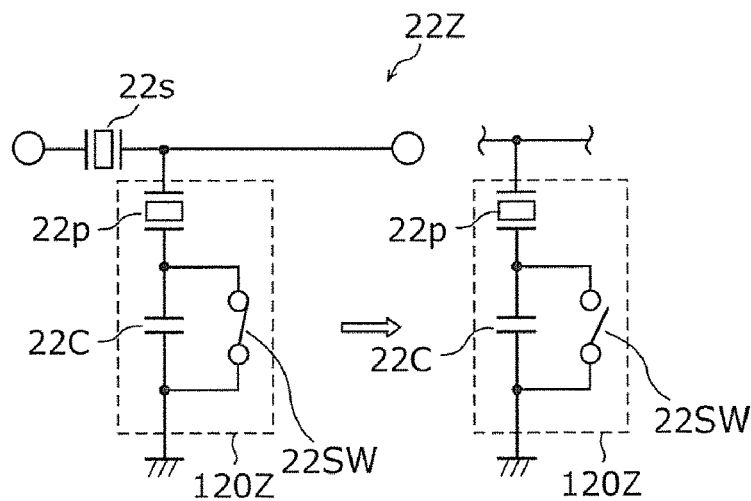
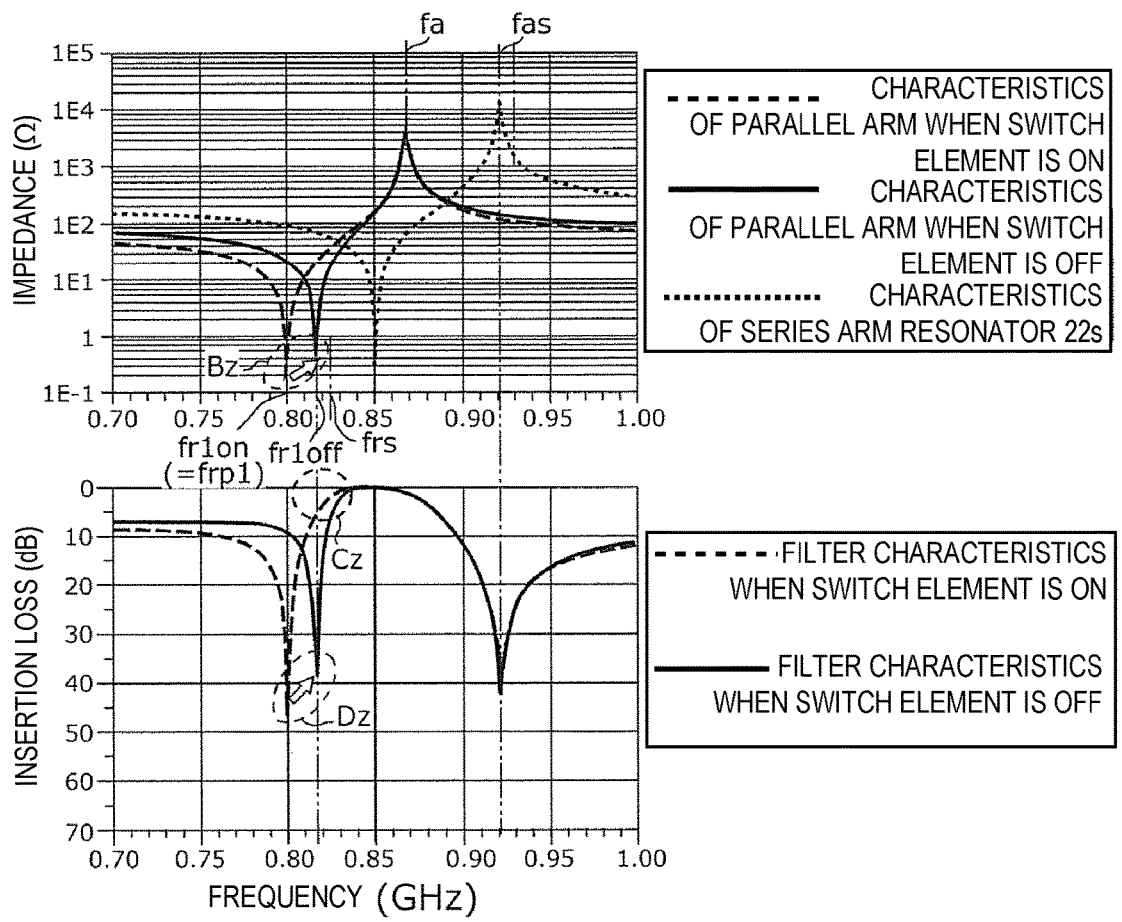

RADIO-FREQUENCY FILTER CIRCUIT, MULTIPLEXER, RADIO-FREQUENCY FRONT-END CIRCUIT, AND COMMUNICATION DEVICE

This is a continuation of International Application No. PCT/JP2017/019787 filed on May 26, 2017 which claims priority from Japanese Patent Application No. 2016-106772 filed on May 27, 2016. The contents of these applications are incorporated herein by reference in their entireties.

BACKGROUND OF THE DISCLOSURE

Field of the Disclosure

The present disclosure relates to a radio-frequency filter circuit including a resonator, and to a multiplexer, a radio-frequency front-end circuit, and a communication device.

Description of the Related Art

Hitherto, an elastic wave filter using elastic waves is widely used as a band pass filter, such as that disposed in a front-end portion of a mobile communication device. To respond to multimode/multiband technologies, a radio-frequency front-end circuit including multiple elastic wave filters has been put to practical use.

For example, as the configuration of a multiband-support elastic wave filter, the following configuration (see Patent Document 1, for example) is known. In a ladder-filter parallel arm circuit constituted by BAW (Bulk Acoustic Wave) resonators, a capacitor and a switch connected in parallel with each other is connected in series with a parallel arm resonator. Such an elastic wave filter forms a tunable filter that can change the frequency of the attenuation pole on the lower-frequency side of a pass band (that is, a variable frequency filter that can vary the frequency) as a result of switching the switch between ON and OFF.
Patent Document 1: U.S. Patent Application Publication No. 2009/0251235

BRIEF SUMMARY OF THE DISCLOSURE

In a typical band pass filter, the pass band is determined by the anti-resonant frequency of a parallel arm circuit, the attenuation pole on the lower-frequency side of the pass band is formed by the resonant frequency of the parallel arm circuit, and the attenuation band is determined by this attenuation pole.

In the above-described configuration of the related art, however, the anti-resonant frequency of the parallel arm circuit which determines the pass band does not change, and only the resonant frequency of the parallel arm circuit which determines the attenuation band is changed as a result of switching the switch between ON and OFF. Because of this configuration, when shifting the attenuation band on the lower-frequency side of the pass band to a lower frequency as a result of switching the switch between ON and OFF, only the frequency of the above-described attenuation pole is changed. This may increase the insertion loss at an edge of the pass band.

That is, in the above-described configuration, the insertion loss is increased at an edge of the pass band as a result of switching the switch between ON and OFF.

The present disclosure has been made to solve the above-described problem. It is an object of the present disclosure to provide a radio-frequency filter circuit, a multiplexer, a radio-frequency front-end circuit, and a communication device that can change the frequency of a pass band and that of an attenuation band without substantially increasing the insertion loss at an edge of the pass band.

To achieve the above-described object, a radio-frequency filter circuit according to one aspect of the present disclosure includes a series arm circuit and a parallel arm circuit. The series arm circuit is connected between first and second input-output terminals. The parallel arm circuit is connected between a ground and a node on a path connecting the first and second input-output terminals. The parallel arm circuit includes first and second circuits. The first circuit includes a first parallel arm resonator. The second circuit is connected in parallel with the first circuit and includes a second parallel arm resonator. At least one of the first and second circuits includes a variable frequency circuit. The variable frequency circuit is connected in series with the first parallel arm resonator or the second parallel arm resonator included in the at least one of the first and second circuits. The variable frequency circuit has an impedance element and a switch element connected in parallel with each other. The second parallel arm resonator has a resonant frequency different from that of the first parallel arm resonator and an anti-resonant frequency different from that of the first parallel arm resonator.

In the radio-frequency filter circuit, the lower resonant frequency of the parallel arm circuit determines the attenuation pole on the lower-frequency side of the pass band, the higher resonant frequency of the parallel arm circuit determines the attenuation pole on the higher-frequency side of the pass band, and the lower anti-resonant frequency of the parallel arm circuit and the series arm circuit determine the pass band.

According this aspect, with the configuration of the above-described parallel arm circuit, as a result of the switch element being switched between ON and OFF, it is possible to shift at least one of at least two resonant frequencies and at least one of at least two anti-resonant frequencies in the parallel arm circuit to the higher-frequency side or the lower-frequency side together. The frequency at an edge of the pass band and that of an attenuation pole can thus be shifted to the lower-frequency side or the higher-frequency side together. According to this aspect, therefore, it is possible to switch the frequency of the pass band and that of the attenuation band without substantially increasing the insertion loss at an edge of the pass band.

The parallel arm circuit may have at least two resonant frequencies and at least two anti-resonant frequencies. As a result of the switch element being switched between ON and OFF, the variable frequency circuit may shift at least one of the at least two resonant frequencies and at least one of the at least two anti-resonant frequencies in the parallel arm circuit to a lower-frequency side or a higher-frequency side together.

The resonant frequency of the first parallel arm resonator may be lower than that of the second parallel arm resonator. The anti-resonant frequency of the first parallel arm resonator may be lower than that of the second parallel arm resonator. The first circuit may not include the variable frequency circuit, and the second circuit may include the variable frequency circuit.

With this configuration, as a result of the switch element being switched between ON and OFF, it is possible to shift the higher one of the at least two resonant frequencies and the lower one of the at least two anti-resonant frequencies in the parallel arm circuit to the lower-frequency side or the higher-frequency side together. The frequency at the high edge of the pass band and that of the attenuation pole on the higher-frequency side of the pass band can thus be shifted to the lower-frequency side or the higher-frequency side together. According to this aspect, therefore, it is possible to switch the frequency at the high edge of the pass band and that of the attenuation pole on the higher-frequency side of the pass band without substantially increasing the insertion loss at the high edge of the pass band.

The resonant frequency of the first parallel arm resonator may be lower than that of the second parallel arm resonator. The anti-resonant frequency of the first parallel arm resonator may be lower than that of the second parallel arm resonator. The first circuit may include the variable frequency circuit, and the second circuit may not include the variable frequency circuit.

With this configuration, as a result of the switch element being switched between ON and OFF, it is possible to shift the lower one of the at least two resonant frequencies and the lower one of the at least two anti-resonant frequencies in the parallel arm circuit to the lower-frequency side or the higher-frequency side together. The frequency at the low edge of the pass band and that of the attenuation pole on the lower-frequency side of the pass band can thus be shifted to the lower-frequency side or the higher-frequency side together. According to this aspect, therefore, it is possible to switch the frequency at the low edge of the pass band and that of the attenuation pole on the lower-frequency side of the pass band without substantially increasing the insertion loss at the low edge of the pass band.

The resonant frequency of the first parallel arm resonator may be lower than that of the second parallel arm resonator. The anti-resonant frequency of the first parallel arm resonator may be lower than that of the second parallel arm resonator. Each of the first and second circuits may include the variable frequency circuit.

With this configuration, as a result of the switch element of the second circuit being switched between ON and OFF, the frequency at the high edge of the pass band and the attenuation pole on the higher-frequency side of the pass band can be changed. As a result of the switch element of the first circuit being switched between ON and OFF, the frequency at the low edge of the pass band and the attenuation pole on the lower-frequency side of the pass band can be changed. According to this aspect, therefore, it is possible to switch the frequency at the low edge of the pass band and that of the attenuation pole on the lower-frequency side of the pass band and also the frequency at the high edge of the pass band and that of the attenuation pole on the higher-frequency side of the pass band without substantially increasing the insertion loss at the edges of the pass band.

The switch element of the variable frequency circuit included in the first circuit and the switch element of the variable frequency circuit included in the second circuit may be switched together to be ON or OFF. As a result of the switch elements being switched between ON and OFF, the variable frequency circuit included in the first circuit and the variable frequency circuit included in the second circuit shift the at least two resonant frequencies and the at least two anti-resonant frequencies in the parallel arm circuit to a lower-frequency side or a higher-frequency side together.

This makes it possible to switch the center frequency without substantially increasing the insertion loss at the edges of the pass band.

The impedance element may be a capacitor.

Typically, capacitors have a higher Q factor than inductors and require less space. Using a capacitor as the above-described impedance element can thus reduce the size of the radio-frequency filter circuit without substantially increasing the insertion loss at the edges of the pass band.

The radio-frequency filter circuit may have a ladder filter structure including at least two of the above-described parallel arm circuits and at least one of the above-described series arm circuits.

With this configuration, each of the at least two parallel arm circuits includes the above-described variable frequency circuit so that the bandpass characteristics of the overall radio-frequency filter can be adjusted more precisely. Accordingly, as a result of appropriately switching the switch elements between ON and OFF in each of the at least two parallel arm circuits, it is possible to adjust the bandpass characteristics to switch to a suitable band. Additionally, providing plural parallel arm circuits which form a ladder filter structure can enhance the attenuation (attenuation in the elimination band).

The series arm circuit may include a series arm resonator. The resonant frequency of the first parallel arm resonator may be lower than that of the series arm circuit. The resonant frequency of the second parallel arm resonator may be higher than that of the series arm circuit.

With this configuration, an attenuation pole is added on the higher-frequency side of the pass band by the anti-resonant frequency of the series arm circuit which is determined by the anti-resonant frequency of the series arm resonator. It is thus possible to form a radio-frequency filter circuit having enhanced attenuation on the higher-frequency side of the pass band.

In a case in which a value obtained by dividing a frequency difference between an anti-resonant frequency and a resonant frequency of a resonator by the resonant frequency is defined as a bandwidth ratio of the resonator, the bandwidth ratio of the series arm resonator may be smaller than that of at least one of the first and second parallel arm resonators.

This can enhance the sharpness on the higher-frequency side of the pass band.

The radio-frequency filter circuit may include a plurality of surface acoustic wave resonators. Each of the surface acoustic wave resonators includes an IDT electrode constituted by a plurality of electrode fingers formed on a substrate at least partly having piezoelectric properties. At least one of the plurality of surface acoustic wave resonators forms the series arm resonator, and the series arm resonator may have a first adjusting film, which is used for adjusting the bandwidth ratio, between the IDT electrode and the substrate.

The bandwidth ratio of the surface acoustic wave resonator can be set by adjusting the film thickness of the first adjusting film. For example, in order to set the bandwidth ratio of the series arm resonator to be smaller than that of the first and second parallel arm resonators, the film thickness of the first adjusting film provided for the series arm resonator is made thicker than that for the first and second parallel arm resonators.

The radio-frequency filter circuit may include a plurality of surface acoustic wave resonators. Each of the surface acoustic wave resonators includes an IDT electrode constituted by a plurality of electrode fingers formed on a substrate at least partly having piezoelectric properties. At least one of the plurality of surface acoustic wave resonators forms the series arm resonator, and the IDT electrode of the series arm resonator may be covered with a second adjusting film used for adjusting the bandwidth ratio.

The bandwidth ratio of the surface acoustic wave resonator can be set by adjusting the film thickness of the second adjusting film. For example, in order to set the bandwidth ratio of the series arm resonator to be smaller than that of the first and second parallel arm resonators, the film thickness of the second adjusting film provided for the series arm resonator is made thicker than that for the first and second parallel arm resonators.

The series arm circuit may include a longitudinally coupled resonator disposed between the first and second input-output terminals.

This makes it possible to implement a radio-frequency filter circuit that responds to the required filter characteristics, such as enhanced attenuation.

Each of the first and second parallel arm resonators may be an elastic wave resonator. The elastic wave resonator may be a surface acoustic wave resonator or a bulk acoustic wave resonator.

This can decrease the size of each of the series arm resonator and the first and second parallel arm resonators, and the size and the cost of the radio-frequency filter circuit can accordingly be reduced. Surface acoustic wave resonators and bulk acoustic wave resonators typically exhibit high Q factor characteristics, thereby achieving small-loss, high-selectivity characteristics of the radio-frequency filter circuit.

The switch element may be an FET switch made of GaAs or CMOS or a diode switch.

A switch using such a semiconductor is small in size, and the size of the radio-frequency filter circuit can accordingly be reduced.

The impedance element may be a variable capacitor or a variable inductor.

Using a variable capacitor or a variable inductor can set the element value in smaller units, and thus, the frequency of the pass band and that of the attenuation pole can be switched more precisely.

A multiplexer according to one aspect of the present disclosure includes a plurality of radio-frequency filter circuits including one of the above-described radio-frequency filter circuits.

This makes it possible for a multiplexer, which is applied to a multiband-support system, to switch the frequency of a pass band and that of an attenuation band without substantially increasing the insertion loss at an edge of the pass band.

The plurality of radio-frequency filter circuits may include a radio-frequency filter circuit without the variable frequency circuit. The radio-frequency filter circuit without the variable frequency circuit may be constituted by an elastic wave resonator. In a case in which a value obtained by dividing a frequency difference between an anti-resonant frequency and a resonant frequency of a resonator by the resonant frequency is defined as a bandwidth ratio of the resonator, the bandwidth ratio of at least one of the first and second parallel arm resonators may be greater than that of the elastic wave resonator forming the radio-frequency filter circuit without the variable frequency circuit.

Many radio-frequency filter circuits without the variable frequency circuit support only one of the 3GPP (Third Generation Partnership Project) bands. In contrast, the radio-frequency filter circuits with the variable frequency circuits support multiple 3GPP bands. This will be explained more specifically. When the switch element of the variable frequency circuit of a radio-frequency filter circuit is ON, the frequency difference (second bandwidth) between the lower anti-resonant frequency and the lower resonant frequency of the parallel arm circuit including the first parallel arm resonator and the frequency difference (third bandwidth) between the higher resonant frequency and the lower anti-resonant frequency of this parallel arm circuit are smaller than the frequency difference (first bandwidth) between the anti-resonant frequency and the resonant frequency of the first parallel arm resonator.

When the switch element is OFF, one of the second and third bandwidths becomes even smaller. The variable frequency range of the resonant frequency or the anti-resonant frequency of the parallel arm circuit that can be changed as a result of the switch element being switched between ON and OFF is even smaller than the second bandwidth or the third bandwidth.

By setting the bandwidth ratio of the first parallel arm resonator to be greater than that of the elastic wave resonator forming the radio-frequency filter circuit without the variable frequency circuit, the variable frequency range can be increased, so that more bands can be supported.

A radio-frequency front-end circuit according to one aspect of the present disclosure includes a plurality of radio-frequency filter circuits and a switch circuit. The plurality of radio-frequency filter circuits includes one of the above-described radio-frequency filter circuits. The switch circuit is disposed at a stage preceding the plurality of radio-frequency filter circuits or at a stage following the plurality of radio-frequency filter circuits. The switch circuit includes a plurality of selection terminals and a common terminal. The plurality of selection terminals are individually connected to the corresponding radio-frequency filter circuits. The common terminal is selectively connected to the plurality of selection terminals.

With this configuration, it is possible to handle together some of the signal paths through which radio-frequency signals are transferred. The same amplifier circuit, for example, can thus be used for some of the plurality of radio-frequency filter circuits. As a result, the size and the cost of the radio-frequency front-end circuit can be reduced.

A radio-frequency front-end circuit according to one aspect of the present disclosure includes one of the above-described radio-frequency filter circuits and a controller that controls ON and OFF operations of the switch element.

With this configuration, it is possible to switch the frequency of a pass band and that of an attenuation pole in accordance with the required frequency specifications without substantially increasing the insertion loss at an edge of the pass band.

A communication device according to one aspect of the present disclosure includes an RF signal processing circuit and one of the above-described radio-frequency front-end circuits. The RF signal processing circuit processes radio-frequency signals transmitted and received by an antenna element. The radio-frequency front-end circuit transfers the radio-frequency signals between the antenna element and the RF signal processing circuit.

In a multiband-support communication device, it is possible to switch the frequency of a pass band and that of an attenuation pole in accordance with the required frequency specifications without substantially increasing the insertion loss at an edge of the pass band.

According to the present disclosure, such as the radio-frequency filter circuit, it is possible to change the frequency of a pass band and that of an attenuation band without substantially increasing the insertion loss at an edge of the pass band.

BRIEF DESCRIPTION OF THE SEVERAL VIEWS OF THE DRAWINGS

FIG. 5A shows graphs illustrating the impedance characteristics and the bandpass characteristics of the filter according to the first embodiment when a switch of the filter is ON.

FIG. 5C shows graphs illustrating the comparison between the impedance characteristics and the bandpass characteristics of the filter according to the first embodiment when the switch is ON and those when the switch is OFF.

FIG. 7A shows graphs illustrating the impedance characteristics and the bandpass characteristics of the filter according to the first modified example of the first embodiment when the switch is ON.

FIG. 10 shows a circuit diagram illustrating the configuration of a filter according to a comparative example of the first embodiment, and also shows graphs illustrating the impedance characteristics and the bandpass characteristics of the filter.

DETAILED DESCRIPTION OF THE DISCLOSURE

Figure 1:
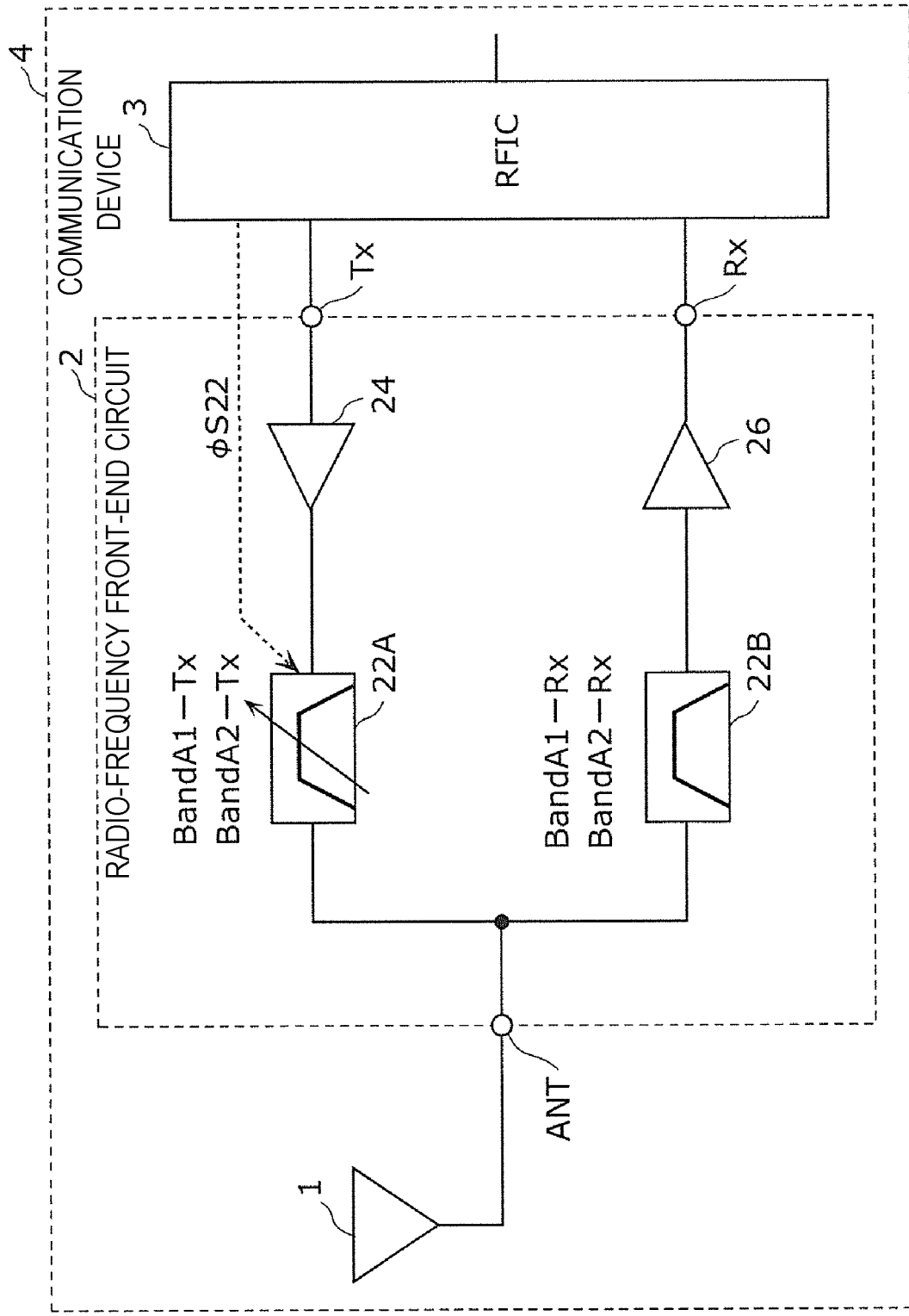
FIG. 1 is a schematic diagram of a communication device according to a first embodiment.

Embodiments of the present disclosure will be described below in detail by using examples and the drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios. In the individual drawings, substantially the same configurations are designated by like reference numerals, and an explanation thereof may not be repeated or may be simplified from the second time.

In the following description, "low edge of a pass band" means "the lowest frequency within a pass band", and "high edge of a pass band" means "the highest frequency within a pass band". In the following description, "lower-frequency side of a pass band" means "lower-frequency side outside a pass band and lower than the pass band", and "higher-frequency side of a pass band" means "higher-frequency side outside a pass band and higher than the pass band". Hereinafter, "lower-frequency side" may also be called "lower frequency or lower frequencies", and "higher-frequency side" may also be called "higher frequency or higher frequencies".

In the following description, a switch element will be explained as an ideal element in which, when the switch element is ON, the impedance is infinite, and when the switch element is OFF, the impedance is zero. In reality, however, the switch element contains parasitic components, such as capacitance components when the switch element is OFF, inductance components when the switch element is ON, and resistance components. The characteristics of the switch element are thus slightly different from those of a switch element as an ideal element.

First Embodiment

1. Circuit Configuration of Communication Device

FIG. 1 is a schematic diagram of a communication device 4 according to a first embodiment. As shown in FIG. 1, the communication device 4 includes an antenna element 1, a radio-frequency front-end circuit 2, and an RF signal processing circuit (RFIC: Radio Frequency Integrated Circuit) 3. The communication device 4 is a multimode/multiband-support cellular phone, for example. The antenna element 1, the radio-frequency front-end circuit 2, and the RFIC 3 are disposed in a front-end portion of this cellular phone, for example.

The antenna element 1 is a multiband-support antenna which sends and receives radio-frequency signals. The antenna element 1 is compliant with the communication standards, such as 3GPP. The antenna element 1 may not necessarily support all the bands of the communication device 4, and may only support bands of a low-frequency band group or those of a high-frequency band group. The antenna element 1 may not necessarily be integrated in the communication device 4.

The radio-frequency front-end circuit 2 is a circuit that transfers radio-frequency signals between the antenna element 1 and the RFIC 3. More specifically, the radio-frequency front-end circuit 2 transfers a radio-frequency signal outputted from the RFIC 3 (radio-frequency transmitted signal, in this case) to the antenna element 1 via a transmitted signal path which connects a transmitting terminal Tx and an antenna terminal ANT. The radio-frequency front-end circuit 2 also transfers a radio-frequency signal received by the antenna element 1 (radio-frequency received signal, in this case) to the RFIC 3 via a received signal path which connects the antenna terminal ANT and a receiving terminal Rx. The detailed configuration of the radio-frequency front-end circuit 2 will be discussed later.

The RFIC 3 is an RF signal processing circuit which processes radio-frequency signals sent and received by the antenna element 1. More specifically, the RFIC 3 performs signal processing, such as down-conversion, on a radio-frequency signal (radio-frequency received signal, in this case) inputted from the antenna element 1 via the received signal path of the radio-frequency front-end circuit 2. The RFIC 3 then outputs a received signal generated by performing signal processing to a baseband signal processing circuit (not shown). The RFIC 3 also performs signal processing, such as up-conversion, on a transmitted signal inputted from the baseband signal processing circuit. The RFIC 3 then outputs a radio-frequency signal (radio-frequency transmitted signal, in this case) generated by performing signal processing to the transmitted signal path of the radio-frequency front-end circuit 2.

In this embodiment, the RFIC 3 also serves as a controller that controls ON and OFF operations of individual switches included in the radio-frequency front-end circuit 2, based on the frequency band to be used. More specifically, the RFIC 3 controls the switching of the individual switches between ON and OFF in accordance with a control signal φS22.

2. Configuration of Radio-Frequency Front-End Circuit

The detailed configuration of the radio-frequency front-end circuit 2 will now be discussed below.

As shown in FIG. 1, the radio-frequency front-end circuit 2 includes filters 22A and 22B, a transmit amplifier circuit 24, and a receiving amplifier circuit 26.

The filter 22A is a tunable filter, which is a radio-frequency filter circuit having a variable frequency function. More specifically, the filter 22A switches the pass band to a first pass band or a second pass band. That is, the filter 22A is able to switch between first bandpass characteristics and second bandpass characteristics whose pass bands are different from each other. In this embodiment, the filter 22A is a transmitting filter using the transmission band of BandA1 as the first pass band and the transmission band of BandA2 as the second pass band. The filter 22A is disposed on the transmitted signal path. The detailed configuration of the filter 22A will be discussed later.

The filter 22B is a fixed filter, which is a radio-frequency filter circuit without a variable frequency function. In this embodiment, the filter 22B is a receiving filter using the reception band of BandA1 and that of BandA2 as the pass bands. The filter 22B is disposed on the received signal path. The filter 22B may be a tunable filter that can change the pass band, as in the filter 22A.

The transmit amplifier circuit 24 is a power amplifier which amplifies the power of a radio-frequency transmitted signal outputted from the RFIC 3. In this embodiment, the transmit amplifier circuit 24 is disposed between the filter 22A and the transmitting terminal Tx.

The receiving amplifier circuit 26 is a low-noise amplifier which amplifies the power of a radio-frequency received signal received by the antenna element 1. In this embodiment, the receiving amplifier circuit 26 is disposed between the filter 22B and the receiving terminal Rx.

The radio-frequency front-end circuit 2 configured as described above transfers a radio-frequency signal by suitably changing the pass band of the filter 22A in accordance with the control signal φS22 outputted from the controller (RFIC 3 in this embodiment).

That is, as a result of a switch element within the filter 22A being switched between ON and OFF in accordance with the control signal φS22 outputted from the controller, the filter 22A is able to switch the frequency of the pass band and that of the attenuation pole. The switch element will be discussed later.

For example, the controller switches the switch element within the filter 22A to be one of the ON state and the OFF state in the environment where BandA1 is used, and switches the switch element to the other one of the ON state and the OFF state in the environment where BandA2 is used. That is, the switch element within the filter 22A is switched to the ON state or the OFF state in a certain environment, and this state is fixed (unchanged) in this environment.

3. Configuration of Filter (Tunable Filter)

The detailed configuration of the filter 22A will be explained below together with the bandpass characteristics demanded for the filter 22A.

In a multimode/multiband-support system, two or more bands are used mutually exclusively in some cases. In the radio-frequency front-end circuit 2 shown in FIG. 1, BandA1 and BandA2 are examples of the bands used mutually exclusively.

Figure 2:
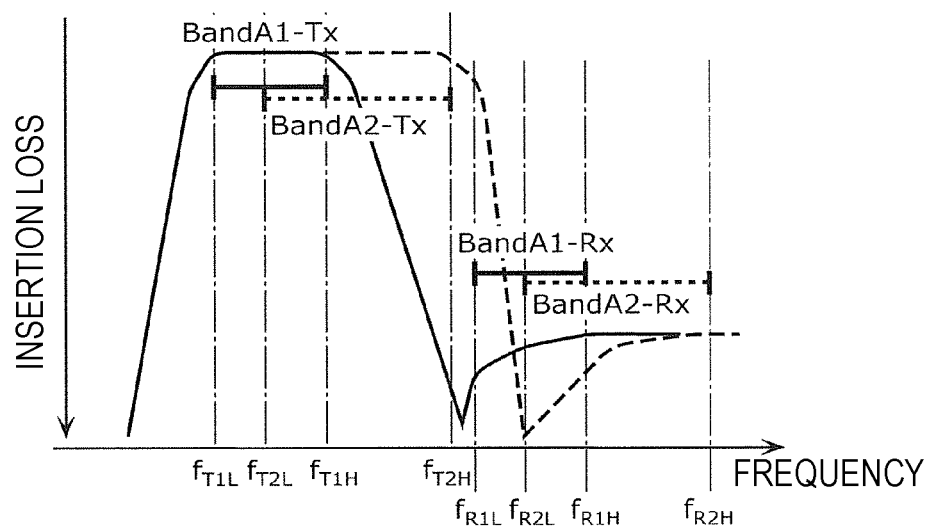
FIG. 2 is a graph illustrating the relationship between the frequency allocation and the bandpass characteristics demanded for a filter according to the first embodiment.

FIG. 2 is a graph illustrating the relationship between the frequency allocation and the bandpass characteristics demanded for the filter 22A according to the first embodiment. As shown in FIG. 2, the transmission band of BandA1 (first pass band) is a range of $f_{T1L}$ to $f_{T1H}$, while the transmission band of BandA2 is a range of $f_{T2L}$ to $f_{T2H}$. The transmission band of BandA1 and that of BandA2 (second pass band) overlap each other in a range of $f_{T2L}$ to $f_{T1H}$. The high edge $f_{T2H}$ of the transmission band of BandA2 is higher than that $f_{T1H}$ of the transmission band of BandA1. The reception band of BandA1 is a range of $f_{R1L}$ to $f_{R1H}$, while the reception band of BandA2 is a range of $f_{R2L}$ to $f_{R2H}$. The reception band of BandA1 and that of BandA2 overlap each other in a range of $f_{R2L}$ to $f_{R1H}$. The frequency interval between the high edge $f_{T2H}$ of the transmission band of BandA2 and the low edge $f_{R1L}$ of the reception band of BandA1 is very small, or the two edges overlap each other. In the above-described frequency allocation, BandA1 and BandA2 are used mutually exclusively.

The first and second pass bands are not restricted to those described above and may be other bands which are different from each other. "Bands different from each other" includes, not only a case in which the bands partially overlap each other, but also a case in which the bands are totally separated from each other.

When forming a transmitting filter in accordance with the above-described frequency specifications of BandA1 and BandA2, the bandpass characteristics shown in FIG. 2 are required in order to achieve a small loss in the individual transmission bands and a sufficient attenuation in the individual reception bands. That is, as the bandpass characteristics (first bandpass characteristics) of the transmitting filter concerning BandA1, the characteristics indicated by the solid lines in FIG. 2 are required, and as the bandpass characteristics (second bandpass characteristics) of the transmitting filter concerning BandA2, the characteristics indicated by the broken lines in FIG. 2 are required. More specifically, regarding the second bandpass characteristics, it is necessary to extend the pass band toward the higher-frequency side than that of the first bandpass characteristics without substantially increasing the insertion loss within the pass band. That is, when switching between the first and second bandpass characteristics, it is necessary to shift the frequency of the attenuation slope while maintaining the sharpness of this attenuation slope.

To satisfy the above-described filter characteristics, the filter 22A has the circuit configuration discussed below.

Figure 3:
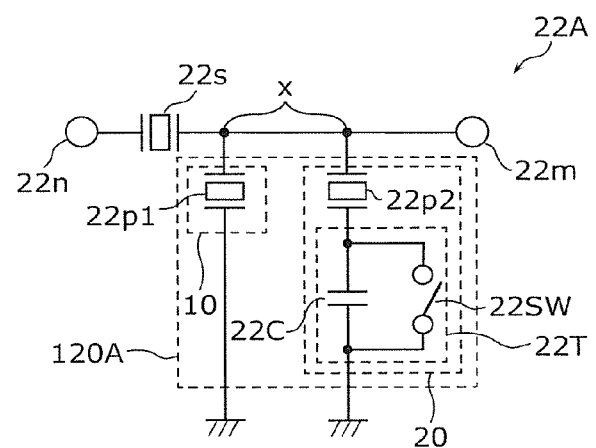
FIG. 3 is a circuit diagram illustrating the configuration of the filter according to the first embodiment.

FIG. 3 is a circuit diagram illustrating the configuration of the filter 22A according to the first embodiment. The filter 22A shown in FIG. 3 includes a series arm resonator 22s, parallel arm resonators 22p1 and 22p2, a switch 22SW, and a capacitor 22C.

The series arm resonator 22s is an example of a series arm circuit connected between an input-output terminal 22m (first input-output terminal) and an input-output terminal 22n (second input-output terminal). More specifically, the series arm resonator 22s is a resonator disposed on a series arm which connects the input-output terminals 22m and 22n.

The series arm circuit is not restricted to the above-described configuration, and may be a resonance circuit constituted by multiple resonators including a longitudinally coupled resonator, for example. The series arm circuit is not even limited to a resonance circuit, and may be an impedance element, such as an inductor or a capacitor.

The parallel arm resonators 22p1 and 22p2, the capacitor 22C, and the switch 22SW form a parallel arm circuit 120A connected between a ground and a node x on a path (on the series arm) connecting the input-output terminals 22m and 22n. That is, the parallel arm circuit 120A is disposed on one parallel arm which connects the series arm and a ground. The filter 22A has a filter structure including the single parallel arm circuit 120A and a single series arm circuit constituted by the single series arm resonator 22s.

The parallel arm circuit 120A has at least two resonant frequencies and at least two anti-resonant frequencies. A least one resonant frequency and at least one anti-resonant frequency are shifted together to the lower-frequency side or the higher-frequency side in accordance with the switching of the switch 22SW between ON and OFF. This will be discussed later together with the bandpass characteristics of the filter 22A.

More specifically, the parallel arm circuit 120A includes first and second circuits 10 and 20. The first circuit 10 has the parallel arm resonator 22p1. The second circuit 20 is connected in parallel with the first circuit 10 and has the parallel arm resonator 22p2. At least one of the first and second circuits 10 and 20 includes a variable frequency circuit. The variable frequency circuit is connected in series with the parallel arm resonator 22p1 or 22p2 included in the corresponding one of the first and second circuits 10 and 20, and has an impedance element and a switch element connected in parallel with each other. The variable frequency circuit configured in this manner shifts at least one of the at least two resonant frequencies in the parallel arm circuit 120A and one of the at least two anti-resonant frequencies in the parallel arm circuit 120A to the lower-frequency side or the higher-frequency side together, as a result of the switch 22SW being switched between ON and OFF.

In this embodiment, the first circuit 10 does not include a variable frequency circuit, but the second circuit 20 includes a variable frequency circuit 22T. The variable frequency circuit 22T includes the capacitor 22C as the impedance element and the switch 22SW as the switch element connected in parallel with each other.

Concerning the connection order of the variable frequency circuit 22T and the parallel arm resonator (parallel arm resonator 22p2, in this case), in this embodiment, the variable frequency circuit 22T is connected between the parallel arm resonator and a ground. That is, the parallel arm resonator is connected to the node x, while the variable frequency circuit 22T is connected to a ground. This connection order is not particularly restricted and may be reversed. Nevertheless, reversing this connection order increases the loss in the pass band of the filter 22A. Additionally, if the parallel arm resonator is formed on a resonator chip (package) together with other elastic wave resonators, more terminals are required on the chip, thereby increasing the size of the chip. Hence, in terms of the characteristics and the smaller size of the filter, it is preferable that the variable frequency circuit 22T and the parallel arm resonator be connected in the connection order as in this embodiment.

The parallel arm resonator 22p1 is a first parallel arm resonator, which is a resonator connected between a ground and the node x on the path connecting the input-output terminals 22m and 22n. In this embodiment, the parallel arm resonator 22p1 forms the first circuit 10 connected between the node x and a ground. That is, in this embodiment, the first circuit 10 is constituted only by the parallel arm resonator 22p1.

The parallel arm resonator 22p2 is a second parallel arm resonator, which is a resonator connected between a ground and the node x on the path connecting the input-output terminals 22m and 22n. In this embodiment, the parallel arm resonator 22p2 forms, together with the switch 22SW and the capacitor 22C, the second circuit 20 connected in parallel with the first circuit 10. That is, in this embodiment, the second circuit 20 is constituted by the parallel arm resonator 22p2, the switch 22SW, and the capacitor 22C.

The parallel arm resonator 22p2 has a resonant frequency, which is different from that of the parallel arm resonator 22p1, and an anti-resonant frequency, which is different from that of the parallel arm resonator 22p1. In this embodiment, the resonant frequency of the parallel arm resonator 22p1 is lower than that of the parallel arm resonator 22p2, and the anti-resonant frequency of the parallel arm resonator 22p1 is lower than that of the parallel arm resonator 22p2. "Resonant frequency" is a frequency at which the impedance is minimized, while "anti-resonant frequency" is a frequency at which the impedance is maximized.

The capacitor 22C is an impedance element connected in series with the parallel arm resonator 22p2 in this embodiment. The range by which the frequency of the pass band of the filter 22A is variable (hereinafter referred to as the variable frequency range) is determined by the element value of the capacitor 22C. For example, as the element value of the capacitor 22C is smaller, the variable frequency range becomes wider. The element value of the capacitor 22C is thus suitably determined in accordance with the frequency specifications demanded for the filter 22A. The capacitor 22C may be a variable capacitor, such as a varicap or a DTC (Digitally Tunable Capacitor).

In this embodiment, the switch 22SW is a SPST (Single Pole Single Throw) switch element, for example, in which one terminal is connected to a connection node between the parallel arm resonator 22p2 and the capacitor 22C and the other terminal is connected to a ground. The switch 22SW is switched between ON and OFF by the control signal $\phi$S22 outputted from the controller (RFIC 3 in this embodiment) so that the connection node and a ground are electrically connected or disconnected.

For example, the switch 22SW may be a FET (Field Effect Transistor) switch made of GaAs or CMOS (Complementary Metal Oxide Semiconductor) or a diode switch. A switch using such a semiconductor is small in size, and the size of the filter 22A can accordingly be reduced.

In this embodiment, the resonators (series arm resonator 22s and parallel arm resonators 22p1 and 22p2) forming the filter 22A are surface acoustic wave resonators using surface acoustic waves. The filter 22A can thus be formed by an IDT (InterDigital Transducer) electrode formed on a substrate at least partly having piezoelectric properties. This makes it possible to implement a small-size, low-height filter circuit exhibiting sharp bandpass characteristics. The structure of the surface acoustic wave resonator will be discussed below.

Figure 4A:
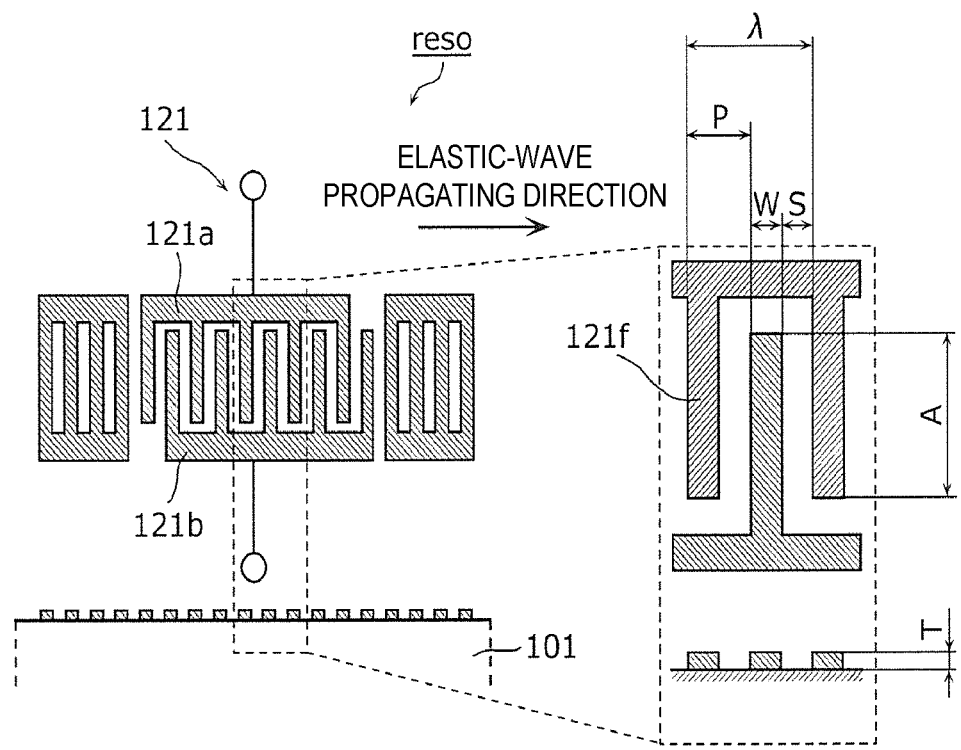
FIG. 4A shows plan views and sectional views of the electrode structure of a surface acoustic wave resonator in the first embodiment.
Figure 4B:
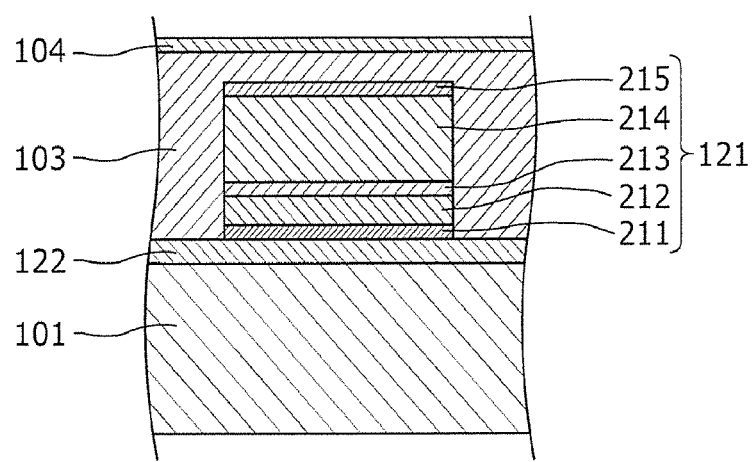
FIG. 4B is a sectional view of the structure of electrode fingers and their surrounding portions of the surface acoustic wave resonator in the first embodiment.

FIG. 4A shows plan views and sectional views of the electrode structure of the surface acoustic wave resonator in the first embodiment. FIG. 4B is a sectional view of the structure of the electrode fingers and their surrounding portions of the surface acoustic wave resonator in the first embodiment. FIGS. 4A and 4B show plan views and sectional views schematically illustrating the structure of a surface acoustic wave resonator reso which corresponds to each of the surface acoustic wave resonators forming the filter 22A. The surface acoustic wave resonator reso in FIG. 4A is illustrated for explaining the typical structure of each of the surface acoustic wave resonators forming the filter 22A, and the number and the length of electrode fingers forming the electrode are not restricted to those shown in FIG. 4A.

As shown in FIG. 4A, the surface acoustic wave resonator reso includes an IDT electrode 121. The IDT electrode 121 is constituted by plural electrode fingers 121f formed on a substrate 101 at least partly having piezoelectric properties. With this configuration, the size of each of the resonators forming the filter 22A can be decreased, and the size and the cost of the filter 22A can accordingly be reduced. The surface acoustic wave resonator typically exhibits high Q-factor characteristics, thereby achieving small-loss, high-selectivity characteristics of the filter 22A.

As shown in FIGS. 4A and 4B, the surface acoustic wave resonator reso includes the substrate 101 having piezoelectric properties, a Ksaw adjusting film 122, and protection layers 103 and 104, in addition to the IDT electrode 121.

The substrate 101 having piezoelectric properties is made of lithium tantalate ($LiTaO_3$), lithium niobate ($LiNbO_3$), potassium niobate ($KNbO_3$), quartz, or a multilayer body thereof. With this configuration, the surface acoustic wave resonator reso exhibits high Q-factor and wide-band characteristics.

The substrate 101 having piezoelectric properties may at least partly have piezoelectric properties. For example, the substrate 101 may be constituted by a multilayer body having a piezoelectric thin film (piezoelectric member) on the surface, a film having an acoustic velocity different from that of the piezoelectric thin film, and a support substrate. Alternatively, the entirety of the substrate 101 may have piezoelectric properties. In this case, the substrate 101 is constituted by a single piezoelectric layer.

As shown in FIG. 4A, the IDT electrode 121 is constituted by a pair of comb-shaped electrodes 121a and 121b which are opposed to each other. Each of the comb-shaped electrodes 121a and 121b is constituted by plural electrode fingers 121f parallel with each other and a busbar electrode connecting the plural electrode fingers 121f. The plural electrode fingers 121f are formed along a direction perpendicular to the propagating direction. Reflectors are disposed on both sides of the IDT electrode 121. The reflectors may be constituted by weighted reflectors. Alternatively, reflectors may not necessarily be provided.

The IDT electrode 121 is constituted by a low-density metal layer or a multilayer body of a low-density metal layer and a high-density metal layer. The low-density metal layer is a metal layer made of a low-density metal selected from at least one of Al, Ti, Cu, Ag, Ni, Cr, and an alloy thereof, or a multilayer body of such metal layers. The high-density metal layer is a metal layer made of a high-density metal selected from at least one of Au, Pt, Ta, Mo, and W. The low-density metal is not limited to the above-described materials, and may be a metal having a density smaller than that of a high-density metal forming the high-density metal layer.

For example, the IDT electrode 121 shown in FIG. 4B is constituted by a metal film 211 made of NiCr, a metal film 212 made of Pt, a metal film 213 made of Ti, a metal film 214 made of AlCu (alloy of Al and Cu), and a metal film 215 made of Ti, which are stacked in this order from the substrate 101 having piezoelectric properties. That is, the IDT electrode 121 is constituted by a multilayer body of the four metal films 211, 213, 214, and 215, which are low-density metal layers, and the metal film 212, which is a high-density metal layer.

The protection layers 103 and 104 are layers which protect the IDT electrode 121 from external environments and which also adjust the frequency-temperature characteristics and enhance the moisture resistance.

The Ksaw adjusting film 122 is a first adjusting film formed between the substrate 101 and the IDT electrode 121 to adjust the electromechanical coupling coefficient. The Ksaw adjusting film 122 is the first adjusting film which adjusts the bandwidth ratio, which is an index indicating a frequency difference between the anti-resonant frequency and the resonant frequency of the surface acoustic wave resonator reso.

The protection layers 103 and 104 and the Ksaw adjusting film 122 are made of silicon oxide ($SiO_2$), silicon nitride (SiN), aluminum nitride (AlN), or a multilayer body thereof. For example, the protection layer 103 and the Ksaw adjusting film 122 are made of $SiO_2$, and the protection layer 104 is made of SiN. The protection layers 103 and 104 form a second adjusting film which adjusts the bandwidth ratio of the surface acoustic wave resonator reso.

Adjusting of the bandwidth ratio by using the Ksaw adjusting film 122 and the second adjusting film will be discussed later, together with the definition of the bandwidth ratio.

The configuration of the IDT electrode 121 shown in FIG. 4B is only an example, and is not restricted thereto. As stated above, the IDT electrode 121 may be a single layer of a metal film, instead of a multilayer structure of metal films. The materials forming the metal films and the protection layers are not limited to those described above. The IDT electrode 121 may be made of a metal, such as Ti, Al, Cu, Pt, Au, Ag, or Pd, or an alloy thereof, or may be constituted by plural multilayer bodies made of the above-described metals and alloys. The protection layers 103 and 104 and the Ksaw adjusting film 122 are not limited to the above-described configurations, and may be made of a dielectric member or an insulator made of $SiO_2$, SiN, AlN, or polyimide, or a multilayer body thereof. Among the protection layers 103 and 104 and the Ksaw adjusting film 122, at least one of them may be omitted.

In the surface acoustic wave resonator reso configured as described above, the wavelength of elastic waves to be excited is determined by the design parameters of the IDT electrode 121, for example.

The wavelength of elastic waves is determined by the repeating period $\lambda$ of the electrode fingers 121f connected to one busbar electrode. The electrode finger pitch (pitch of the plural electrode fingers 121f, that is, the electrode finger period) P is ½ of the repeating period $\lambda$. The electrode finger pitch P is also defined by P=(W+S) where the line width of the electrode fingers 121f is W and the space width between adjacent electrode fingers 121f is S. The interdigital width A of the electrode fingers 121f is the length of the electrode fingers by which the electrode finger 121f connected to one of the pair of busbars and the electrode finger 121f connected to the other busbar overlap each other as viewed from the propagating direction of elastic waves. The electrode duty (duty ratio) is the ratio of the line width of the plural electrode fingers 121f, and is defined by the ratio of the line width to the total value of the line width and the space width of the plural electrode fingers 121f, that is, the electrode duty is defined by W/(W+S). In other words, the electrode duty is defined by the ratio of the width of the plural electrode fingers 121f to the electrode finger pitch (pitch of the plural electrode fingers 121f), that is, by W/P. The number of pairs is the number of pairs of electrode fingers 121f, and is defined by (total number of electrode fingers 121f–1)/2. The film thickness T of the IDT electrode 121 (that is, the film thickness of the plural electrode fingers 121f) is the total film thickness of the metal films 211 through 215. The electrostatic capacity $C_0$ of the surface acoustic wave resonator reso is expressed by the following equation 1.

[Math. 1]

$$\text{Electrostatic capacity } C_0 = \frac{\varepsilon_0 \cdot \varepsilon_r \cdot \text{Number of pairs} \cdot \text{Interdigital width}}{2 \cdot (1 - \text{Electrode duty})} \quad \text{(Equation 1)}$$

$\varepsilon_0$ is a dielectric constant in a vacuum, and $\varepsilon_r$ is a dielectric constant of the substrate 101.

The resonators forming the filter 22A may not necessarily be surface acoustic wave resonators using SAW (Surface Acoustic Wave), but may be resonators using BAW (that is, bulk acoustic wave resonators). That is, any resonator having "resonant frequency", which is the frequency of a singularity point at which the impedance is minimized (ideally zero) and "anti-resonant frequency", which is the frequency of a singularity point at which the impedance is maximized (ideally infinite) may be used as each resonator of the filter 22A. SAW includes boundary waves.

4. Bandpass Characteristics of Filter (Tunable Filter)

As a result of the switch 22SW being switched between ON and OFF in accordance with the control signal $\phi S22$, the bandpass characteristics of the filter 22A are switched between the first bandpass characteristics and the second bandpass characteristics. The bandpass characteristics of the filter 22A will be described below together with the state of the switch 22SW with reference to FIGS. 5A through 5C.

Figure 5A:
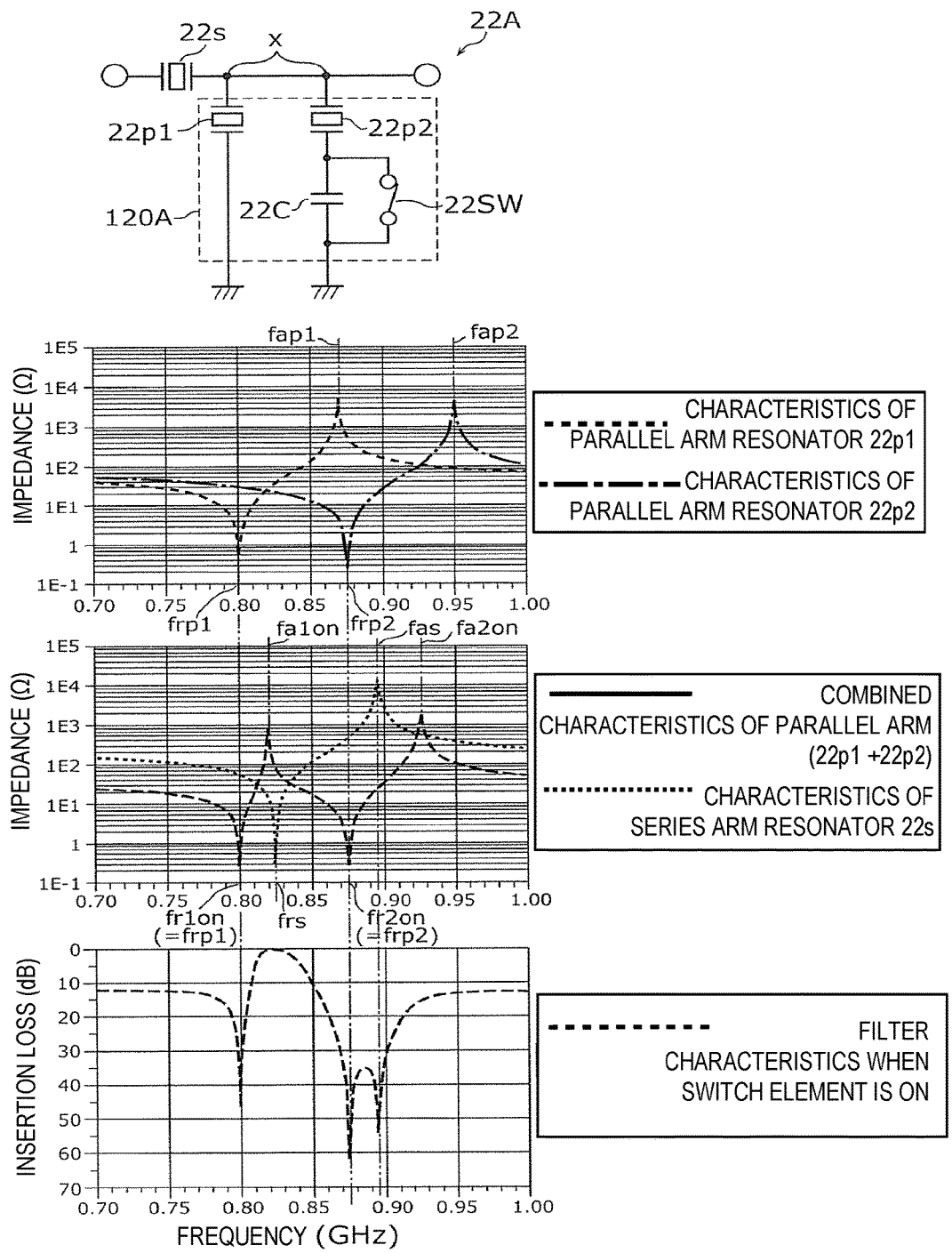
Figure 5B:
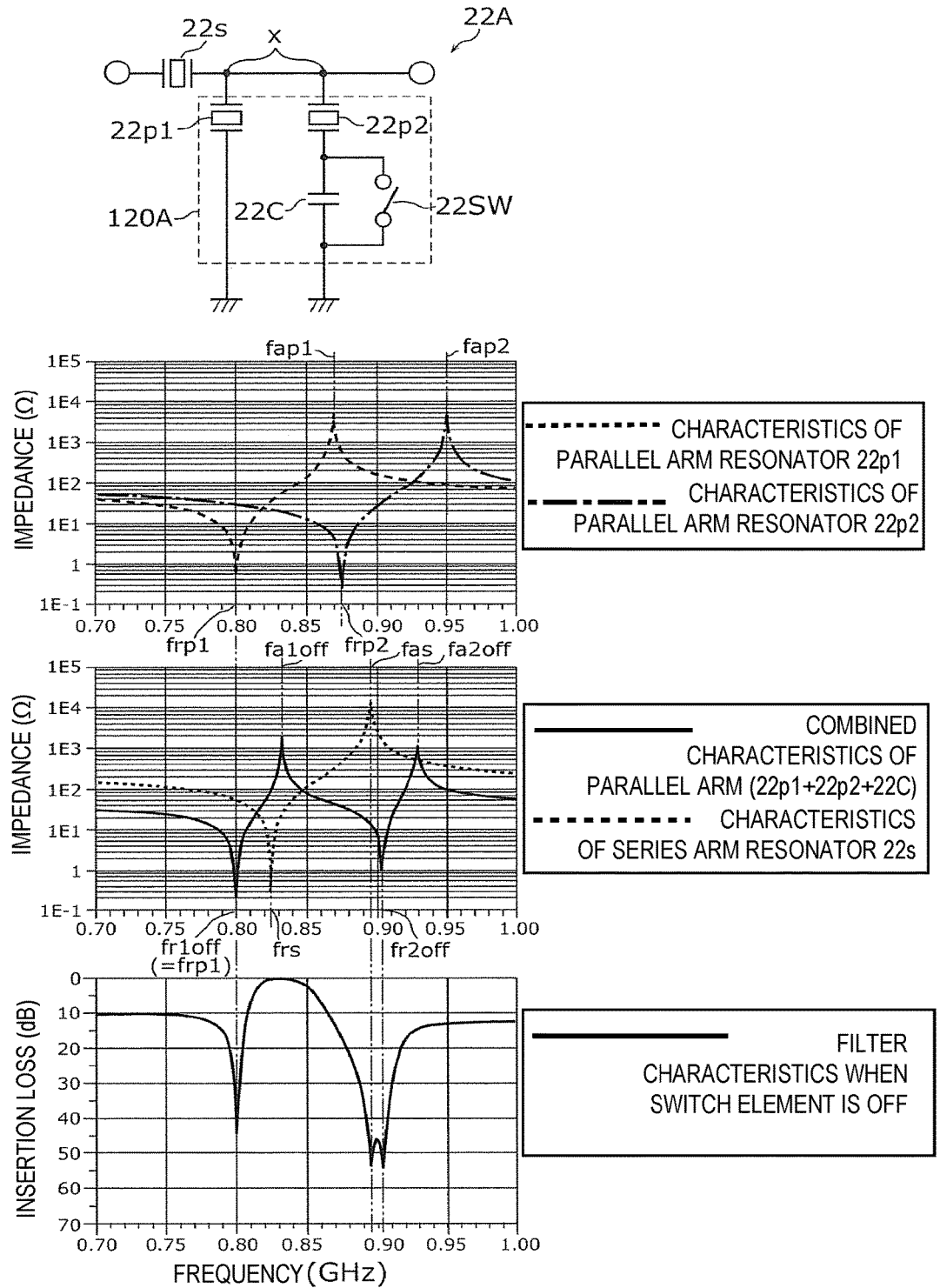
FIG. 5B shows graphs illustrating the impedance characteristics and the bandpass characteristics of the filter according to the first embodiment when the switch is OFF.

FIG. 5A shows graphs illustrating the impedance characteristics and the bandpass characteristics of the filter 22A according to the first embodiment when the switch 22SW is ON. FIG. 5B shows graphs illustrating the impedance characteristics and the bandpass characteristics of the filter 22A according to the first embodiment when the switch 22SW is OFF. FIG. 5C shows graphs illustrating the comparison between the impedance characteristics and the bandpass characteristics of the filter 22A according to the first embodiment when the switch 22SW is ON and those when the switch 22SW is OFF.

The impedance characteristics of a single resonator will first be explained with reference to FIG. 5A. For the sake of convenience, in the following description, concerning a parallel arm circuit, as well as concerning a resonator, the frequency of a singularity point at which the impedance is minimized (ideally zero) will be called "resonant frequency", while the frequency of a singularity point at which the impedance is maximized (ideally infinite) will be called "anti-resonant frequency".

As shown in FIG. 5A, the series arm resonator 22s and the parallel arm resonators 22p1 and 22p2 have the following impedance characteristics. The parallel arm resonator 22p1 has a resonant frequency frp1 and an anti-resonant frequency fap1 (which satisfy frp1<fap1). The parallel arm resonator 22p2 has a resonant frequency frp2 and an anti-resonant frequency fap2 (which satisfy frp1<frp2 and fap1<fap2). The series arm resonator 22s has a resonant frequency frs and an anti-resonant frequency fas (which satisfy frs<fas and frp1<frs<frp2).

The impedance characteristics of the parallel arm circuit 120A will be described below.

FIG. 5A shows that, when the switch 22SW is ON, the impedance characteristics of the parallel arm circuit 120A are not influenced by the capacitor 22C because the capacitor 22C is short-circuited by the switch 22SW. That is, in this case, the combined characteristics of the two parallel arm resonators (parallel arm resonators 22p1 and 22p2) ("combined characteristics of parallel arm (22p1+22p2)" in FIG. 5A) are the impedance characteristics of the parallel arm circuit 120A.

More specifically, when the switch 22SW is ON, the parallel arm circuit 120A exhibits the following impedance characteristics.

The parallel arm circuit 120A has two resonant frequencies fr1on and fr2on (which satisfy fr1on=frp1 and fr2on=frp2). That is, the impedance of the parallel arm circuit 120A is minimized (i) at the resonant frequency frp1 of the parallel arm resonator 22p1 forming the parallel arm circuit 120A and (ii) at a frequency higher than the resonant frequency frp2 of the parallel arm resonator 22p2.

The parallel arm circuit 120A has two anti-resonant frequencies fa1on and fa2on (which satisfy fr1on<fa1on<fr2on<fa2on, fa1on<fap1, and fa2on<fap2). That is, the impedance of the parallel arm circuit 120A is maximized (i) at a frequency between the resonant frequency frp1 of the parallel arm resonator 22p1 forming the parallel arm circuit 120A and the resonant frequency frp2 of the parallel arm resonator 22p2 and (ii) at a frequency between the anti-resonant frequency fap1 of the parallel arm resonator 22p1 and the anti-resonant frequency fap2 of the parallel arm resonator 22p2.

The reason why fa1on<fap1 is satisfied is that the parallel arm resonator 22p2 acts as a parallel capacitor for the parallel arm resonator 22p1 in a frequency band at and near the anti-resonant frequency fap1 of the parallel arm resonator 22p1. The reason why fa2on<fap2 is satisfied is that the parallel arm resonator 22p1 acts as a parallel capacitor for the parallel arm resonator 22p2 in a frequency band at and near the anti-resonant frequency fap2 of the parallel arm resonator 22p2.

When forming a band pass filter as a ladder filter structure, the anti-resonant frequency fa1on of the parallel arm circuit 120A and the resonant frequency frs of the series arm resonator 22s are made close to each other. In this state, when the switch 22SW is ON, a frequency range at and near the resonant frequency fr1on at which the impedance of the parallel arm circuit 120A approaches 0 forms a lower-frequency elimination band. When the frequency is increased to be higher than this frequency range, the impedance of the parallel arm circuit becomes high at or near the anti-resonant frequency fa1on, and the impedance of the series arm resonator 22s approaches 0 at or near the resonant frequency frs. In this state, a frequency range at and near the anti-resonant frequency fa1on and the resonant frequency frs forms a signal pass band in a signal path from the input-output terminal 22m to the input-output terminal 22n. When the frequency is increased to be at or near the resonant frequency fr2on and the anti-resonant frequency fas, the impedance of the series arm resonator 22s is increased and the impedance of the parallel arm circuit 120A approaches 0. A frequency range at and near the resonant frequency fr2on and the anti-resonant frequency fas forms a higher-frequency elimination band.

That is, when the switch 22SW is ON, the filter 22A exhibits the first bandpass characteristics. In the first bandpass characteristics, the pass band of the filter 22A is determined by the anti-resonant frequency fa1on and the resonant frequency frs, the pole (attenuation pole) on the lower-frequency side of the pass band is determined by the resonant frequency fr1on, and the pole (attenuation pole) on the higher-frequency side of the pass band is determined by the resonant frequency fr2on and the anti-resonant frequency fas.

The anti-resonant frequency fa2on of the parallel arm circuit 120A does not significantly influence the bandpass characteristics (first bandpass characteristics, in this case) of the filter 22A because the impedance of the series arm resonator 22s at the anti-resonant frequency fa2on is high.

In contrast, FIG. 5B shows that, when the switch 22SW is OFF, the impedance characteristics of the parallel arm circuit 120A are influenced by the capacitor 22C because the capacitor 22C is not short-circuited by the switch 22SW. That is, in this case, the combined characteristics of the two parallel arm resonators (parallel arm resonators 22p1 and 22p2) and the capacitor 22C connected in series with the parallel arm resonator 22p2 ("combined characteristics of parallel arm (22p1+22p2+22C)" in FIG. 5B) are the impedance characteristics of the parallel arm circuit 120A.

More specifically, when the switch 22SW is OFF, the parallel arm circuit 120A exhibits the following impedance characteristics.

The parallel arm circuit 120A has two resonant frequencies fr1off and fr2off and two anti-resonant frequencies fa1off and fa2off (which satisfy fr1off<fa1off<fr2off<fa2off, fa1off<fap1, frp2<fr2off, and fa2off<fap2). That is, the impedance of the parallel arm circuit 120A is minimized (i) at the resonant frequency frp1 of the parallel arm resonator 22p1 forming the parallel arm circuit 120A and (ii) at a frequency higher than the resonant frequency frp2 of the parallel arm resonator 22p2. The impedance of the parallel arm circuit 120A is maximized (i) at a frequency between the resonant frequency frp1 of the parallel arm resonator 22p1 forming the parallel arm circuit 120A and the resonant frequency frp2 of the parallel arm resonator 22p2 and (ii) at a frequency between the anti-resonant frequency fap1 of the parallel arm resonator 22p1 and the anti-resonant frequency fap2 of the parallel arm resonator 22p2.

The reason why fa1off<fap1 is satisfied is that the parallel arm resonator 22p2 acts as a capacitor for the parallel arm resonator 22p1 in a frequency band at and near the anti-resonant frequency fap1 of the parallel arm resonator 22p1. The reason why frp2<fr2off is satisfied is that the parallel arm resonator 22p2 and the capacitor 22C produce resonance in a frequency band at and near the resonant frequency frp2 of the parallel arm resonator 22p2. The reason why fa2off<fap2 is satisfied is that the parallel arm resonator 22p1 acts as a capacitor for the parallel arm resonator 22p2 in a frequency band at and near the anti-resonant frequency fap2 of the parallel arm resonator 22p2.

Upon comparing the lower anti-resonant frequency when the switch 22SW is ON with that when the switch 22SW is OFF, fa1on<fa1off is satisfied. This is because, when the switch 22SW is OFF, the range by which the frequency is variable from the anti-resonant frequency fap1 of the parallel arm resonator 22p1 becomes narrower due to the influence of the capacitor 22C than that when the switch 22SW is ON.

Upon comparing the higher resonant frequency when the switch 22SW is ON with that when the switch 22SW is OFF, fr2on<fr2off is satisfied. This is because, when the switch 22SW is OFF, fr2on (=frp2)<fr2off is satisfied due to the influence of the capacitor 22C, as stated above.

When forming a band pass filter as a ladder filter structure, the anti-resonant frequency fa1off of the parallel arm circuit 120A and the resonant frequency frs of the series arm resonator 22s are made close to each other. In this state, when the switch 22SW is OFF, a frequency range at and near the resonant frequency fr1off at which the impedance of the parallel arm circuit 120A approaches 0 forms a lower-frequency elimination band. When the frequency is increased to be higher than this frequency range, the impedance of the parallel arm circuit becomes high at or near the anti-resonant frequency fa1off, and the impedance of the series arm resonator 22s approaches 0 at or near the resonant frequency frs. In this state, a frequency range at and near the anti-resonant frequency fa1off and the resonant frequency frs forms a signal pass band in a signal path from the input-output terminal 22m to the input-output terminal 22n. When the frequency is increased to be at or near the resonant frequency fr2off and the anti-resonant frequency fas, the impedance of the series arm resonator 22s is increased and the impedance of the parallel arm circuit 120A approaches 0. A frequency range at and near the resonant frequency fr2off and the anti-resonant frequency fas forms a higher-frequency elimination band.

That is, when the switch 22SW is OFF, the filter 22A exhibits the second bandpass characteristics. In the second bandpass characteristics, the pass band of the filter 22A is determined by the anti-resonant frequency fa1off and the resonant frequency frs, the pole (attenuation pole) on the lower-frequency side of the pass band is determined by the resonant frequency fr1off, and the pole (attenuation pole) on the higher-frequency side of the pass band is determined by the resonant frequency fr2off and the anti-resonant frequency fas.

As in the above-described anti-resonant frequency fa2on, the anti-resonant frequency fa2off of the parallel arm circuit does not significantly influence the bandpass characteristics (second bandpass characteristics, in this case) of the filter 22A because the impedance of the series arm resonator 22s at the anti-resonant frequency fa2off is high.

A detailed description will now be given, with reference to FIG. 5C, of the comparison between the impedance characteristics and the bandpass characteristics of the filter 22A when the switch 22SW is ON and those when the switch 22SW is OFF.

As shown in FIG. 5C, when the switch 22SW is changed from ON to OFF, the impedance characteristics of the parallel arm circuit 120A are switched in the following manner. The higher one of the two resonant frequencies and the lower one of the two anti-resonant frequencies of the parallel arm circuit 120A shift to the higher-frequency side together. In this embodiment, only the parallel arm resonator 22p2 is connected in series with the capacitor 22C and the switch 22SW. Hence, the higher one of the two resonant frequencies shifts to the higher-frequency side from fr2on to fr2off (portion indicated by B in FIG. 5C), and the lower one of the anti-resonant frequencies shifts to the higher-frequency side from fa1on to fa1off (portion indicated by A in FIG. 5C).

The lower anti-resonant frequency and the higher resonant frequency of the parallel arm circuit 120A determine the attenuation slope on the higher-frequency side of the pass band of the filter 22A, and they shift to the higher-frequency side together, as discussed above. The graph in the bottom portion of FIG. 5C shows that, as a result of the switch 22SW being switched from ON to OFF, the bandpass characteristics of the filter 22A are changed to those in which the attenuation slope on the higher-frequency side of the pass band shifts to higher frequencies (see the black arrow in FIG. 5C) while maintaining its sharpness. In other words, the filter 22A is able to shift the attenuation pole on the higher-frequency side of the pass band to a higher frequency (portion indicated by D in FIG. 5C) and also to shift the high edge of the pass band to a higher frequency (portion indicated by C in FIG. 5C) without substantially increasing the insertion loss at the high edge of the pass band.

As described above, in this embodiment, the parallel arm circuit 120A includes the first and second circuits 10 and 20. The first circuit 10 has the parallel arm resonator 22p1, which is the first parallel arm resonator. The second circuit 20 is connected in parallel with the first circuit 10 and includes the parallel arm resonator 22p2, which is the second parallel arm resonator. At least one of the first and second circuits 10 and 20 (only the second circuit 20 in this case) includes the variable frequency circuit 22T. The variable frequency circuit 22T is connected in series with the first or second parallel arm resonator (parallel arm resonator 22p2 in this case) included in the corresponding one of the first and second circuits 10 and 20. The variable frequency circuit 22T also has the capacitor 22C, which is an impedance element, and the switch 22SW connected in parallel with each other. The parallel arm resonator 22p2 has the resonant frequency frp2, which is different from the resonant frequency frp1 of the parallel arm resonator 22p1, and has the anti-resonant frequency fap2, which is different from the anti-resonant frequency fap1 of the parallel arm resonator 22p1.

With this configuration, in this embodiment, the parallel arm circuit 120A has at least two resonant frequencies (two resonant frequencies in this case) and at least two anti-resonant frequencies (two anti-resonant frequencies in this case). As a result of the switch 22SW being switched between ON and OFF, the variable frequency circuit 22T shifts at least one of the at least two resonant frequencies (the higher one of the two resonant frequencies in this case) and at least one of the at least two anti-resonant frequencies (the lower one of the two anti-resonant frequencies in this case) in the parallel resonance circuit 120A to the lower-frequency side or the higher-frequency side together.

In a radio-frequency filter circuit, the attenuation pole on the lower-frequency side of a pass band is determined by the lower resonant frequency of a parallel arm circuit, the attenuation pole on the higher-frequency side of the pass band is determined by the higher resonant frequency of the parallel arm circuit, and the pass band is determined by the lower anti-resonant frequency of the parallel arm circuit and a series arm circuit.

In this embodiment, by the provision of the parallel arm circuit 120A, the frequency of an edge of the pass band and that of the attenuation pole can be shifted together to the lower-frequency side or the higher-frequency side. In this embodiment, it is thus possible to switch the frequency of the pass band and that of the attenuation band without substantially increasing the insertion loss at an edge of the pass band.

5. First Modified Example of Filter (Tunable Filter)

As an example of a filter having a variable frequency function, the filter switching the pass band in the following manner has been discussed. In the filter including the parallel arm resonators 22p1 and 22p2, the parallel arm resonator 22p2 is connected in series with the variable frequency circuit 22T so as to shift the attenuation slope on the higher-frequency side of the pass band. However, a similar technology may be applied to a filter that switches the pass band by shifting the attenuation slope on the lower-frequency side of the pass band. Such a filter will be described below as a first modified example of a filter having a variable frequency function.

Figure 6:
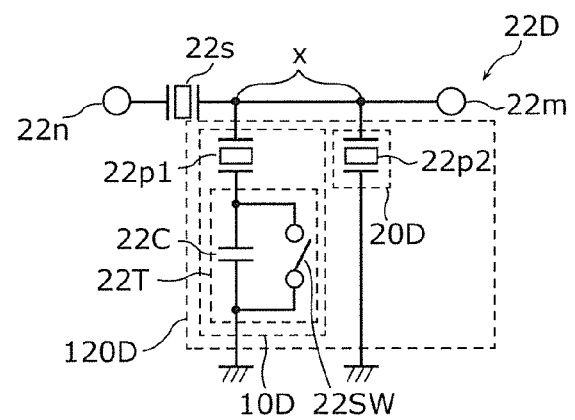
FIG. 6 is a circuit diagram illustrating the configuration of a filter according to a first modified example of the first embodiment.

FIG. 6 is a circuit diagram illustrating the configuration of a filter 22D according to the first modified example of the first embodiment. The filter 22D shown in FIG. 6 is different from the filter 22A shown in FIG. 3 in that the variable frequency circuit 22T including the capacitor 22C and the switch 22SW connected in parallel with each other is connected in series with the parallel arm resonator 22p1. That is, in this modified example, only the parallel arm resonator 22p1 is connected in series with the variable frequency circuit 22T. In other words, in this modified example, a first circuit 10D includes the variable frequency circuit 22T, while a second circuit 20D is constituted only by the parallel arm resonator 22p2 without the variable frequency circuit 22T.

The filter 22D will be described below mainly by referring to points different from the filter 22A of the first embodiment while omitting the same points as those of the filter 22A.

In this modified example, the variable frequency circuit 22T including the capacitor 22C and the switch 22SW connected in parallel with each other is connected in series with the parallel arm resonator 22p1 between the node x and a ground. More specifically, the variable frequency circuit 22T is connected in series with the parallel arm resonator 22p1 between a ground and the parallel arm resonator 22p1. The variable frequency circuit 22T including the capacitor 22C and the switch 22SW connected in parallel with each other may alternatively be connected in series with the parallel arm resonator 22p1 between the node x and the parallel arm resonator 22p1.

In this modified example, the capacitor 22C is an impedance element connected in series with the parallel arm resonator 22p1. The variable frequency range of the pass band and that of the elimination band of the filter 22D are determined by the element value of the capacitor 22C. For example, as the element value of the capacitor 22C is smaller, the variable frequency range becomes wider. The element value of the capacitor 22C is thus suitably determined in accordance with the frequency specifications demanded for the filter 22D.

In this modified example, the parallel arm resonators 22p1 and 22p2, the capacitor 22C, and the switch 22SW form a parallel arm circuit 120D connected between a ground and a node on a path connecting the input-output terminals 22m and 22n.

As a result of the switch 22SW being switched between ON and OFF in accordance with a control signal, the bandpass characteristics of the filter 22D configured as described above are switched between the first bandpass characteristics and the second bandpass characteristics. The bandpass characteristics of the filter 22D will be described below together with the state of the switch 22SW with reference to FIGS. 7A through 7C.

Figure 7A:
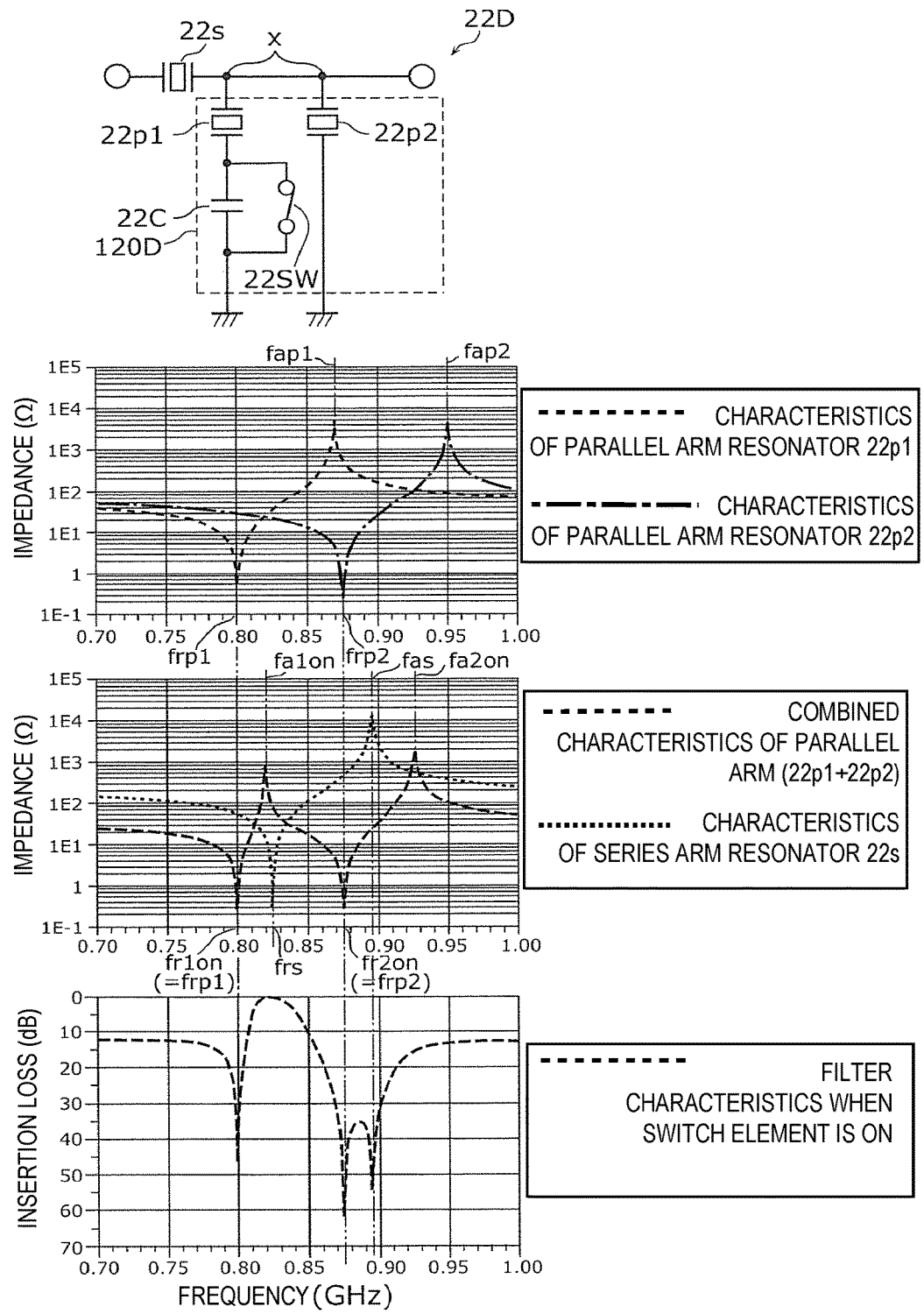
Figure 7B:
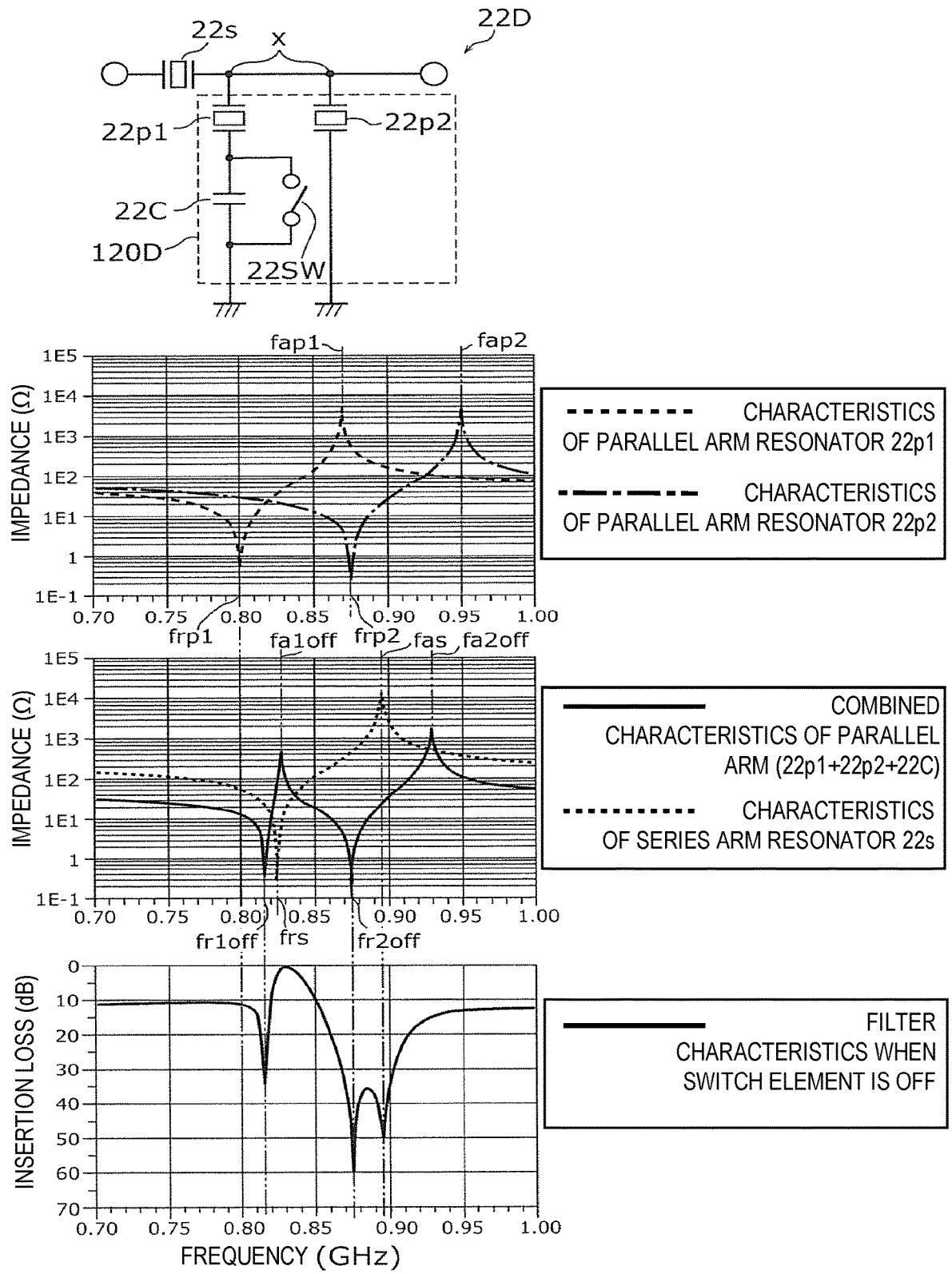
FIG. 7B shows graphs illustrating the impedance characteristics and the bandpass characteristics of the filter according to the first modified example of the first embodiment when the switch is OFF.
Figure 7C:
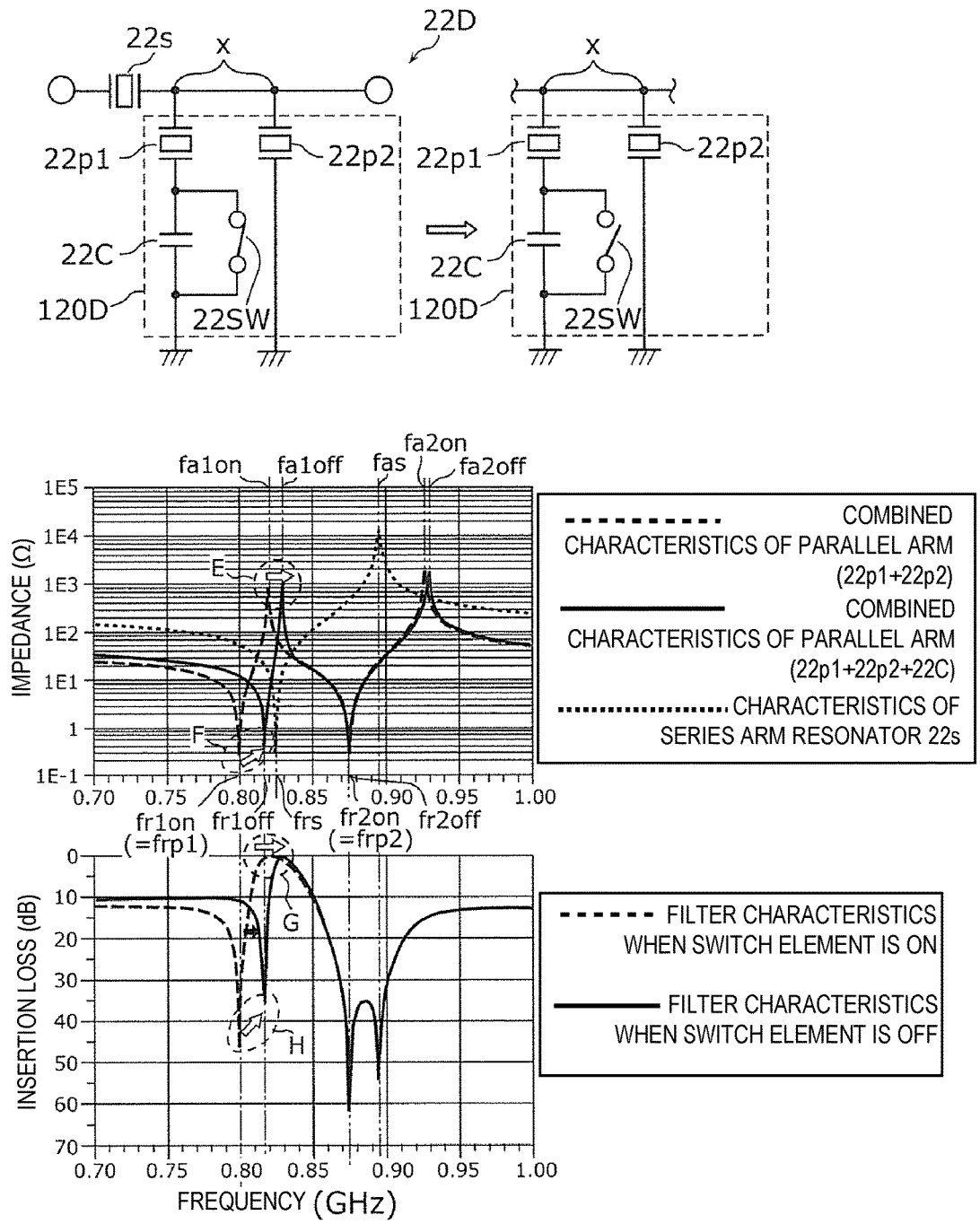
FIG. 7C shows graphs illustrating the comparison between the impedance characteristics and the bandpass characteristics of the filter according to the first modified example of the first embodiment when the switch is ON and those when the switch is OFF.

FIG. 7A shows graphs illustrating the impedance characteristics and the bandpass characteristics of the filter 22D according to the first modified example of the first embodiment when the switch 22SW is ON. FIG. 7B shows graphs illustrating the impedance characteristics and the bandpass characteristics of the filter 22D according to the first modified example of the first embodiment when the switch 22SW is OFF. FIG. 7C shows graphs illustrating the comparison between the impedance characteristics and the bandpass characteristics of the filter 22D according to the first modified example of the first embodiment when the switch 22SW is ON and those when the switch 22SW is OFF.

The impedance characteristics of a single resonator are similar to those of the filter 22A. An explanation thereof will thus be omitted and the impedance characteristics of the parallel arm circuit 120D will mainly be discussed below.

FIG. 7A shows that, when the switch 22SW is ON, the impedance characteristics of the parallel arm circuit 120D are not influenced by the capacitor 22C because the capacitor 22C is short-circuited by the switch 22SW. That is, in this case, as in the characteristics of the filter 22A, the combined characteristics of the two parallel arm resonators (parallel arm resonators 22p1 and 22p2) ("combined characteristics of parallel arm (22p1+22p2)" in FIG. 7A) are the impedance characteristics of the parallel arm circuit 120D.

That is, when the switch 22SW is ON, the filter 22D exhibits the first bandpass characteristics similar to those of the filter 22A.

In contrast, FIG. 7B shows that, when the switch 22SW is OFF, the impedance characteristics of the parallel arm circuit 120D are influenced by the capacitor 22C because capacitor 22C is not short-circuited by the switch 22SW. That is, in this case, the combined characteristics of the two parallel arm resonators (parallel arm resonators 22p1 and 22p2) and the capacitor 22C connected in series with the parallel arm resonator 22p1 ("combined characteristics of parallel arm (22p1+22p2+22C)" in FIG. 7B) are the impedance characteristics of the parallel arm circuit 120D.

More specifically, when the switch 22SW is OFF, the parallel arm circuit 120D exhibits the following impedance characteristics.

The parallel arm circuit 120D has two resonant frequencies fr1off and fr2off and two anti-resonant frequencies fa1off and fa2off (which satisfy fr1off<fa1off<fr2off<fa2off, fa1off<fap1, frp1<fr1off, and fa2off<fap2). That is, the impedance of the parallel arm circuit 120D is minimized (i) at a frequency higher than the resonant frequency frp1 of the parallel arm resonator 22p1 forming the parallel arm circuit 120D and (ii) at the resonant frequency frp2 of the parallel arm resonator 22p2. The impedance of the parallel arm circuit 120D is maximized (i) at a frequency between the resonant frequency frp1 of the parallel arm resonator 22p1 forming the parallel arm circuit 120D and the resonant frequency frp2 of the parallel arm resonator 22p2 and (ii) at a frequency between the anti-resonant frequency fap1 of the parallel arm resonator 22p1 and the anti-resonant frequency fap2 of the parallel arm resonator 22p2.

The reason why fa1off<fap1 is satisfied is that the parallel arm resonator 22p2 acts as a parallel capacitor for the parallel arm resonator 22p1 in a frequency band at and near the anti-resonant frequency fap1 of the parallel arm resonator 22p1. The reason why frp1<fr1off is satisfied is that the parallel arm resonator 22p1 and the capacitor 22C produce resonance in a frequency band at and near the resonant frequency frp1 of the parallel arm resonator 22p1. The reason why fa2off<fap2 is satisfied is that the combined characteristics of the parallel arm resonator 22p1 and the capacitor 22C act as a parallel capacitor for the parallel arm resonator 22p2.

That is, when the switch 22SW is OFF, the filter 22D exhibits the second bandpass characteristics. In the second bandpass characteristics, the pass band of the filter 22D is determined by the anti-resonant frequency fa1off and the resonant frequency frs, the pole (attenuation pole) on the lower-frequency side of the pass band is determined by the resonant frequency fr1off, and the pole (attenuation pole) on the higher-frequency side of the pass band is determined by the resonant frequency fr2off and the anti-resonant frequency fas.

A detailed description will now be given, with reference to FIG. 7C, of the comparison between the impedance characteristics and the bandpass characteristics of the filter 22D when the switch 22SW is ON and those when the switch 22SW is OFF.

As shown in FIG. 7C, when the switch 22SW is changed from ON to OFF, the impedance characteristics of the parallel arm circuit 120D are switched in the following manner. The lower one of the two resonant frequencies and the lower one of the two anti-resonant frequencies of the parallel arm circuit 120D shift to the higher-frequency side together. In this modified example, only the parallel arm resonator 22p1 is connected in series with the capacitor 22C and the switch 22SW. Hence, the lower one of the two resonant frequencies shifts to the higher-frequency side from fr1on to fr1off (portion indicated by F in FIG. 7C), and the lower one of the anti-resonant frequencies shifts to the higher-frequency side from fa1on to fa1off (portion indicated by E in FIG. 7C).

The lower anti-resonant frequency and the lower resonant frequency of the parallel arm circuit 120D determine the attenuation slope on the lower-frequency side of the pass band of the filter 22D, and they shift to the higher-frequency side together, as discussed above. The graph in the bottom portion of FIG. 7C shows that, as a result of the switch 22SW being switched from ON to OFF, the bandpass characteristics of the filter 22D are changed to those in which the attenuation slope on the lower-frequency side of the pass band shifts to higher frequencies (see the black arrow in FIG. 7C) while maintaining its sharpness. In other words, the filter 22D is able to shift the attenuation pole on the lower-frequency side of the pass band to a higher frequency (portion indicated by H in FIG. 7C) and also to shift the low edge of the pass band to a higher frequency (portion indicated by G in FIG. 7C) without substantially increasing the insertion loss at the low edge of the pass band.

6. Second Modified Example of Filter (Tunable Filter)

A filter having a variable frequency function may shift both of the attenuation slope on the higher-frequency side of a pass band and that on the lower-frequency side of the pass band. Such a filter will be described below as a second modified example of a filter having a variable frequency function.

Figure 8:
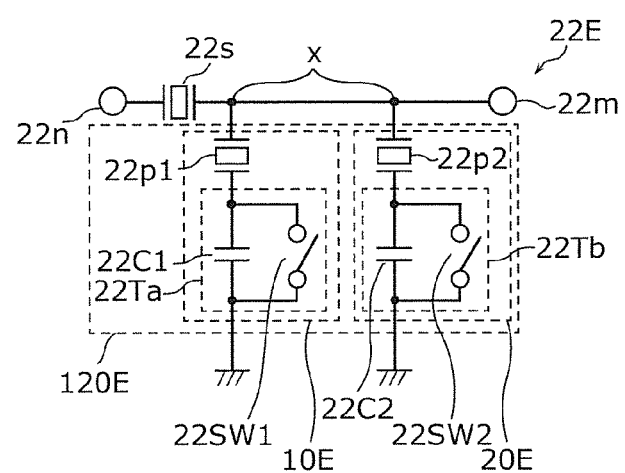
FIG. 8 is a circuit diagram illustrating the configuration of a filter according to a second modified example of the first embodiment.

FIG. 8 is a circuit diagram illustrating the configuration of a filter 22E according to the second modified example of the first embodiment. The filter 22E shown in FIG. 8 is different from the filter 22A shown in FIG. 3 and the filter 22D shown in FIG. 6 in that a capacitor 22C1 and a switch 22SW1 are disposed in association with the parallel arm resonator 22p1 and is connected in series with the parallel arm resonator 22p1 and in that a capacitor 22C2 and a switch 22SW2 are disposed in association with the parallel arm resonator 22p2 and is connected in series with the parallel arm resonator 22p2.

That is, the parallel arm circuit 120E includes the capacitor 22C1 and the switch 22SW1 which are connected in series with one of the parallel arm resonators 22p1 and 22p2 (one of the first and second parallel arm resonators, i.e., parallel arm resonator 22p1 in this case) and which are connected in parallel with each other. The parallel arm circuit 120E also includes the capacitor 22C2 and the switch 22SW2 which are connected in series with the other one of the parallel arm resonators 22p1 and 22p2 (the other one of the first and second parallel arm resonators, i.e., parallel arm resonator 22p2 in this case) and which are connected in parallel with each other.

The capacitor 22C1 and the switch 22SW1 in this modified example correspond to the capacitor 22C and the switch 22SW of the above-described filter 22D. The capacitor 22C1 and the switch 22SW1 thus form a variable frequency circuit 22Ta corresponding to the variable frequency circuit 22T of the filter 22D.

The capacitor 22C2 and the switch 22SW2 in this modified example correspond to the capacitor 22C and the switch 22SW of the above-described filter 22A. The capacitor 22C2 and the switch 22SW2 thus form a variable frequency circuit 22Tb corresponding to the variable frequency circuit 22T of the filter 22A.

In this modified example, each of first and second circuits 10E and 20E includes a variable frequency circuit. More specifically, the first circuit 10E includes the variable frequency circuit 22Ta, while the second circuit 20E includes the variable frequency circuit 22Tb. The first circuit 10E corresponds to the first circuit 10D of the filter 22D, while the second circuit 20E corresponds to the second circuit 20A of the filter 22A. A detailed explanation of the first and second circuits 10E and 20E will thus be omitted.

As a result of the switches 22SW1 and 22SW2 being switched between ON and OFF in accordance with a control signal, the bandpass characteristics of the filter 22E configured as described above are switched between the first bandpass characteristics and the second bandpass characteristics. The bandpass characteristics of the filter 22E will be described below, together with the states of the switches 22SW1 and 22SW2, with reference to FIG. 9.

Figure 9:
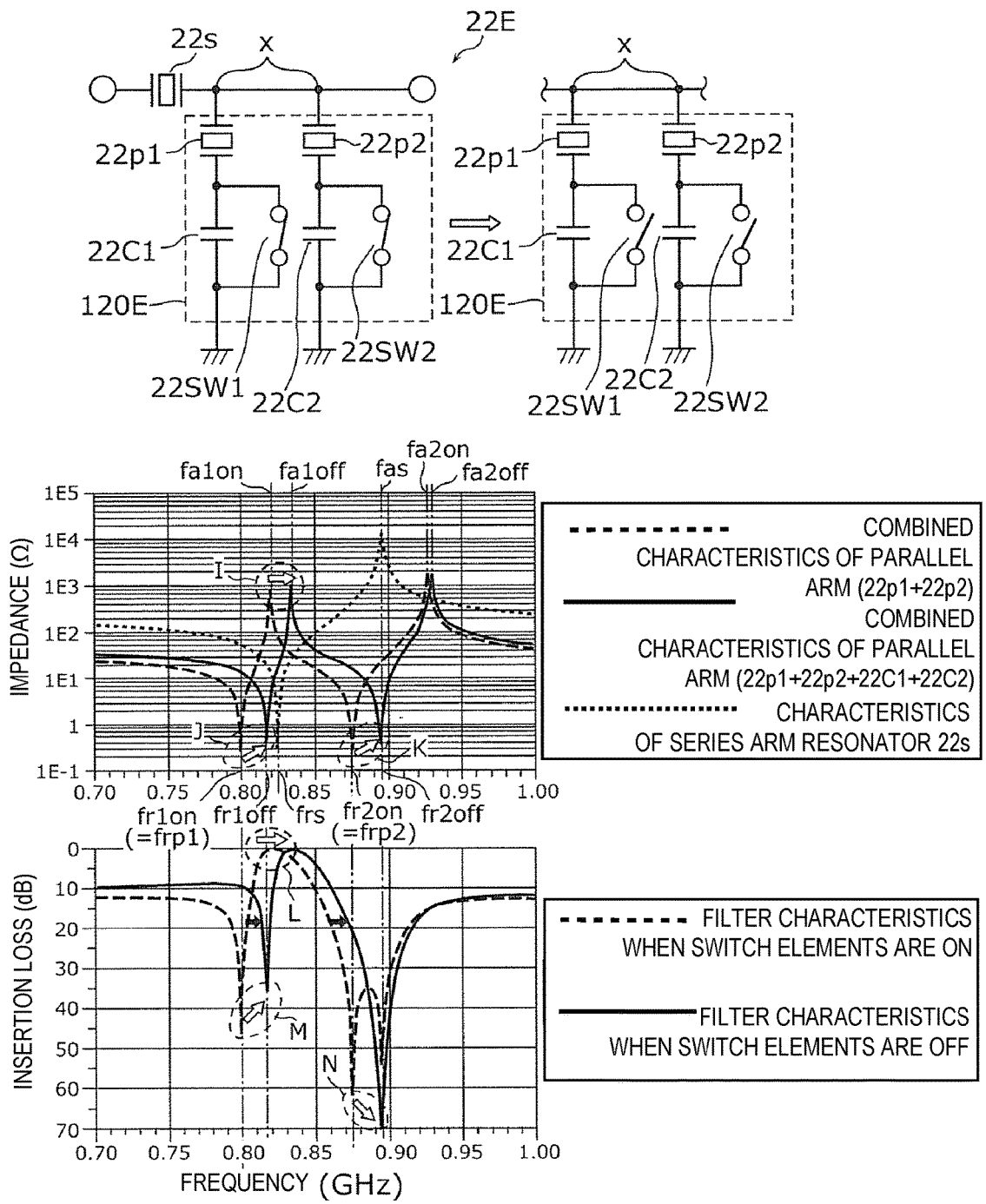
FIG. 9 shows graphs illustrating the comparison between the impedance characteristics and the bandpass characteristics of the filter according to the second modified example of the first embodiment when the switches are ON and those when the switches are OFF.

FIG. 9 shows graphs illustrating the comparison between the impedance characteristics and the bandpass characteristics of the filter 22E according to the second modified example of the first embodiment when the switches 22SW1 and 22SW2 are ON and those when the switches 22SW1 and 22SW2 are OFF.

As shown in FIG. 9, when both of the switches 22SW1 and 22SW2 are ON, the impedance characteristics of the parallel arm circuit 120E are not influenced by the capacitors 22C1 and 22C2 because the capacitor 22C1 is short-circuited by the switch 22SW1 and the capacitor 22C2 is short-circuited by the switch 22SW2. That is, in this case, as in the characteristics of the filters 22A and 22D, the combined characteristics of the two parallel arm resonators (parallel arm resonators 22p1 and 22p2) ("combined characteristics of parallel arm (22p1+22p2)" in FIG. 9) are the impedance characteristics of the parallel arm circuit 120E.

That is, when both of the switches 22SW1 and 22SW2 are ON, the filter 20E exhibits the first bandpass characteristics, as in those of the filter 22A when the switch 22SW is ON and those of the filter 22D when the switch 22SW is ON.

On the other hand, as shown in FIG. 9, when both of the switches 22SW1 and 22SW2 are OFF, the impedance characteristics of the parallel arm circuit 120E are influenced by the capacitors 22C1 and 22C2 because both of the switches 22SW1 and 22SW2 are opened and the capacitor 22C1 is not short-circuited by the switch 22SW1 and the capacitor 22C2 is not short-circuited by the switch 22SW2. That is, in this case, the combined characteristics of the two parallel arm resonators (parallel arm resonators 22p1 and 22p2) and the capacitors 22C1 and 22C2 ("combined characteristics of parallel arm (22p1+22p2+22C1+22C2)" in FIG. 9) are the impedance characteristics of the parallel arm circuit 120E.

More specifically, when the switches 22SW1 and 22SW2 are OFF, the parallel arm circuit 120E exhibits the following impedance characteristics.

The parallel arm circuit 120E has two resonant frequencies fr1off and fr2off and two anti-resonant frequencies fa1off and fa2off (which satisfy fr1off<fa1off<fr2off<fa2off, fa1off<fap1, frp1<fr1off, frp2<fr2off, and fa2off<fap2). That is, the impedance of the parallel arm circuit 120E is minimized (i) at a frequency higher than the resonant frequency frp1 of the parallel arm resonator 22p1 forming the parallel arm circuit 120E and (ii) at a frequency higher than the resonant frequency frp2 of the parallel arm resonator 22p2. The impedance of the parallel arm circuit 120E is maximized (i) at a frequency between the resonant frequency frp1 of the parallel arm resonator 22p1 forming the parallel arm circuit 120E and the resonant frequency frp2 of the parallel arm resonator 22p2 and (ii) at a frequency between the anti-resonant frequency fap1 of the parallel arm resonator 22p1 and the anti-resonant frequency fap2 of the parallel arm resonator 22p2.

That is, when the switches 22SW are OFF, the filter 22E exhibits the second bandpass characteristics. In the second bandpass characteristics, the pass band of the filter 22E is determined by the anti-resonant frequency fa1off and the resonant frequency frs, the pole (attenuation pole) on the lower-frequency side of the pass band is determined by the resonant frequency fr1off, and the pole (attenuation pole) on the higher-frequency side of the pass band is determined by the resonant frequency fr2off and the anti-resonant frequency fas.

A detailed description will now be given of the impedance characteristics and the bandpass characteristics of the filter 22E when the switches 22SW1 and 22SW2 are ON and those when the switches 22SW1 and 22SW2 are OFF.

As shown in FIG. 9, when both of the switches 22SW1 and 22SW2 are changed from ON to OFF, the impedance characteristics of the parallel arm circuit 120E are switched in the following manner. Both of the two resonant frequencies and the lower one of the two anti-resonant frequencies of the parallel arm circuit 120E shift to the higher-frequency side together. In this modified example, the parallel arm resonator 22p1 is connected in series with the capacitor 22C1 and the parallel arm resonator 22p2 is connected in series with the capacitor 22C2. Hence, both of the two resonant frequencies shift to the higher-frequency side (portions indicated by J and K in FIG. 9), and the lower one of the anti-resonant frequencies shifts to the higher-frequency side (portion indicated by I in FIG. 9).

The lower anti-resonant frequency and the higher resonant frequency of the parallel arm circuit 120E determine the attenuation slope on the higher-frequency side of the pass band of the filter 22E, and they shift to the higher-frequency side together, as discussed above. The lower anti-resonant frequency and the lower resonant frequency of the parallel arm circuit 120E determine the attenuation slope on the lower-frequency side of the pass band of the filter 22E, and they shift to the higher-frequency side together, as discussed above. The graph in the bottom portion of FIG. 9 shows that, as a result of the switches 22SW1 and 22SW2 being switched from ON to OFF, the bandpass characteristics of the filter 22E are changed to those in which the attenuation slope on the higher-frequency side and that on the lower-frequency side of the pass band shift to higher frequencies (see the black arrows in FIG. 9) while maintaining their sharpness. In other words, the filter 22E is able to shift the attenuation pole on the higher-frequency side and that on the lower-frequency side of the pass band to higher frequencies (portions indicated by N and M in FIG. 9) and also to shift the high and low edges of the pass band to higher frequencies (portion indicated by L in FIG. 9) without substantially increasing the insertion loss at the high and low edges of the pass band. The filter 22E can thus shift the center frequency while maintaining the bandwidth.

In the filter 22E, ON/OFF switching of the switches 22SW1 and 22SW2 may not necessarily be performed together, but may be performed individually. However, if ON/OFF switching of the switches 22SW1 and 22SW2 is performed together, fewer control lines are required for controlling the switches 22SW1 and 22SW2, thereby making it possible to simplify of the configuration of the filter 22E.

On the other hand, if ON/OFF switching of the switches 22SW1 and 22SW2 is performed individually, variations in the bandwidths that can be switched by the filter 22E can be increased.

More specifically, as explained about the filter 22A, the high edge of the pass band can be changed in accordance with the switching of the switch 22SW1 connected in series with the parallel arm resonator 22p1 (first parallel arm resonator) between ON and OFF. As explained about the filter 22D, the low edge of the pass band can be changed in accordance with the switching of the switch 22SW2 connected in series with the parallel arm resonator 22p2 (second parallel arm resonator) between ON and OFF.

Switching both of the switches 22SW1 and 22SW2 to be ON or OFF can shift both of the high and low edges of the pass band to the lower-frequency side or the higher-frequency side. That is, the center frequency of the pass band can be shifted to the lower-frequency side or the higher-frequency side. Additionally, by switching one of the switches 22SW1 and 22SW2 from ON to OFF and the other one of the switches 22SW1 and 22SW2 from OFF to ON, the high and low edges of the pass band can be shifted to increase or decrease the frequency difference therebetween. That is, it is possible to vary the pass band width while fixing the center frequency of the pass band at substantially the same position. By setting one of the switches 22SW1 and 22SW2 to be ON or OFF and by switching the other one of the switches 22SW1 and 22SW2 between ON and OFF, one of the high and low edges of the pass band can be fixed and the other one of the high and low edges can be shifted to the lower-frequency side or the higher-frequency side. That is, it is possible to vary the low edge or the high edge of the pass band.

In this manner, the provision of the capacitors 22C1 and 22C2 and the switches 22SW1 and 22SW2 increases the flexibility in varying the pass band.

7. Advantages and Others

The filter 22A (radio-frequency filter circuit) according to this embodiment and the filters 22D and 22E (radio-frequency filter circuits) according to the first and second modified examples of this embodiment have been described. Advantages achieved by the filters 22A, 22D, and 22E will be discussed below in comparison with a comparative example of this embodiment.

FIG. 10 shows a circuit diagram illustrating the configuration of a filter 22Z according to a comparative example of the first embodiment and also shows graphs illustrating the impedance characteristics and the bandpass characteristics of the filter 22Z.

As indicated in the top portion of FIG. 10, the filter 22Z according to the comparative example is different from the above-described filters 22A, 22D, and 22E in that it only has one parallel arm resonator 22p and in that a capacitor 22C and a switch 22SW connected in parallel with each other is connected in series with the parallel arm resonator 22p. The capacitor 22C, the switch 22SW, and the parallel arm resonator 22p form a parallel arm circuit 120Z. That is, the filter 22Z has a one-stage ladder filter structure constituted by the single series arm resonator 22s and the single parallel arm circuit 120Z. The configuration of the parallel arm resonator 22p is the same as that of the above-described parallel arm resonator 22p1.

As a result of the switch 22SW being switched between ON and OFF in accordance with a control signal, the bandpass characteristics of the filter 22Z configured as described above are switched between the first bandpass characteristics and the second bandpass characteristics.

More specifically, as indicated in the intermediate portion of FIG. 10, when the switch 22SW is ON, the impedance characteristics of the parallel arm circuit 120Z are not influenced by the capacitor 22C because the capacitor 22C is short-circuited by the switch 22SW. That is, the impedance characteristics of the single parallel arm resonator 22p are the impedance characteristics of the parallel arm circuit 120Z. As indicated in the bottom portion of FIG. 10, when the switch 22SW is ON, the parallel arm circuit 120Z exhibits the first bandpass characteristics determined by the impedance characteristics of the series arm resonator 22s and the parallel arm resonator 22p.

In contrast, as indicated in the intermediate portion of FIG. 10, when the switch 22SW is OFF, the impedance characteristics of the parallel arm circuit 120Z are influenced by the capacitor 22C because the capacitor 22C is not short-circuited by the switch 22SW. That is, in this case, the combined characteristics of the parallel arm resonator 22p (corresponding to the above-described parallel arm resonator 22p1) and the capacitor 22C are the impedance characteristics of the parallel arm circuit 120Z.

More specifically, when the switch 22SW is OFF, the parallel arm circuit 120Z exhibits the following impedance characteristics.

The parallel arm circuit 120Z has one resonant frequency fr1off and one anti-resonant frequency fa (which satisfy fr1on<fr1off). The reason why fr1on<fr1off is satisfied is that, as a result of the switch 22SW being switched from ON to OFF, the parallel arm circuit 120Z is influenced by the impedance of the capacitor 22C in a frequency band at and near the resonant frequency frp1 of the parallel arm resonator 22p. More specifically, in this frequency band, the parallel arm resonator 22p acts as a resonator and the capacitor 22C acts as a capacitor so as to increase the resonant frequency in the overall parallel arm circuit 120Z. The anti-resonant frequency fa is the same as the anti-resonant frequency of the single parallel arm resonator 22p because no capacitor is connected in parallel with the parallel arm resonator 22p regardless of whether the switch 22SW is ON or OFF.

In this manner, in the filter 22Z according to the comparative example, when the switch 22SW is changed from ON to OFF, only the resonant frequency is shifted to the higher-frequency side (portion indicated by Bz in FIG. 10) in the parallel arm circuit 120Z, while the anti-resonant frequency remains the same.

As indicated in the bottom portion of FIG. 10, the sharpness of the attenuation slope on the lower-frequency side of the pass band represented by the bandpass characteristics (second bandpass characteristics) when the switch 22SW is OFF becomes different from that represented by the bandpass characteristics (first bandpass characteristics) when the switch 22SW is ON. This is because only the attenuation pole on the lower-frequency side of the pass band is shifted to a higher frequency (portion indicated by Dz in FIG. 10). In other words, the sharpness of the attenuation slope on the lower-frequency side of the pass band represented by the first bandpass characteristics is less sharp than that of the second bandpass characteristics. This increases the insertion loss at the low edge of the pass band (portion indicated by Cz in FIG. 10).

Having focused on the increased insertion loss at an edge of the pass band as a result of shifting only the attenuation pole, the present inventor has conceived that shifting of the attenuation slope as well as the attenuation pole may be able to switch the frequency of a pass band and that of an attenuation band without substantially increasing the insertion loss at an edge of the pass band.

That is, in the filter 22A (radio-frequency filter circuit) according to this embodiment and the filters 22D and 22E (radio-frequency filter circuits) according to the first and second modified examples of this embodiment, the lower resonant frequency of the parallel arm circuit (parallel arm circuits 120A, 120D, and 120E) determines the attenuation pole on the lower-frequency side of the pass band, the higher resonant frequency of the parallel arm circuit determines the attenuation pole on the higher-frequency side of the pass band, and the lower anti-resonant frequency of the parallel arm circuit and the series arm circuit (the single series arm resonator 22s in this case) determine the pass band.

With this configuration, in the filters 22A, 22D, and 22E, as a result of the switch element (switch 22SW in the filters 22A and 22D and switches 22SW1 and 22SW2 in the filter 22E) being switched between ON and OFF, it is possible to shift both of at least one of at least two resonant frequencies and at least one of at least two anti-resonant frequencies in the parallel arm circuit to the higher-frequency side or the lower-frequency side together. Accordingly, both of the frequency at an edge of the pass band and that of an attenuation pole can be shifted to the lower-frequency side or the higher-frequency side together. It is thus possible to switch the frequency of the pass band and that of the attenuation band in the filters 22A, 22D, and 22E without substantially increasing the insertion loss at an edge of the pass band.

In other words, the filters 22A, 22D, and 22E are constituted by the series arm resonator 22s and parallel arm circuits (parallel arm circuits 120A, 120D, and 120E, respectively), and switch between the first bandpass characteristics and the second bandpass characteristics whose pass bands are different from each other in accordance with whether the switch element is ON or OFF. More specifically, when the switch element is ON, the filters 22A, 22D, and 22E exhibit the first bandpass characteristics determined by the impedance that is not influenced by the impedance element (the capacitor 22C in the filters 22A and 22D and the capacitors 22C1 and 22C2 in the filter 22E). When the switch element is OFF, the filters 22A, 22D, and 22E exhibit the second bandpass characteristics, which are different from the first bandpass characteristics, determined by the impedance that is influenced by the impedance element. In the parallel arm circuit, as a result of the switch element being switched between ON and OFF, at least one of the frequencies at which the impedance is minimized and at least one of the frequencies at which the impedance is maximized shift together to the lower-frequency side or the higher-frequency side. Hence, as a result of switching between the first bandpass characteristics and the second bandpass characteristics, the attenuation slope determined by the frequency at which the impedance of the parallel arm circuit is minimized and that at which the impedance of the parallel arm circuit is maximized shifts to the lower-frequency side or the higher-frequency side while maintaining its sharpness. It is thus possible to switch the frequency of the pass band and that of the attenuation band in the filters 22A, 22D, and 22E without substantially increasing the insertion loss at an edge of the pass band.

In the filter 22A according to this embodiment, the resonant frequency frp1 of the parallel arm resonator 22p1 (first parallel arm resonator) is lower than the resonant frequency frp2 of the parallel arm resonator 22p2 (second parallel arm resonator) (frp1<frp2). The anti-resonant frequency fap1 of the parallel arm resonator 22p1 is lower than the anti-resonant frequency fap2 of the parallel arm resonator 22p2 (fap1<fap2). The first circuit 10 does not include the variable frequency circuit 22T, while the second circuit 20 includes the variable frequency circuit 22T.

With this configuration, as a result of the switch 22SW being switched between ON and OFF, it is possible to shift the higher one of at least two resonant frequencies and the lower one of at least two anti-resonant frequencies in the parallel arm circuit 120A to the lower-frequency side or the higher-frequency side together. Accordingly, the frequency at the high edge of the pass band and that of the attenuation pole on the higher-frequency side of the pass band can be shifted to the lower-frequency side or the higher-frequency side together. It is thus possible to switch the frequency at the high edge of the pass band and that of the attenuation pole on the higher-frequency side of the pass band in the filter 22A without substantially increasing the insertion loss at the high edge of the pass band.

In the filter 22D according to the first modified example of this embodiment, the resonant frequency frp1 of the parallel arm resonator 22p1 is lower than the resonant frequency frp2 of the parallel arm resonator 22p2 (frp1<frp2). The anti-resonant frequency fap1 of the parallel arm resonator 22p1 is lower than the anti-resonant frequency fap2 of the parallel arm resonator 22p2 (fap1<fap2). The first circuit 10D includes the variable frequency circuit 22T, while the second circuit 20D does not include the variable frequency circuit 22T.

With this configuration, as a result of the switch 22SW being switched between ON and OFF, it is possible to shift the lower one of at least two resonant frequencies and the lower one of at least two anti-resonant frequencies in the parallel arm circuit 120D to the lower-frequency side or the higher-frequency side together. Accordingly, the frequency at the low edge of the pass band and that of the attenuation pole on the lower-frequency side of the pass band can be shifted to the lower-frequency side or the higher-frequency side together. It is thus possible to switch the frequency at the low edge of the pass band and that of the attenuation pole on the lower-frequency side of the pass band in the filter 22D without substantially increasing the insertion loss at the low edge of the pass band.

In the filter 22E according to the second modified example of this embodiment, the resonant frequency frp1 of the parallel arm resonator 22p1 is lower than the resonant frequency frp2 of the parallel arm resonator 22p2 (frp1<frp2). The anti-resonant frequency fap1 of the parallel arm resonator 22p1 is lower than the anti-resonant frequency fap2 of the parallel arm resonator 22p2 (fap1<fap2). The first circuit 10E includes the variable frequency circuit 22Ta, while the second circuit 20E includes the variable frequency circuit 22Tb.

With this configuration, as a result of the switch 22SW2 of the second circuit 20E being switched between ON and OFF, the frequency at the high edge of the pass band and the attenuation pole on the higher-frequency side of the pass band can be changed. As a result of the switch 22SW1 of the first circuit 10E being switched between ON and OFF, the frequency at the low edge of the pass band and the attenuation pole on the lower-frequency side of the pass band can be changed. According to this aspect, it is possible to switch both of the frequency at the low edge of the pass band and that of the attenuation pole on the lower-frequency side of the pass band and also the frequency at the high edge of the pass band and that of the attenuation pole on the higher-frequency side of the pass band without substantially increasing the insertion loss at the edges of the pass band.

In the filter 22E, the switch 22SW1 of the first circuit 10E and the switch 22SW2 of the second circuit 20E may be switched together to be ON or OFF.

This makes it possible to switch the center frequency without substantially increasing the insertion loss at the edges of the pass band.

In the filters 22A, 22D, and 22E, the impedance elements forming the variable frequency circuits are capacitors.

Typically, capacitors have a higher Q factor than inductors and require less space. Using capacitors as the impedance elements can thus reduce the size of the filters 22A, 22D, and 22E without substantially increasing the insertion loss at the edges of the pass band.

In the filters 22A, 22D, and 22E, the resonant frequency frp1 of the parallel arm resonator 22p1 is lower than that of the series arm circuit, while the resonant frequency frp2 of the parallel arm resonator 22p2 is lower than the anti-resonant frequency of the series arm circuit. In the filters 22A, 22D, and 22E, the series arm circuit is constituted only by the series arm resonator 22s. Accordingly, the resonant frequency of the series arm circuit is equal to the resonant frequency frs of the series arm resonator 22s, and the anti-resonant frequency of the series arm circuit is equal to the anti-resonant frequency fas of the series arm resonator 22s. That is, frp1<frs and frp2<fas are satisfied.

With this configuration, an attenuation pole is added on the higher-frequency side of the pass band by the anti-resonant frequency of the series arm circuit which is determined by the anti-resonant frequency fas of the series arm resonator 22s, thereby enhancing the attenuation on the higher-frequency side of the pass band.

In the filter 22A according to this embodiment and the filters 22D and 22E according to the first and second modified examples of this embodiment, the series arm resonator 22s and the parallel arm resonators 22p1 and 22p2 are preferably surface acoustic wave resonators or bulk acoustic wave resonators. This can decrease the size of each of the series arm resonator 22s and the parallel arm resonators 22p1 and 22p2, thereby reducing the size and the cost of the filters 22A, 22D, and 22E. Surface acoustic wave resonators and bulk acoustic wave resonators typically exhibit high Q factor characteristics, thereby achieving small-loss, high-selectivity characteristics of the filters 22A, 22D, and 22E.

In the filter 22A according to this embodiment and the filters 22D and 22E according to the first and second modified examples of this embodiment, the switch 22SW (switch element) is preferably an FET switch made of GaAs or CMOS or a diode switch. The size of the switch 22SW can accordingly be decreased, and the size and the cost of the filters 22A, 22D, and 22E are also reduced.

In the filter 22A according to this embodiment and the filters 22D and 22E according to the first and second modified examples of this embodiment, the capacitor C22 (impedance element) is preferably a variable capacitor. This can adjust the variable frequency range more precisely.

Figure 11:
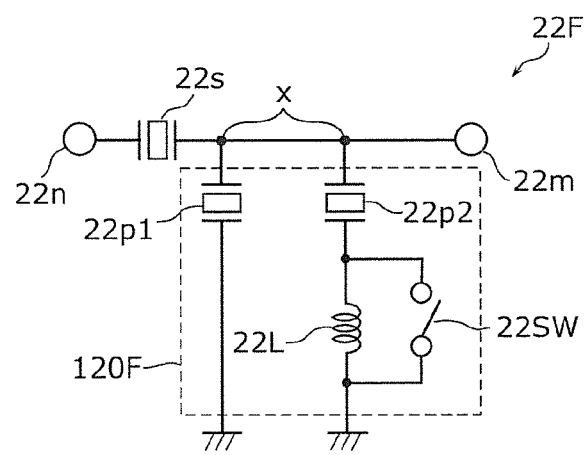
FIG. 11 is a circuit diagram illustrating the configuration of a filter according to another modified example of the first embodiment.

In this embodiment and the first and second modified examples thereof, a capacitor has been discussed as an example of the impedance element connected in series with at least one of the parallel arm resonators 22p1 and 22p2 (first and second parallel arm resonators) and connected in parallel with the switch 22SW. However, the impedance element is not restricted to a capacitor and may be an inductor, as shown in FIG. 11. FIG. 11 is a circuit diagram illustrating the configuration of a filter 22F according to another modified example of this embodiment.

The filter 22F shown in FIG. 11 is different from the filter 22A according to the first embodiment in that it includes an inductor 22L instead of the capacitor 22C. The variable frequency range of the pass band of the filter 22F is determined by the element value of the inductor 22L. For example, as the element value of the inductor 22L is greater, the variable frequency range becomes wider. The element value of the inductor 22L is thus suitably determined in accordance with the frequency specifications demanded for the filter 22F. The inductor 22L may be a variable inductor formed by using MEMS (Micro Electro Mechanical Systems). This can adjust the variable frequency range more precisely.

In the filter 22F configured as described above, the direction in which the attenuation slope is shifted when the switch 22SW is switched between ON and OFF is different from that of the filter 22A. More specifically, in the second bandpass characteristics of the filter 22F when the switch 22SW is OFF, the attenuation slope is shifted to the lower-frequency side from that represented by the first bandpass characteristics when the switch 22SW is ON. With this configuration, as in the first embodiment, it is possible to switch the frequency at the high edge of the pass band and that of the attenuation pole on the higher-frequency side of the pass band without substantially increasing the insertion loss at the edge of the pass band.

Inductors 22L may be used instead of the capacitors used in the first and second modified examples of this embodiment. Alternatively, an inductor 22L may be used instead of one of the two capacitors 22C1 and 22C2 used in the second modified example of this embodiment.

8. Explanation of Principle Based on Resonance Analysis

The principle that the above-described resonant frequencies and anti-resonant frequencies are obtained will be explained based on analysis (resonance analysis) of the impedance characteristics (resonance characteristics) conducted by using equivalent circuit models of resonators. The principle will be explained by using equivalent circuits of ideal resonators while omitting resistor components that would be included in equivalent circuits to represent the Q factor of the resonators.

8.1 Single Resonator

The resonance characteristics of a single resonator will first be discussed below.

Figure 12A:
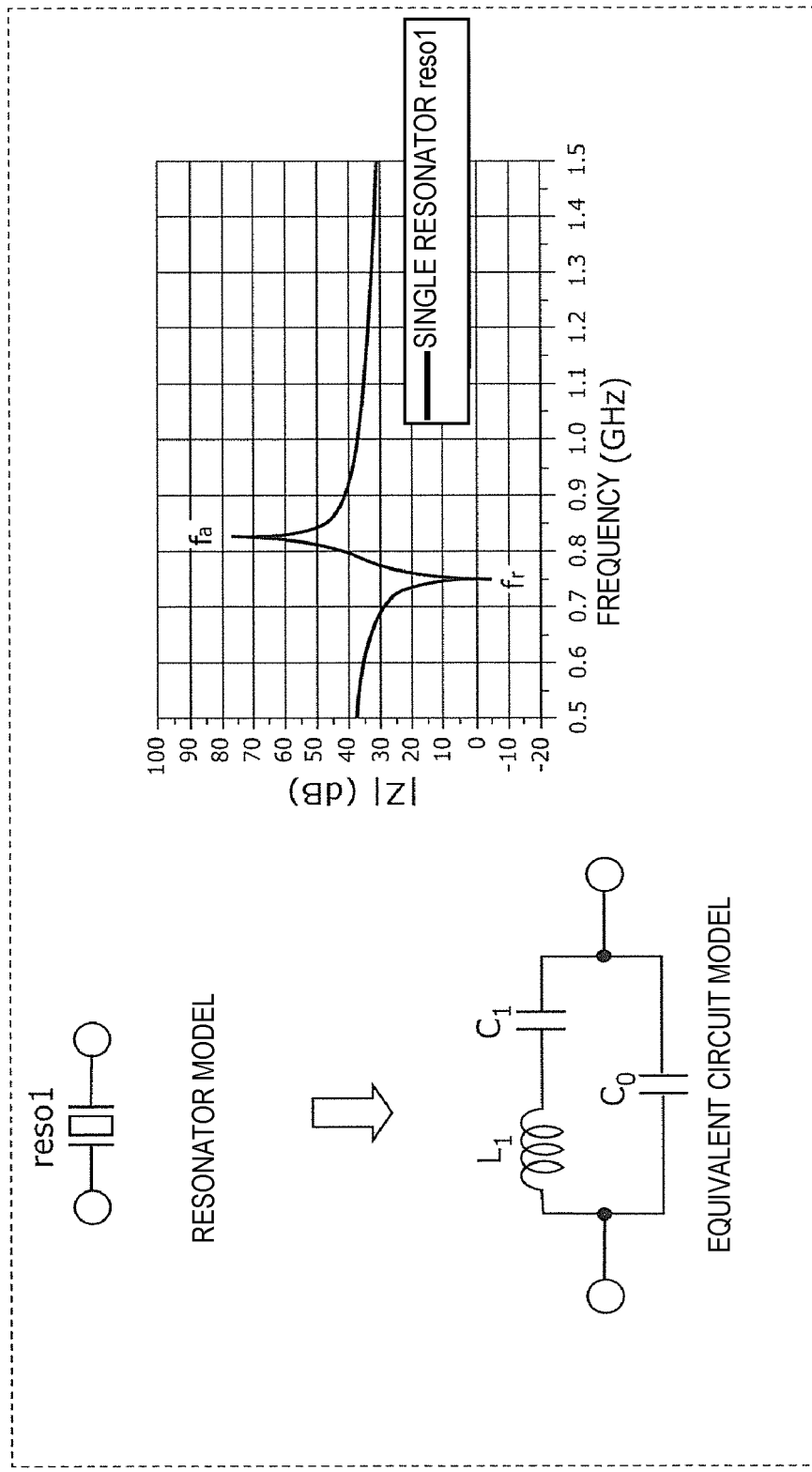
FIG. 12A illustrates an equivalent circuit model of a single resonator and the resonance characteristics thereof.

FIG. 12A illustrates an equivalent circuit model of a single resonator reso1 and the resonance characteristics thereof. As shown in FIG. 12A, the resonator reso1 can be represented by a series circuit of a capacitor $C_1$ and an inductor $L_1$ and a circuit including a capacitor $C_0$ connected in parallel with this series circuit. The capacitor $C_0$ has the electrostatic capacity of the resonator reso1. When the resonator reso1 is a surface acoustic wave resonator including an IDT electrode, the electrostatic capacity of the resonator reso1 is expressed by the above-described equation 1.

In the above-described equivalent circuit, the resonant frequency $f_r$ of the resonator reso1 is determined by the series circuit of the capacitor $C_1$ and the inductor $L_1$. The resonant frequency $f_r$ is the frequency at which the impedance $Z_r$ of the equivalent circuit is 0. Accordingly, the resonant frequency $f_r$ is expressed by equation 3 as a result of solving equation 2.

[Math. 2]

$$Z_r = 0 = j\omega_r L_1 + \frac{1}{j\omega_r C_1} \quad \text{(Equation 2)}$$

[Math. 3]

$$f_r = \frac{1}{2\pi\sqrt{L_1 C_1}} \quad \text{(Equation 3)}$$

The anti-resonant frequency $f_a$ of the resonator reso1 is the frequency at which the admittance $Y_a$ of the above-described equivalent circuit is 0. Accordingly, the anti-resonant frequency $f_a$ is expressed by equation 5 as a result of solving equation 4.

[Math. 4]

$$Y_a = \frac{1}{Z_a} = 0 = \frac{1}{\frac{1}{j\omega_a C_0}} + \frac{1}{j\omega_a L_1 + \frac{1}{j\omega_a C_1}} \quad \text{(Equation 4)}$$

[Math. 5]

$$f_a = \frac{\sqrt{1 + \frac{C_1}{C_0}}}{2\pi\sqrt{L_1 C_1}} = f_r\sqrt{1 + \frac{C_1}{C_0}} \quad \text{(Equation 5)}$$

The graph on the right side of FIG. 12A shows that the anti-resonant frequency $f_a$ found by equation 5 is positioned on a higher-frequency side than the resonant frequency $f_r$ found by equation 3.

That is, the resonator reso1 has one resonant frequency and one anti-resonant frequency which is positioned on a higher-frequency side than the resonant frequency.

8.2 Parallel Connection of Resonators

The characteristics of parallel-connected resonators will now be explained below by using an equivalent circuit model.

Figure 12B:
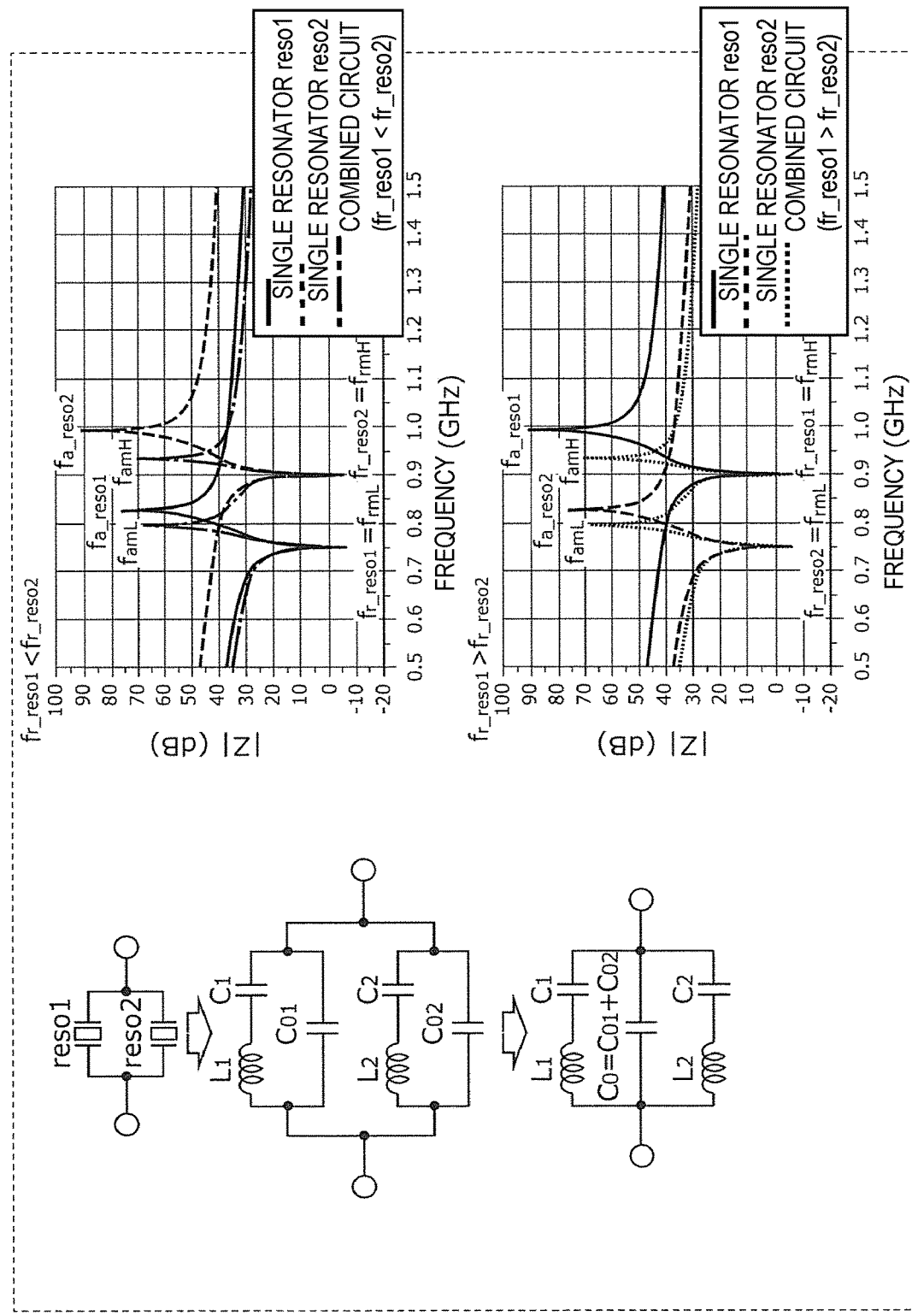
FIG. 12B illustrates an equivalent circuit model of two resonators connected in parallel with each other, and also illustrates the resonance characteristics of the parallel-connected resonators.

FIG. 12B illustrates an equivalent circuit model of two resonators reso1 and reso2 connected in parallel with each other and also illustrates the resonance characteristics of the parallel-connected resonators. In FIG. 12B, a model of the resonators reso1 and reso2 connected in parallel with each other is shown. The resonator reso1 is represented by a series circuit of a capacitor $C_1$ and an inductor $L_1$, and a circuit including a capacitor $C_{O1}$ connected in parallel with this series circuit. The resonator reso2 is represented by a series circuit of a capacitor $C_2$ and an inductor $L_2$, and a circuit including a capacitor $C_{o2}$ connected in parallel with this series circuit. The capacitor $C_{O1}$ has the electrostatic capacity of the resonator reso1, while the capacitor $C_{o2}$ has the electrostatic capacity of the resonator reso2. The circuit including the resonators reso1 and reso2 connected in parallel with each other can be represented by the equivalent circuit shown on the bottom left side of FIG. 12B. That is, the circuit including the parallel-connected resonators reso1 and reso2 can be represented by a parallel circuit of a series circuit of the capacitor $C_1$ and the inductor $L_1$, a series circuit of the capacitor $C_2$ and the inductor $L_2$, and the capacitor $C_0$ ($=C_{O1}+C_{O2}$).

The resonant frequency $f_r$ of this equivalent circuit is the frequency at which the impedance $Z_{rm}$ of this equivalent circuit is 0. Accordingly, when the resonant frequency $f_{r\_reso1}$ of the resonator reso1 is lower than the resonant frequency $f_{r\_reso2}$ of the resonator reso2 ($f_{r\_reso1} < f_{r\_reso2}$), the resonant frequency $f_{rmL}$ on the lower-frequency side can be expressed by equation 7 as a result of solving equation 6, and the resonant frequency $f_{rmH}$ on the higher-frequency side can be expressed by equation 9 as a result of solving equation 8.

[Math. 6]
$$Z_{rmL} = 0 = j\omega_{rmL}L_1 + \frac{1}{j\omega_{rmL}C_1} \quad \text{(Equation 6)}$$

[Math. 7]
$$f_{rmL} = \frac{1}{2\pi\sqrt{L_1C_1}} \quad \text{(Equation 7)}$$

[Math. 8]
$$Z_{rmH} = 0 = j\omega_{rmH}L_2 + \frac{1}{j\omega_{rmH}C_2} \quad \text{(Equation 8)}$$

[Math. 9]
$$f_{rmH} = \frac{1}{2\pi\sqrt{L_2C_2}} \quad \text{(Equation 9)}$$

The graph on the top right side of FIG. 12B shows that the resonant frequency $f_{rmL}$ on the lower-frequency side found by equation 7 is equal to the resonant frequency $f_{r\_reso1}$ of the single resonator reso1, while the resonant frequency $f_{rmH}$ on the higher-frequency side found by equation 9 is equal to the resonant frequency $f_{r\_reso2}$ of the single resonator reso2.

When the resonant frequency $f_{r\_reso1}$ of the resonator reso1 is higher than the resonant frequency $f_{r\_reso2}$ of the resonator reso2 ($f_{r\_reso1} > f_{r\_reso2}$), the resonant frequency $f_{rmL}$ on the lower-frequency side can be expressed by equation 11 as a result of solving equation 10, and the resonant frequency $f_{rmH}$ on the higher-frequency side can be expressed by equation 13 as a result of solving equation 12.

[Math. 10]
$$Z_{rmL} = 0 = j\omega_{rmL}L_2 + \frac{1}{j\omega_{rmL}C_2} \quad \text{(Equation 10)}$$

[Math. 11]
$$f_{rmL} = \frac{1}{2\pi\sqrt{L_2C_2}} \quad \text{(Equation 11)}$$

[Math. 12]
$$Z_{rmH} = 0 = j\omega_{rmH}L_1 + \frac{1}{j\omega_{rmH}C_1} \quad \text{(Equation 12)}$$

[Math. 13]
$$f_{rmH} = \frac{1}{2\pi\sqrt{L_1C_1}} \quad \text{(Equation 13)}$$

The graph on the bottom right side of FIG. 12B shows that the resonant frequency $f_{rmL}$ on the lower-frequency side found by equation 11 is equal to the resonant frequency $f_{r\_reso2}$ of the single resonator reso2, while the resonant frequency $f_{rmH}$ on the higher-frequency side found by equation 13 is equal to the resonant frequency $f_{r\_reso1}$ of the single resonator reso1.

The anti-resonant frequency of this equivalent circuit is the frequency at which the admittance $Y_{am}$ of the equivalent circuit is 0. Accordingly, by solving equation 14, this equivalent circuit is found to have two anti-resonant frequencies. More specifically, the anti-resonant frequency $f_{amL}$ on the lower-frequency side and the anti-resonant frequency $f_{amH}$ on the higher-frequency side are expressed by equations 15.

[Math. 14]
$$Y_{am} = \frac{1}{Z_{am}} = 0 = j\omega_{am}C_0 + \frac{1}{j\omega_{am}L_1 + \frac{1}{j\omega_{am}C_1}} + \frac{1}{j\omega_{am}L_2 + \frac{1}{j\omega_{am}C_2}} \quad \text{(Equation 14)}$$

[Math. 15]
$$f_{amL} = \frac{\sqrt{\frac{-b-\sqrt{b^2-4ac}}{2a}}}{2\pi}$$

$$f_{amH} = \frac{\sqrt{\frac{-b+\sqrt{b^2-4ac}}{2a}}}{2\pi}$$

$$a = L_1L_2C_0C_1C_2$$
$$b = -L_1C_0C_1 - L_2C_0C_2 - L_1C_1C_2 - L_2C_1C_2$$
$$c = C_0 + C_1 + C_2$$

(Equations 15)

The two graphs on the right side of FIG. 12B show that the position of the anti-resonant frequency $f_{amL}$ expressed by equations 15 is as follows. When the resonant frequency $f_{r\_reso1}$ of the resonator reso1 is lower than the resonant frequency $f_{r\_reso2}$ of the resonator reso2 ($f_{r\_reso1} < f_{r\_reso2}$), the anti-resonant frequency $f_{amL}$ is positioned on the lower-frequency side than the anti-resonant frequency $f_{a\_reso1}$ of the single resonator reso1. When the resonant frequency $f_{r\_reso1}$ of the resonator reso1 is higher than the resonant frequency $f_{r\_reso2}$ of the resonator reso2 ($f_{r\_reso1} > f_{r\_reso2}$) r the anti-resonant frequency $f_{amL}$ is positioned on the lower-frequency side than the anti-resonant frequency $f_{a\_reso2}$ of the single resonator reso2. The two graphs on the right side of FIG. 12B show that the position of the anti-resonant frequency $f_{amH}$ expressed by equations 15 is as follows. When the resonant frequency $f_{r\_reso1}$ of the resonator reso1 is lower than the resonant frequency $f_{r\_reso2}$ of the resonator reso2 ($f_{r\_reso1} < f_{r\_reso2}$), the anti-resonant frequency $f_{amH}$ is positioned on the lower-frequency side than the anti-resonant frequency $f_{a\_reso2}$ of the single resonator reso2. When the resonant frequency $f_{r\_reso1}$ of the resonator reso1 is higher than the resonant frequency $f_{r\_reso2}$ of the resonator reso2 ($f_{r\_reso1} > f_{r\_reso2}$), the anti-resonant frequency $f_{amH}$ is positioned on the lower-frequency side than the anti-resonant frequency $f_{a\_reso1}$ of the single resonator reso1.

8.3 Parallel Connection of Resonator to Series Circuit of Resonator and Capacitor A capacitor is added to the configuration shown in FIG. 12B, and more specifically, a capacitor is connected in series with the resonator reso1. The characteristics of this configuration will be explained below by using an equivalent circuit model. In this configuration, the resonator reso2 is connected in parallel with a series circuit of the resonator reso1 and a capacitor.

Figure 12C:
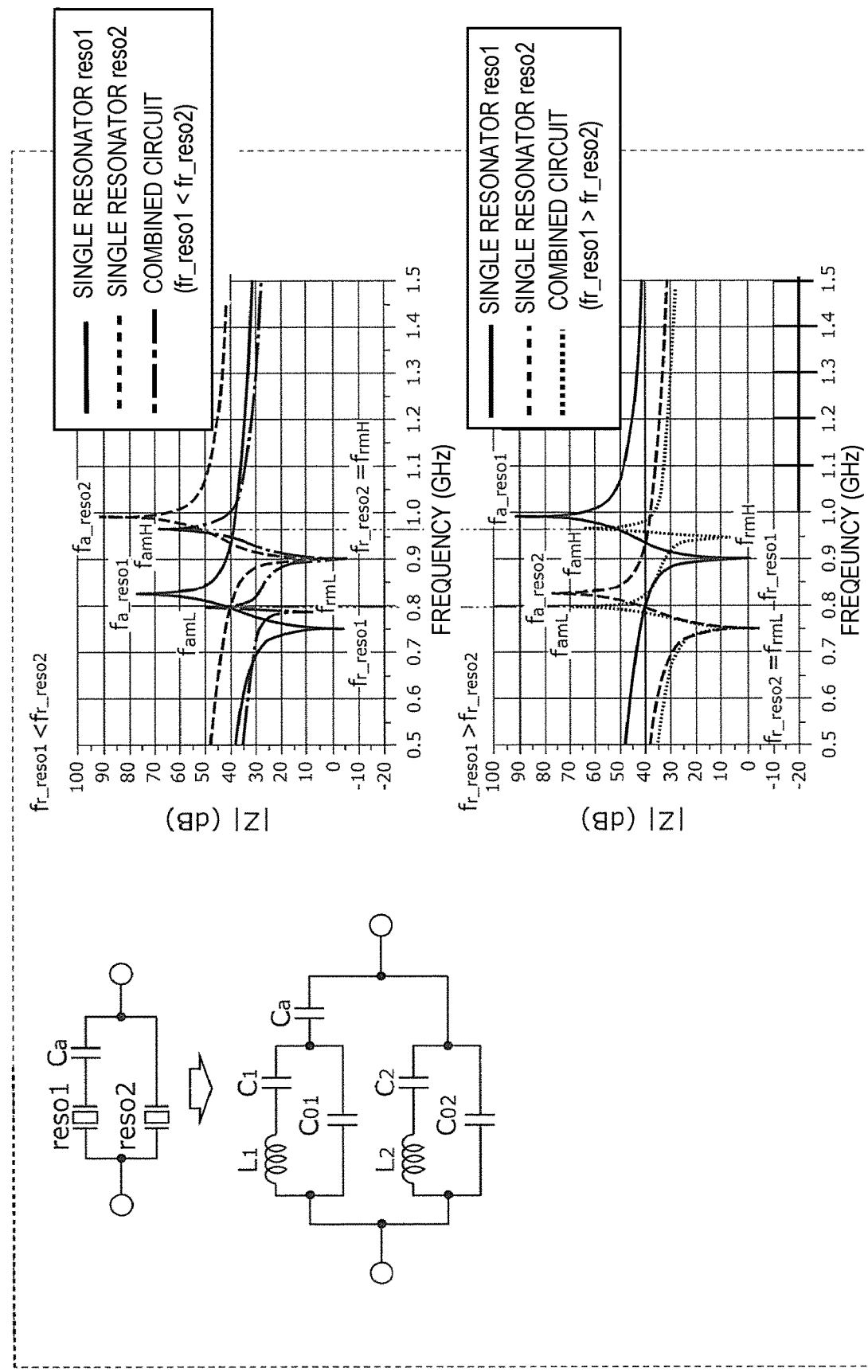
FIG. 12C illustrates an equivalent circuit model of the configuration in which a different resonator is connected in parallel with a series circuit of a resonator and a capacitor, and also illustrates the resonance characteristics of this configuration.

FIG. 12C illustrates an equivalent circuit model of the configuration in which the resonator reso2 is connected in parallel with a series circuit of the resonator reso1 and a capacitor Ca and also illustrates the resonance characteristics of this configuration.

The resonant frequency of this equivalent circuit is the frequency at which the impedance $Z_{rm}$ of the equivalent circuit is 0. Accordingly, when the resonant frequency $f_{r\_reso1}$ of the resonator reso1 is lower than the resonant frequency $f_{r\_reso2}$ of the resonator reso2 ($f_{r\_reso1} < f_{r\_reso2}$), the resonant frequency $f_{rmH}$ on the lower-frequency side is expressed by equation 17 as a result of solving equation 16, and the resonant frequency $f_{rmH}$ on the higher-frequency side is expressed by equation 19 as a result of solving equation 18.

[Math. 16]

$$Z_{rmL} = 0 = \cfrac{1}{\cfrac{1}{\cfrac{1}{j\omega_{rmL}C_{01}} + \cfrac{1}{j\omega_{rmL}L_1 + \cfrac{1}{j\omega_{rmL}C_1}}}} + \cfrac{1}{j\omega_{rmL}C_a} \quad \text{(Equation 16)}$$

[Math. 17]

$$f_{rmL} = \frac{\sqrt{\dfrac{C_{01} + C_1 + C_a}{L_1 C_1 C_a + L_1 C_{01} C_1}}}{2\pi} \quad \text{(Equation 17)}$$

[Math. 18]

$$Z_{rmH} = 0 = j\omega_{rmH}L_2 + \frac{1}{j\omega_{rmH}C_2} \quad \text{(Equation 18)}$$

[Math. 19]

$$f_{rmH} = \frac{1}{2\pi\sqrt{L_2 C_2}} \quad \text{(Equation 19)}$$

The graph on the top right side of FIG. 12C shows that the resonant frequency $f_{rmL}$ on the lower-frequency side found by equation 17 is positioned on the higher-frequency side than the resonant frequency $f_{r\_reso1}$ of the single resonator reso1 and that the resonant frequency $f_{rmH}$ on the higher-frequency side found by equation 19 is equal to the resonant frequency $f_{r\_reso2}$ of the single resonator reso2.

When the resonant frequency $f_{r\_reso1}$ of the resonator reso1 is higher than the resonant frequency $f_{r\_reso2}$ of the resonator reso2 ($f_{r\_reso1} > f_{r\_reso2}$), the resonant frequency $f_{rmL}$ on the lower-frequency side is expressed by equation 21 as a result of solving equation 20, and the resonant frequency $f_{rmH}$ on the higher-frequency side is expressed by equation 23 as a result of solving equation 22.

[Math. 20]

$$Z_{rmL} = 0 = j\omega_{rmL}L_2 + \frac{1}{j\omega_{rmL}C_2} \quad \text{(Equation 20)}$$

[Math. 21]

$$f_{rmL} = \frac{1}{2\pi\sqrt{L_2 C_2}} \quad \text{(Equation 21)}$$

[Math. 22]

$$Z_{rmH} = $$
$$0 = \cfrac{1}{\cfrac{1}{\cfrac{1}{j\omega_{rmH}C_{01}} + \cfrac{1}{j\omega_{rmH}L_1 + \cfrac{1}{j\omega_{rmH}C_1}}}} + \cfrac{1}{j\omega_{rmH}C_a} \quad \text{(Equation 22)}$$

[Math. 23]

$$f_{rmH} = \frac{\sqrt{\dfrac{C_{01} + C_1 + C_a}{L_1 C_1 C_a + L_1 C_{01} C_1}}}{2\pi} \quad \text{(Equation 23)}$$

The graph on the bottom right side of FIG. 12C shows that the resonant frequency $f_{rmL}$ on the lower-frequency side found by equation 21 is equal to the resonant frequency $f_{r\_reso2}$ of the single resonator reso2, while the resonant frequency $f_{rmH}$ on the higher-frequency side found by equation 23 is positioned on the higher-frequency side than the resonant frequency $f_{r\_reso1}$ of the single resonator reso1.

The anti-resonant frequency of this equivalent circuit is the frequency at which the admittance $Y_{am}$ of the equivalent circuit is 0. Accordingly, by solving equation 24, this equivalent circuit is found to have two anti-resonant frequencies. More specifically, the anti-resonant frequency $f_{amL}$ on the lower-frequency side and the anti-resonant frequency $f_{amH}$ on the higher-frequency side are expressed by equations 25.

[Math. 24]

$$Y_{am} = 0 = \cfrac{1}{\cfrac{1}{\cfrac{1}{j\omega_{am}C_{01}} + \cfrac{1}{j\omega_{am}L_1 + \cfrac{1}{j\omega_{am}C_1}}} + \cfrac{1}{j\omega_{am}C_a}} + \cfrac{1}{\cfrac{1}{j\omega_{am}C_{02}} + j\omega_{am}L_2 + \cfrac{1}{j\omega_{am}C_2}} \quad \text{(Equation 24)}$$

-continued

[Math. 25]

$$f_{amL} = \frac{\sqrt{\frac{-B - \sqrt{B^2 - 4AC}}{2A}}}{2\pi}$$

$$f_{amH} = \frac{\sqrt{\frac{-B + \sqrt{B^2 - 4AC}}{2A}}}{2\pi}$$

$A = L_1 L_2 C_{01} C_{02} C_1 C_2 +$
$\qquad L_1 L_2 C_{01} C_1 C_2 C_a + L_1 L_2 C_{02} C_1 C_2 C_a$ $B = -L_1 C_{01} C_{02} C_1 - L_1 C_{01} C_1 C_2 - L_1 C_{01} C_1 C_a -$
$\qquad L_1 C_{02} C_1 C_a - L_1 C_1 C_2 C_a - L_2 C_{01} C_{02} C_2 -$
$\qquad L_2 C_{01} C_2 C_a - L_2 C_{02} C_1 C_2 - L_2 C_{02} C_2 C_a - L_2 C_1 C_2 C_a$ $C = C_{01} C_{02} + C_{01} C_2 + C_{01} C_a + C_{02} C_1 +$
$\qquad C_{02} C_a + C_1 C_2 + C_1 C_a + C_2 C_a$ (Equations 25)

The two graphs on the right side of FIG. 12C show that the anti-resonant frequency $f_{amL}$ expressed by equations 25 is positioned on the lower-frequency side than one of the anti-resonant frequency $f_{a\_reso1}$ of the single resonator reso1 and the anti-resonant frequency $f_{a\_reso2}$ of the single resonator reso2 and that the anti-resonant frequency $f_{amH}$ expressed by equations 25 is positioned on the lower-frequency side than the other one of the anti-resonant frequency $f_{a\_reso1}$ and the anti-resonant frequency $f_{a\_reso2}$. More specifically, the graph on the top right side of FIG. 12C shows that, when $f_{r\_reso1} < f_{r\_reso2}$, the resonant frequency $f_{rmL}$ on the lower-frequency side is positioned on the lower-frequency side than the resonant frequency $f_{r\_reso1}$ of the single resonator reso1 and the resonant frequency $f_{rmH}$ on the higher-frequency side is positioned on the lower-frequency side than the resonant frequency $f_{r\_reso2}$ of the single resonator reso2. The graph on the bottom right side of FIG. 12C shows that, when $f_{r\_reso1} > f_{r\_reso2}$, the resonant frequency $f_{rmL}$ on the lower-frequency side is positioned on the lower-frequency side than the resonant frequency $f_{r\_reso2}$ of the single resonator reso2 and the resonant frequency $f_{rmH}$ on the higher-frequency side is positioned on the lower-frequency side than the resonant frequency $f_{r\_reso1}$ of the single resonator reso1.

8.4 Parallel Connection of One Series Circuit of Resonator and Capacitor and Another Series Circuit of Resonator and Capacitor Another capacitor is added to the configuration of FIG. 12C, and more specifically, a capacitor is connected in series with the resonator reso2. The characteristics of such a configuration will be explained below by using an equivalent circuit model. In this configuration, a series circuit of the resonator reso2 and a capacitor is connected in parallel with the series circuit of the resonator reso1 and the capacitor Ca.

Figure 12D:
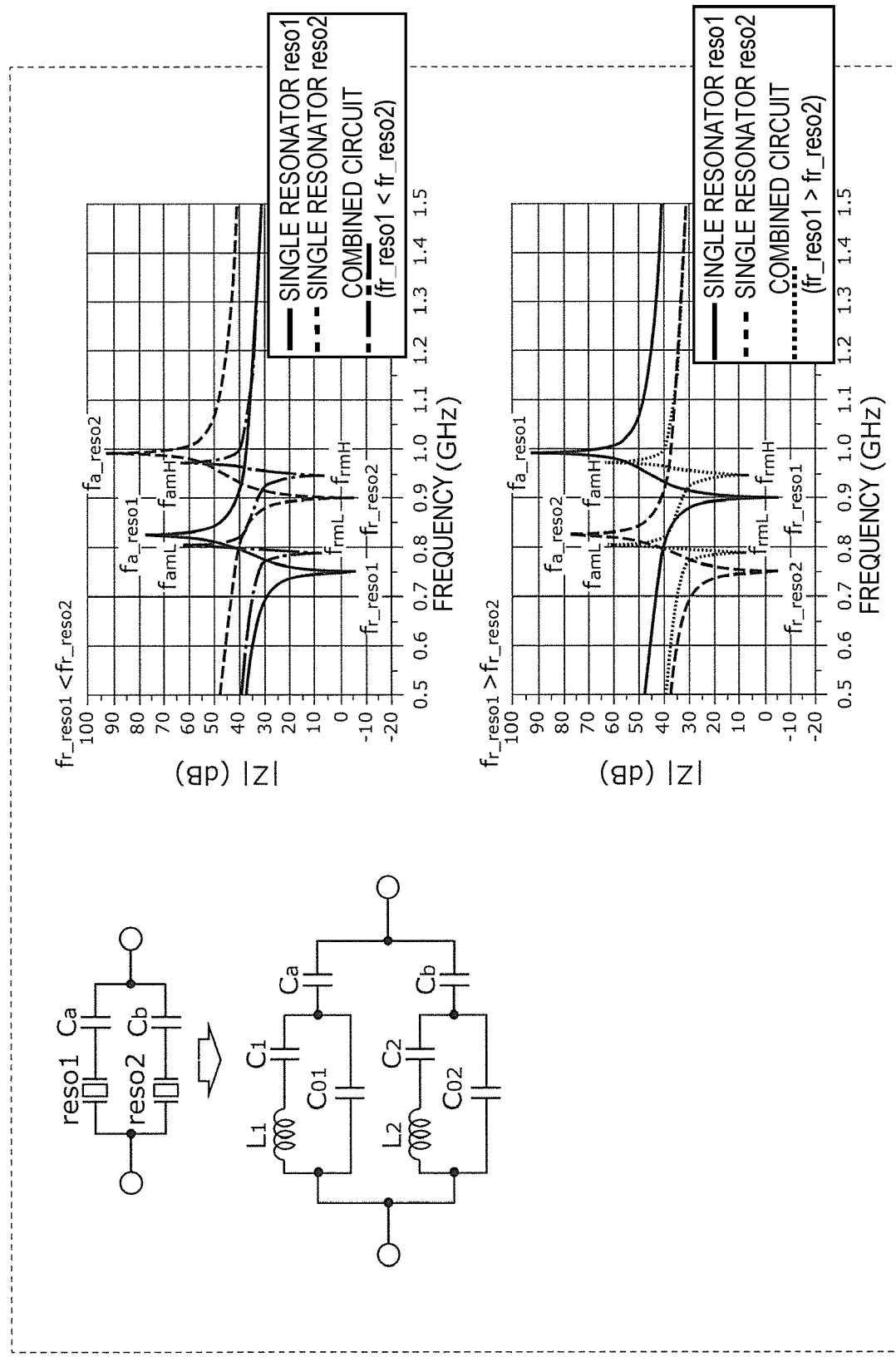
FIG. 12D illustrates an equivalent circuit model of the configuration in which a series circuit of a resonator and a capacitor is connected in parallel with another series circuit of a resonator and a capacitor, and also illustrates the resonance characteristics of this configuration.

FIG. 12D illustrates an equivalent circuit model of the configuration in which a series circuit of a resonator and a capacitor is connected in parallel with another series circuit of a resonator and a capacitor, and also illustrates the resonance characteristics of this configuration.

The resonant frequency of this equivalent circuit is the frequency at which the impedance $Z_{rm}$ of the equivalent circuit is 0. Accordingly, when the resonant frequency $f_{r\_reso1}$ of the resonator reso1 is lower than the resonant frequency $f_{r\_reso2}$ of the resonator reso2 ($f_{r\_reso1} < f_{r\_reso2}$), the resonant frequency $f_{rmL}$ on the lower-frequency side can be expressed by equation 27 as a result of solving equation 26, and the resonant frequency $f_{rmH}$ on the higher-frequency side can be expressed by equation 29 as a result of solving equation 28. Equation 26 is the same as the above-described equation 16, while equation 27 is the same as the above-described equation 17.

[Math. 26]

$$Z_{rmL} = 0 = \frac{1}{\frac{1}{\frac{1}{j\omega_{rmL}C_{01}} + \frac{1}{j\omega_{rmL}L_1 + \frac{1}{j\omega_{rmL}C_1}}}} + \frac{1}{j\omega_{rmL}C_a} \quad \text{(Equation 26)}$$

[Math. 27]

$$f_{rmL} = \frac{\sqrt{\frac{C_{01} + C_1 + C_a}{L_1 C_1 C_a + L_1 C_{01} C_1}}}{2\pi} \quad \text{(Equation 27)}$$

[Math. 28]

$$Z_{rmH} = 0 = \frac{1}{\frac{1}{\frac{1}{j\omega_{rmH}C_{02}} + \frac{1}{j\omega_{rmH}L_2 + \frac{1}{j\omega_{rmH}C_2}}}} + \frac{1}{j\omega_{rmH}C_b} \quad \text{(Equation 28)}$$

[Math. 29]

$$f_{rmH} = \frac{\sqrt{\frac{C_{02} + C_2 + C_b}{L_2 C_2 C_b + L_2 C_{02} C_2}}}{2\pi} \quad \text{(Equation 29)}$$

The graph on the top right side of FIG. 12D shows that the resonant frequency $f_{rmL}$ on the lower-frequency side found by equation 27 is positioned on the higher-frequency side than the resonant frequency $f_{r\_reso1}$ of the single resonator reso1, while the resonant frequency $f_{rmH}$ on the higher-frequency side found by equation 29 is positioned on the higher-frequency side than the resonant frequency $f_{r\_reso2}$ of the single resonator reso2.

When the resonant frequency $f_{r\_reso1}$ of the resonator reso1 is higher than the resonant frequency $f_{r\_reso2}$ of the resonator reso2 ($f_{r\_reso1} > f_{r\_reso2}$), the resonant frequency $f_{rmL}$ on the lower-frequency side is expressed by equation 31 as a result of solving equation 30, and the resonant frequency $f_{rmH}$ on the higher-frequency side is expressed by equation 33 as a result of solving equation 32. Equation 32 is the same as the above-described equation 22, while equation 33 is the same as the above-described equation 23.

[Math. 30]

$$Z_{rmL} = 0 = \frac{1}{\frac{1}{\frac{1}{j\omega_{rmL}C_{02}} + \frac{1}{j\omega_{rmL}L_2 + \frac{1}{j\omega_{rmH}C_2}}}} + \frac{1}{j\omega_{rmL}C_b} \quad \text{(Equation 30)}$$

[Math. 31]

$$f_{rmL} = \frac{\sqrt{\frac{C_{02} + C_2 + C_b}{L_2 C_2 C_b + L_2 C_{02} C_2}}}{2\pi} \quad \text{(Equation 31)}$$

[Math. 32]

$$Z_{rmH} = 0 = \cfrac{1}{\cfrac{1}{\cfrac{1}{j\omega_{rmH}C_{01}} + \cfrac{1}{j\omega_{rmH}L_1 + \cfrac{1}{j\omega_{rmH}C_1}}}} + \cfrac{1}{j\omega_{rmH}C_a} \quad \text{(Equation 32)}$$

[Math. 33]

$$f_{rmH} = \frac{\sqrt{\cfrac{C_{01}+C_1+C_a}{L_1 C_1 C_a + L_1 C_{01} C_1}}}{2\pi} \quad \text{(Equation 33)}$$

The graph on the bottom right side of FIG. 12D shows that the resonant frequency $f_{ftd}$, on the lower-frequency side found by equation 31 is positioned on the higher-frequency side than the resonant frequency $f_{r\_reso2}$ of the single resonator reso2, while the resonant frequency $f_{rmH}$ on the higher-frequency side found by equation 33 is positioned on the higher-frequency side than the resonant frequency $f_{r\_reso1}$ of the single resonator reso1.

The anti-resonant frequency of this equivalent circuit is the frequency at which the admittance $Y_{am}$ of the equivalent circuit is 0. Accordingly, by solving equation 34, this equivalent circuit is found to have two anti-resonant frequencies. More specifically, the anti-resonant frequency $f_{amL}$ on the lower-frequency side and the anti-resonant frequency $f_{amH}$ on the higher-frequency side are expressed by equations 35.

[Math. 34]

$$Y_{am} = 0 = \cfrac{1}{\cfrac{1}{\cfrac{1}{j\omega_{am}C_{01}} + \cfrac{1}{j\omega_{am}L_1 + \cfrac{1}{j\omega_{am}C_1}}} + \cfrac{1}{j\omega_a C_a}} + \cfrac{1}{\cfrac{1}{\cfrac{1}{j\omega_{am}C_{02}} + \cfrac{1}{j\omega_{am}L_2 + \cfrac{1}{j\omega_{am}C_2}}} + \cfrac{1}{j\omega_{am}C_b}} \quad \text{(Equation 34)}$$

[Math. 35]

$$f_{amL} = \frac{\sqrt{\cfrac{-B-\sqrt{B^2-4AC}}{2A}}}{2\pi}$$

$$f_{amH} = \frac{\sqrt{\cfrac{-B+\sqrt{B^2-4AC}}{2A}}}{2\pi} \quad \text{(Equations 35)}$$

$A = L_1 L_2 C_{01} C_{02} C_1 C_2 (C_a + C_b) +$
$\qquad L_1 L_2 C_1 C_2 C_a C_b (C_{01} + C_{02})$ $B = C_a C_b (L_1 C_{01} C_1 + L_2 C_{02} C_2 + L_2 C_{01} C_2 + L_1 C_{02} C_1) +$
$\qquad C_{01} C_{02} (L_1 C_1 C_a + L_2 C_2 C_b + L_2 C_2 C_a + L_1 C_1 C_b) +$
$\qquad C_1 C_2 (L_1 C_{01} C_b + L_2 C_{02} C_a + L_2 C_a C_b +$
$\qquad\qquad L_2 C_{02} C_a + L_1 C_a C_b + L_1 C_{01} C_b)$ $C = C_a C_b (L_2 C_{01} C_2 + L_1 C_{02} C_1) +$
$\qquad C_{01} C_{02} (L_2 C_2 C_a + L_1 C_1 C_b) +$
$\qquad C_1 C_2 (L_2 C_a C_b + L_2 C_{02} C_a + L_1 C_a C_b + L_1 C_{01} C_b)$ The two graphs on the right side of FIG. 12D show that the anti-resonant frequency $f_{amL}$ expressed by equations 35 is positioned on the lower-frequency side than one of the anti-resonant frequency $f_{a\_reso1}$ of the single resonator reso1 and the anti-resonant frequency $f_{a\_reso2}$ of the single resonator reso2 and that the anti-resonant frequency $f_{amH}$ expressed by equations 35 is positioned on the lower-frequency side than the other one of the anti-resonant frequency $f_{a\_reso1}$ and the anti-resonant frequency $f_{a\_reso2}$. More specifically, the graph on the top right side of FIG. 12D shows that, when $f_{r\_reso1} < f_{r\_reso2}$ r the resonant frequency $f_{rmL}$ on the lower-frequency side is positioned on the lower-frequency side than the resonant frequency $f_{r\_reso1}$ of the single resonator reso1 and the resonant frequency $f_{rmH}$ on the higher-frequency side is positioned on the lower-frequency side than the resonant frequency $f_{r\_reso2}$ of the single resonator reso2. The graph on the bottom right side of FIG. 12D shows that, when $f_{r\_reso1} > f_{r\_reso2}$, the resonant frequency $f_{rmL}$ on the lower-frequency side is positioned on the lower-frequency side than the resonant frequency $f_{r\_reso2}$ of the single resonator reso2 and the resonant frequency $f_{rmH}$ on the higher-frequency side is positioned on the lower-frequency side than the resonant frequency $f_{r\_reso1}$ of the single resonator reso1.

8.5 Parallel Connection of Resonator to Series Circuit of Resonator and Inductor The characteristics of resonators to which capacitors are connected have been discussed above by the use of equivalent circuit models. The characteristics of resonators to which an inductor is connected will be discussed below by using an equivalent circuit model.

The characteristics of the configuration (see the configuration shown in FIG. 12E) in which the capacitor Ca in the configuration of FIG. 12C is replaced by an inductor La will be explained below by using an equivalent circuit model. In this configuration, the resonator reso2 is connected in parallel with a series circuit of the resonator reso1 and the inductor La.

Figure 12E:
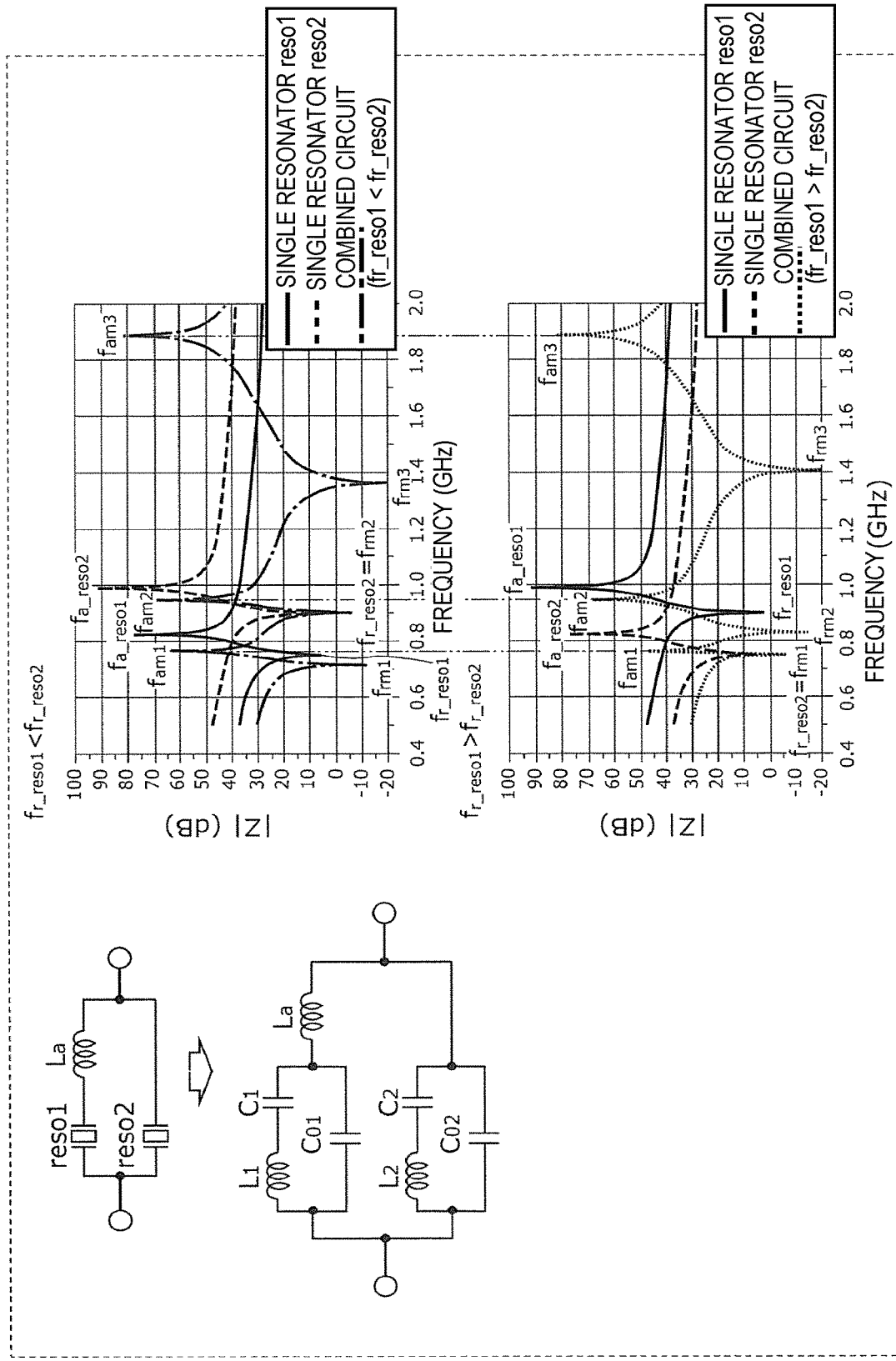
FIG. 12E illustrates an equivalent circuit model of the configuration in which a different resonator is connected in parallel with a series circuit of a resonator and an inductor, and also illustrates the resonance characteristics of this configuration.

FIG. 12E illustrates an equivalent circuit model of the configuration in which the resonator reso2 is connected in parallel with the series circuit of the resonator reso1 and the inductor La, and also illustrates the resonance characteristics of this configuration.

The resonant frequency of this equivalent circuit is the frequency at which the impedance $Z_{rm}$ of the equivalent circuit is 0. Accordingly, when the resonant frequency $f_{r\_reso1}$ of the resonator reso1 is lower than the resonant frequency $f_{r\_reso2}$ of the resonator reso2 ($f_{r\_reso1} < f_{r\_reso2}$), the resonant frequencies $f_{rm1}$, $f_{rm2}$, and $f_{rm3}$ ($f_{rm1} < f_{rm2} < f_{rm3}$) are expressed as follows. As a result of solving equation 36 in which the impedance $Z_{rm}$ of the above-described equivalent circuit becomes 0 in relation to the inductor La, the resonant frequencies $f_{rm1}$ and $f_{rm3}$ are expressed by equations 37. As a result of solving equation 38 in which the impedance $Z_{rm}$ of the above-described equivalent circuit becomes 0 without the inductor La, the resonant frequency $f_{rm2}$ is expressed by equation 39.

[Math. 36]

$$Z_{rm} = 0 = \cfrac{1}{\cfrac{1}{\cfrac{1}{j\omega_{rm}C_{01}} + \cfrac{1}{j\omega_{rm}L_1 + \cfrac{1}{j\omega_{rm}C_1}}}} + j\omega_{rm}L_a \quad \text{(Equation 36)}$$

[Math. 37]

$$f_{rm1} = \frac{\sqrt{\frac{-(-L_1C_1 - L_aC_{01} - L_aC_1) - \sqrt{(-L_1C_1 - L_aC_{01} - L_1C_1)^2 - 4(L_1L_aC_{01}C_1)}}{2(L_1L_aC_{01}C_1)}}}{2\pi}$$ (Equations 37)

$$f_{rm3} = \frac{\sqrt{\frac{-(-L_1C_1 - L_aC_{01} - L_aC_1) + \sqrt{(-L_1C_1 - L_aC_{01} - L_aC_1)^2 - 4(L_1L_aC_{01}C_1)}}{2(L_1L_aC_{01}C_1)}}}{2\pi}$$

[Math. 38]

$$Z_{rm} = 0 = j\omega_{rm2}L_2 + \frac{1}{j\omega_{rm2}C_2}$$ (Equation 38)

[Math. 39]

$$f_{rm2} = \frac{1}{2\pi\sqrt{L_2C_2}}$$ (Equation 39)

The graph on the top right side of FIG. 12E shows that the resonant frequency $f_{rm1}$ found by equations 37 is positioned on the lower-frequency side than the resonant frequency $f_{r\_reso1}$ of the single resonator reso1, the resonant frequency $f_{rm2}$ found by equation 39 is equal to the resonant frequency $f_{r\_reso2}$ of the single resonator reso2, and the resonant frequency $f_{rm3}$ found by equations 37 is added on the higher-frequency side than the resonant frequency $f_{r\_reso1}$ of the single resonator reso1 and the resonant frequency $f_{r\_reso2}$ of the single resonator reso2.

When the resonant frequency $f_{r\_reso1}$ of the resonator reso1 is higher than the resonant frequency $f_{r\_reso2}$ of the resonator reso2 ($f_{r\_reso1} > f_{r\_reso2}$), the resonant frequencies $f_{rm2}$ and $f_{rm3}$ are expressed by equations 40 as a result of solving the above-described equation 36, and the resonant frequency $f_{rm1}$ is expressed by equation 41 as a result of solving above-described equation 38.

[Math. 40]

$$f_{rm2} = \frac{\sqrt{\frac{-(-L_1C_1 - L_aC_{01} - L_aC_1) - \sqrt{(-L_1C_1 - L_aC_{01} - L_1C_1)^2 - 4(L_1L_aC_{01}C_1)}}{2(L_1L_aC_{01}C_1)}}}{2\pi}$$ (Equations 40)

$$f_{rm3} = \frac{\sqrt{\frac{-(-L_1C_1 - L_aC_{01} - L_aC_1) + \sqrt{(-L_1C_1 - L_aC_{01} - L_aC_1)^2 - 4(L_1L_aC_{01}C_1)}}{2(L_1L_aC_{01}C_1)}}}{2\pi}$$

[Math. 41]

$$f_{rm1} = \frac{1}{2\pi\sqrt{L_2C_2}}$$ (Equation 41)

The graph on the bottom right side of FIG. 12E shows that the resonant frequency $f_{rm1}$ found by equation 41 is equal to the resonant frequency $f_{r\_reso2}$ of the single resonator reso2, the adjacent resonant frequency $f_{rm2}$ found by equations 40 is positioned on the lower-frequency side than the resonant frequency $f_{r\_reso1}$ of the single resonator reso1, and the resonant frequency $f_{rm3}$ is added on the higher-frequency side than the resonant frequency $f_{r\_reso2}$ of the single resonator reso2 and the resonant frequency $f_{r\_reso1}$ of the single resonator reso1.

The anti-resonant frequency of this equivalent circuit is the frequency at which the admittance $Y_{am}$ of the equivalent circuit is 0. Accordingly, by solving equation 42, this equivalent circuit is found to have three anti-resonant frequencies $f_{am1}$, $f_{am2}$, and $f_{am3}$.

[Math. 42]

$$Y_{am} = 0 = \frac{1}{\frac{1}{\frac{1}{j\omega_{am}C_{01}} + \frac{1}{j\omega_{am}L_1 + \frac{1}{j\omega_{am}C_1}}} + \frac{1}{j\omega_{am}L_a}} + \frac{1}{\frac{1}{j\omega_{am}C_{02}} + \frac{1}{j\omega_{am}L_2 + \frac{1}{j\omega_{am}C_2}}}}$$ (Equation 42)

The detailed equations concerning the three anti-resonant frequencies $f_{amL}$ $f_{am2}$, and $f_{am3}$ are cubic equations and are complicated, and an explanation thereof will thus be omitted. The two graphs on the right side of FIG. 12E show that the anti-resonant frequency $f_{am1}$ is positioned on the lower-frequency side than one of the anti-resonant frequency $f_{a\_reso1}$ of the single resonator reso1 and the anti-resonant frequency $f_{a\_reso2}$ of the single resonator reso2 and that the anti-resonant frequency $f_{am2}$ is positioned on the lower-frequency side than the other one of the anti-resonant frequency $f_{a\_reso1}$ and the anti-resonant frequency $f_{a\_reso2}$. More specifically, the graph on the top right side of FIG. 12E shows that, when $f_{r\_reso1} < f_{r\_reso2}$, the anti-resonant frequency $f_{am1}$ is positioned on the lower-frequency side than the anti-resonant frequency $f_{a\_reso1}$ of the single resonator reso1 and the anti-resonant frequency $f_{am2}$ is positioned on the lower-frequency side than the anti-resonant frequency $f_{a\_reso2}$ of the single resonator reso2, and also, the anti-resonant frequency $f_{am3}$ is added on the higher-frequency side than the anti-resonant frequency $f_{a\_reso1}$ of the single resonator reso1 and the anti-resonant frequency $f_{a\_reso2}$ of the single resonator reso2. The graph on the bottom right side of FIG. 12E shows that, when $f_{r\_reso1} > f_{r\_reso2r}$ the anti-resonant frequency $f_{am1}$ is positioned on the lower-frequency side than the anti-resonant frequency $f_{a\_reso2}$ of the single resonator reso2 and the anti-resonant frequency $f_{am2}$ is positioned on the lower-frequency side than the anti-resonant frequency $f_{a\_reso1}$ of the single resonator reso1, and also, the anti-resonant frequency $f_{am3}$ is added on the higher-frequency side than the anti-resonant frequency $f_{a\_reso2}$ of the single resonator reso2 and the anti-resonant frequency $f_{a\_reso1}$ of the single resonator reso1.

8.6 Parallel Connection of One Series Circuit of Resonator and Inductor and Another Series Circuit of Resonator and Inductor The characteristics of the configuration (see the configuration shown in FIG. 12F) in which the capacitors Ca and Cb in the configuration of FIG. 12D are replaced by inductors La and Lb will be explained below by using an equivalent circuit model. In this configuration, a series circuit of the resonator reso2 and the inductor Lb is connected in parallel with the series circuit of the resonator reso1 and the inductor La.

Figure 12F:
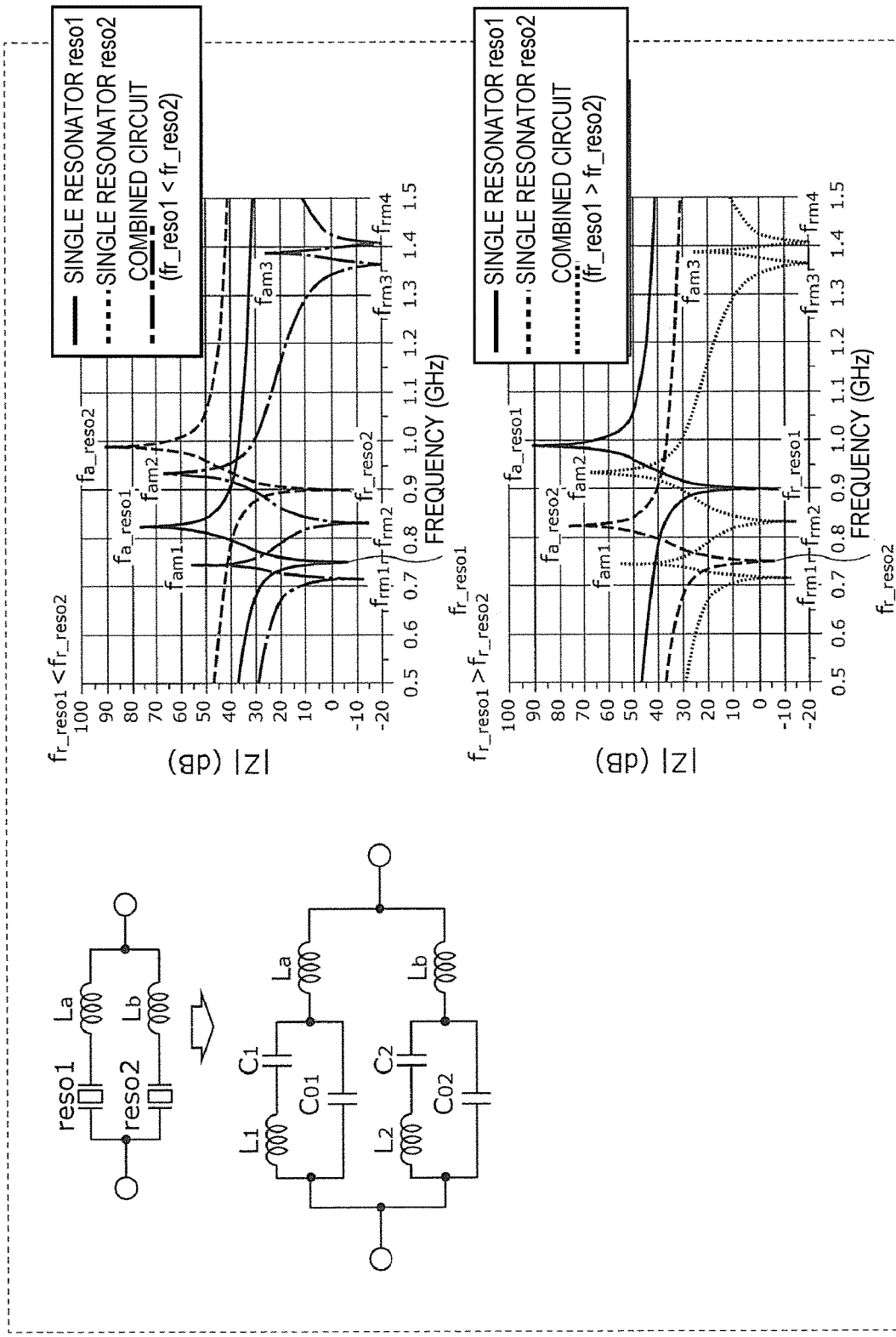
FIG. 12F illustrates an equivalent circuit model of the configuration in which a series circuit of a resonator and an inductor is connected in parallel with another series circuit of a resonator and an inductor, and also illustrates the resonance characteristics of this configuration.

FIG. 12F illustrates an equivalent circuit model of the configuration in which a series circuit of a resonator and an inductor is connected in parallel with another series circuit of a resonator and an inductor, and also illustrates the resonance characteristics of this configuration.

The resonant frequency of this equivalent circuit is the frequency at which the impedance $Z_{rm}$ of the equivalent circuit is 0. Accordingly, when the resonant frequency $f_{r\_reso1}$ of the resonator reso1 is lower than the resonant frequency $f_{r\_reso2}$ of the resonator reso2 ($f_{r\_reso1} < f_{r\_reso2}$) r the resonant frequencies $f_{rmL}$ $f_{rm2}$, $f_{rm3}$, and $f_{rm4}$ ($f_{rm1} < f_{rm2} < f_{rm3} < f_{rm4}$) are expressed as follows. As a result of solving equation 43 in which the impedance $Z_{rm}$ of the above-described equivalent circuit becomes 0 in relation to the inductor La, the resonant frequencies $f_{rm1}$ and $f_{rm3}$ are expressed by equations 44. As a result of solving equation 45 in which the impedance $Z_{rm}$ of the above-described equivalent circuit becomes 0 in relation to the inductor Lb, the resonant frequencies $f_{rm2}$ and $f_{rm4}$ are expressed by equations 46. Equation 43 is the same as the above-described equation 36, while equations 44 are the same as the above-described equations 37.

[Math. 43]

$$Z_{rm} = 0 = \frac{1}{\frac{1}{\frac{1}{j\omega_{rm}C_{01}}} + \frac{1}{j\omega_{rm}L_1 + \frac{1}{j\omega_{rm}C_1}}} + j\omega_{rm}L_a \quad \text{(Equation 43)}$$

[Math. 44]

$$f_{rm1} = \frac{\sqrt{\frac{-(-L_1C_1 - L_aC_{01} - L_aC_1) - \sqrt{(-L_1C_1 - L_aC_{01} - L_1C_1)^2 - 4(L_1L_aC_{01}C_1)}}{2(L_1L_aC_{01}C_1)}}}{2\pi}$$

$$f_{rm3} = \frac{\sqrt{\frac{-(-L_1C_1 - L_aC_{01} - L_aC_1) + \sqrt{(-L_1C_1 - L_aC_{01} - L_aC_1)^2 - 4(L_1L_aC_{01}C_1)}}{2(L_1L_aC_{01}C_1)}}}{2\pi} \quad \text{(Equations 44)}$$

[Math. 45]

$$Z_{rm} = 0 = \frac{1}{\frac{1}{\frac{1}{j\omega_{rm}C_{02}}} + \frac{1}{j\omega_{rm}L_2 + \frac{1}{j\omega_{rm}C_2}}} + j\omega_{rm}L_b \quad \text{(Equation 45)}$$

[Math. 46]

$$f_{rm2} = \frac{\sqrt{\frac{-(-L_2C_2 - L_bC_{02} - L_bC_2) - \sqrt{(-L_2C_2 - L_bC_{02} - L_bC_2)^2 - 4(L_2L_bC_{02}C_2)}}{2(L_2L_bC_{02}C_2)}}}{2\pi}$$

$$f_{rm4} = \frac{\sqrt{\frac{-(-L_2C_2 - L_bC_{02} - L_bC_2) + \sqrt{(-L_2C_2 - L_bC_{02} - L_bC_2)^2 - 4(L_2L_bC_{02}C_2)}}{2(L_2L_bC_{02}C_2)}}}{2\pi} \quad \text{(Equations 46)}$$

The graph on the top right side of FIG. 12F shows that the lowest resonant frequency $f_{rm1}$ found by equations 44 is positioned on the lower-frequency side than the resonant frequency $f_{r\_reso1}$ of the single resonator reso1, the adjacent resonant frequency $f_{rm2}$ found by equations 46 is positioned on the lower-frequency side than the resonant frequency $f_{r\_reso2}$ of the single resonator reso2, and also that the resonant frequencies $f_{rm3}$ and $f_{rm4}$ are added on the higher-frequency side than the resonant frequency $f_{r\_reso1}$ of the single resonator reso1 and the resonant frequency $f_{r\_reso2}$ of the single resonator reso2.

When the resonant frequency $f_{r\_reso1}$ of the resonator reso1 is higher than the resonant frequency $f_{r\_reso2}$ of the resonator reso2 ($f_{r\_reso1} > f_{r\_reso2}$), the resonant frequencies $f_{rm2}$ and $f_{rm4}$ are expressed by equations 47 as a result of solving the above-described equation 43, and the resonant frequencies $f_{rm1}$ and $f_{rm3}$ are expressed by equations 48 as a result of solving the above-described equation 45.

[Math. 47]

$$f_{rm2} = \frac{\sqrt{\frac{-(-L_1C_1 - L_aC_{01} - L_aC_1) - \sqrt{(-L_1C_1 - L_aC_{01} - L_1C_1)^2 - 4(L_1L_aC_{01}C_1)}}{2(L_1L_aC_{01}C_1)}}}{2\pi}$$

$$f_{rm4} = \frac{\sqrt{\frac{-(-L_1C_1 - L_aC_{01} - L_aC_1) + \sqrt{(-L_1C_1 - L_aC_{01} - L_aC_1)^2 - 4(L_1L_aC_{01}C_1)}}{2(L_1L_aC_{01}C_1)}}}{2\pi} \quad \text{(Equations 47)}$$

[Math. 48]

$$f_{rm1} = \frac{\sqrt{\frac{-(-L_2C_2 - L_bC_{02} - L_bC_2) - \sqrt{(-L_2C_2 - L_bC_{02} - L_bC_2)^2 - 4(L_2L_bC_{02}C_2)}}{2(L_2L_bC_{02}C_2)}}}{2\pi}$$

$$f_{rm3} = \frac{\sqrt{\frac{-(-L_2C_2 - L_bC_{02} - L_bC_2) + \sqrt{(-L_2C_2 - L_bC_{02} - L_bC_2)^2 - 4(L_2L_bC_{02}C_2)}}{2(L_2L_bC_{02}C_2)}}}{2\pi} \quad \text{(Equations 48)}$$

The graph on the bottom right side of FIG. 12F shows that the lowest resonant frequency $f_{rm1}$ found by equations 48 is positioned on the lower-frequency side than the resonant frequency $f_{r\_reso2}$ of the single resonator reso2, the adjacent resonant frequency $f_{rm2}$ found by equations 47 is positioned on the lower-frequency side than the resonant frequency $f_{r\_reso1}$ of the single resonator reso1, and the resonant frequencies $f_{rm3}$ and $f_{rm4}$ are added on the higher-frequency side than the resonant frequency $f_{r\_reso2}$ of the single resonator reso2 and the resonant frequency $f_{r\_reso1}$ of the single resonator reso1.

The anti-resonant frequency of this equivalent circuit is the frequency at which the admittance $Y_{am}$ of the equivalent circuit is 0. Accordingly, by solving equation 49, this equivalent circuit is found to have three anti-resonant frequencies $f_{am1}$, $f_{am2}$, and $f_{am3}$.

[Math. 49]

$$Y_{am} = 0 = \cfrac{1}{\cfrac{1}{\cfrac{1}{j\omega_{am}C_{01}} + \cfrac{1}{j\omega_{am}L_1 + \cfrac{1}{j\omega_{am}C_1}}} + j\omega_{am}L_a} + \cfrac{1}{\cfrac{1}{\cfrac{1}{j\omega_{am}C_{02}} + \cfrac{1}{j\omega_{am}L_2 + \cfrac{1}{j\omega_{am}C_2}}} + j\omega_{am}L_a}$$ (Equation 49)

The detailed equations concerning the three anti-resonant frequencies $f_{am1}$, $f_{am2}$, and $f_{am3}$ are cubic equations and are complicated, and an explanation thereof will thus be omitted. The two graphs on the right side of FIG. 12F show that the anti-resonant frequency $f_{am1}$ is positioned on the lower-frequency side than one of the anti-resonant frequency $f_{a\_reso1}$ of the single resonator reso1 and the anti-resonant frequency $f_{a\_reso2}$ of the single resonator reso2 and that the anti-resonant frequency $f_{am2}$ is positioned on the lower-frequency side than the other one of the anti-resonant frequency $f_{a\_reso1}$ and the anti-resonant frequency $f_{a\_reso2}$. More specifically, the graph on the top right side of FIG. 12F shows that, when $f_{r\_reso1} < f_{r\_reso2}$, the anti-resonant frequency $f_{am1}$ is positioned on the lower-frequency side than the anti-resonant frequency $f_{a\_reso1}$ of the single resonator reso1 and the anti-resonant frequency $f_{am2}$ is positioned on the lower-frequency side than the anti-resonant frequency $f_{a\_reso2}$ of the single resonator reso2, and also, the anti-resonant frequency $f_{am3}$ is added on the higher-frequency side than the anti-resonant frequency $f_{a\_reso1}$ of the single resonator reso1 and the anti-resonant frequency $f_{a\_reso2}$ of the single resonator reso2. The graph on the bottom right side of FIG. 12F shows that, when $f_{r\_reso1} > f_{r\_reso2}$, the anti-resonant frequency $f_{am1}$ is positioned on the lower-frequency side than the anti-resonant frequency $f_{a\_reso2}$ of the single resonator reso2 and the anti-resonant frequency $f_{am2}$ is positioned on the lower-frequency side than the anti-resonant frequency $f_{a\_reso1}$ of the single resonator reso1, and also, the anti-resonant frequency $f_{am3}$ is added on the higher-frequency side than the anti-resonant frequency $f_{a\_reso1}$ of the single resonator reso1 and the anti-resonant frequency $f_{a\_reso2}$ of the single resonator reso2.

8.7 Explanation of Characteristics Based on Resonance Analysis

Based on the above-described resonance analysis, it is possible to explain that the resonant frequency or the anti-resonant frequency of the parallel arm circuit in each of the filters 22A, 22D, 22E, and 22F is changed in accordance with the switching of the switch 22SW between ON and OFF.

(i) Filter 22A

For example, concerning the filter 22A, when the switch 22SW is ON, in the parallel arm circuit 120A, the parallel arm resonators 22p1 and 22p2 are connected in parallel with each other. In this case, the resonant frequencies and the anti-resonant frequencies of the parallel arm circuit 120A can be explained in a manner similar to those of the equivalent circuit model in which the resonators reso1 and reso2 are connected in parallel with each other (see FIG. 12B) where $f_{r\_reso1} > f_{r\_reso2}$. That is, the parallel arm resonators 22p1 and 22p2 in the parallel arm circuit 120A correspond to the resonator reso2 and the resonator reso1, respectively, in this equivalent circuit model where $f_{r\_reso1} > f_{r\_reso2}$. More specifically, the resonant frequency frp1on on the lower-frequency side is expressed by the above-described equation 11, and the resonant frequency frp2on on the higher-frequency side is expressed by the above-described equation 13. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In contrast, when the switch 22SW of the filter 22A is OFF, in the parallel arm circuit 120A, the parallel arm resonator 22p1 is connected in parallel with the series circuit of the parallel arm resonator 22p2 and the capacitor 22C. In this case, the resonant frequencies and the anti-resonant frequencies of the parallel arm circuit 120A can be explained in a manner similar to those of the equivalent circuit model in which the resonator reso2 is connected in parallel with the series circuit of the resonator reso1 and the capacitor Ca where $f_{r\_reso1} > f_{r\_reso2}$ (see FIG. 12C). That is, the parallel arm resonators 22p1 and 22p2 and the capacitor 22C in the parallel arm circuit 120A correspond to the resonators reso2 and reso1 and the capacitor Ca, respectively, in the equivalent circuit model where $f_{r\_reso1} > f_{r\_reso2}$. More specifically, the resonant frequency frp1off on the lower-frequency side is expressed by the above-described equation 21, and the resonant frequency frp2off on the higher-frequency side is expressed by the above-described equation 23. The anti-resonant frequency fap1off on the lower-frequency side is expressed by $f_{amL}$ in the above-described equations 25, and the anti-resonant frequency fap2off on the higher-frequency side is expressed by $f_{amH}$ in the above-described equations 25.

Consequently, as a result of the switch 22SW being switched between ON and OFF, both of the higher resonant frequency and the lower anti-resonant frequency in the parallel arm circuit 120A are shifted to the lower-frequency side or the higher-frequency side together. By using the filter 22A, it is possible to shift both of the frequency at the high edge of the pass band and that of the attenuation pole on the higher-frequency side of the pass band to the lower-frequency side or the higher-frequency side together without substantially increasing the insertion loss at the high edge of the pass band.

(ii) Filter 22D

Regarding the filter 22D, when the switch 22SW is ON, in the parallel arm circuit 120D, the parallel arm resonators 22p1 and 22p2 are connected in parallel with each other. In this case, the resonant frequencies and the anti-resonant frequencies of the parallel arm circuit 120D can be explained in a manner similar to those of the equivalent circuit model in which the resonators reso1 and reso2 are connected in parallel with each other where $f_{r\_reso1} < f_{r\_reso2}$ (see FIG. 12B). That is, the parallel arm resonators 22p1 and 22p2 in the parallel arm circuit 120D correspond to the resonators reso1 and reso2, respectively, in this equivalent circuit model where $f_{r\_reso1} < f_{r\_reso2}$. More specifically, the resonant frequency frp1on on the lower-frequency side is expressed by the above-described equation 7, and the resonant frequency frp2on on the higher-frequency side is expressed by the above-described equation 9. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In contrast, when the switch 22SW of the filter 22D is OFF, in the parallel arm circuit 120D, the parallel arm resonator 22p2 is connected in parallel with the series circuit of the parallel arm resonator 22p1 and the capacitor 22C. In this case, the resonant frequencies and the anti-resonant frequencies of the parallel arm circuit 120D can be explained in a manner similar to those of the equivalent circuit model in which the resonator reso2 is connected in parallel with the series circuit of the resonator reso1 and the capacitor Ca where $f_{r\_reso1} < f_{r\_reso2}$ (see FIG. 12C). That is, the parallel arm resonators 22p1 and 22p2 and the capacitor 22C in the parallel arm circuit 120D correspond to the resonators reso1 and reso2 and the capacitor Ca, respectively, in the equivalent circuit model where $f_{r\_reso1} < f_{r\_reso2}$. More specifically, regarding the parallel arm circuit 120D, the resonant frequency frp1off on the lower-frequency side is expressed by the above-described equation 17, and the resonant frequency frp2off on the higher-frequency side is expressed by the above-described equation 19. The anti-resonant frequency fap1off on the lower-frequency side is expressed by $f_{amL}$ in the above-described equations 25, and the anti-resonant frequency fap2off on the higher-frequency side is expressed by $f_{amH}$ in the above-described equations 25.

Consequently, as a result of the switch 22SW being switched between ON and OFF, both of the lower resonant frequency and the lower anti-resonant frequency in the parallel arm circuit 120D are shifted to the lower-frequency side or the higher-frequency side together. By using the filter 22D, it is possible to shift both of the frequency at the low edge of the pass band and that of the attenuation pole on the lower-frequency side of the pass band to the lower-frequency side or the higher-frequency side together without substantially increasing the insertion loss at the low edge of the pass band.

(iii) Filter 22E

Concerning the filter 22E, when the switches 22SW1 and 22SW2 are both ON, in the parallel arm circuit 120E, the parallel arm resonators 22p1 and 22p2 are connected in parallel with each other. In this case, the resonant frequencies and the anti-resonant frequencies of the parallel arm circuit 120E can be explained in a manner similar to those of the equivalent circuit model in which the resonators reso1 and reso2 are connected in parallel with each other where $f_{r\_reso1} < f_{r\_reso2}$ (see FIG. 12B). That is, the parallel arm resonators 22p1 and 22p2 in the parallel arm circuit 120E correspond to the resonators reso1 and reso2, respectively, in this equivalent circuit model where $f_{r\_reso1} < f_{r\_reso2}$. More specifically, the resonant frequency frp1on on the lower-frequency side is expressed by the above-described equation 7, and the resonant frequency frp2on on the higher-frequency side is expressed by the above-described equation 9. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In contrast, when the switches 22SW1 and 22SW2 of the filter 22E are both OFF, in the parallel arm circuit 120E, the series circuit of the parallel arm resonator 22p2 and the capacitor 22C2 is connected in parallel with the series circuit of the parallel arm resonator 22p1 and the capacitor 22C1. In this case, the resonant frequencies and the anti-resonant frequencies of the parallel arm circuit 120E can be explained in a manner similar to those of the equivalent circuit model in which the series circuit of the resonator reso2 and the capacitor Cb is connected in parallel with the series circuit of the resonator reso1 and the capacitor Ca where $f_{r\_reso1} < f_{r\_reso2}$ (see FIG. 12D). That is, the parallel arm resonators 22p1 and 22p2 and the capacitors 22C1 and 22C2 in the parallel arm circuit 120E correspond to the resonators reso1 and reso2 and the capacitors Ca and Cb, respectively, in the equivalent circuit model where $f_{r\_reso1} < f_{r\_reso2}$. More specifically, regarding the parallel arm circuit 120E, the resonant frequency frp1off on the lower-frequency side is expressed by the above-described equation 27, and the resonant frequency frp2off on the higher-frequency side is expressed by the above-described equation 29. The anti-resonant frequency fap1off on the lower-frequency side is expressed by $f_{amL}$ in the above-described equations 35, and the anti-resonant frequency fap2off on the higher-frequency side is expressed by $f_{amH}$ in the above-described equations 35.

Consequently, as a result of the switches 22SW1 and 22SW2 being switched between ON and OFF, the lower resonant frequency, the higher resonant frequency, and the lower anti-resonant frequency in the parallel arm circuit 120E are shifted to the lower-frequency side or the higher-frequency side together. By using the filter 22E, it is possible to switch the center frequency without substantially increasing the insertion loss at the edges of the pass band.

(iv) Filter 22F

Regarding the filter 22F, when the switch 22SW is ON, in the parallel arm circuit 120F, the parallel arm resonators 22p1 and 22p2 are connected in parallel with each other. In this case, the resonant frequencies and the anti-resonant frequencies of the parallel arm circuit 120F can be explained in a manner similar to those of the equivalent circuit model in which the resonators reso1 and reso2 are connected in parallel with each other where $f_{r\_reso1} > f_{r\_reso2}$ (see FIG. 12B). That is, the parallel arm resonators 22p1 and 22p2 in the parallel arm circuit 120F correspond to the resonators reso1 and reso2, respectively, in this equivalent circuit model where $f_{r\_reso1} < f_{r\_reso2}$. More specifically, the resonant frequency frp1on on the lower-frequency side is expressed by the above-described equation 11, and the resonant frequency frp2on on the higher-frequency side is expressed by the above-described equation 13. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In contrast, when the switch 22SW of the filter 22F is OFF, in the parallel arm circuit 120F, the parallel arm resonator 22p1 is connected in parallel with the series circuit of the parallel arm resonator 22p2 and the inductor 22L. In this case, the resonant frequencies and the anti-resonant frequencies of the parallel arm circuit 120F can be explained in a manner similar to those of the equivalent circuit model in which the resonator reso2 is connected in parallel with the series circuit of the resonator reso1 and the inductor La where $f_{r\_reso1} > f_{r\_reso2}$ (see FIG. 12E). That is, the parallel arm resonators 22p1 and 22p2 and the inductor 22L in the parallel arm circuit 120F correspond to the resonators reso2 and reso1 and the inductor La, respectively, in the equivalent circuit model where $f_{r\_reso1} < f_{r\_reso2}$. More specifically, the lowest resonant frequency is expressed by the above-described equation 41, and the second lowest resonant frequency is expressed by $f_{rm2}$ in the above-described equations 40. The anti-resonant frequency is found by solving the above-described equation 42.

Consequently, as a result of the switch 22SW being switched between ON and OFF, both of the higher resonant frequency and the lower anti-resonant frequency in the parallel arm circuit 120F are shifted to the lower-frequency side or the higher-frequency side together. By using the filter 22F, it is possible to shift both of the frequency at the high edge of the pass band and that of the attenuation pole on the higher-frequency side of the pass band to the lower-frequency side or the higher-frequency side together without substantially increasing the insertion loss at the high edge of the pass band.

(v) Provision of Inductor Instead of Capacitor in Filter 22D

The configuration in which an inductor is provided instead of the capacitor 22C in the filter 22D will be described below. When the switch 22SW is ON, the resonant frequencies and the anti-resonant frequencies of the parallel arm circuit in this configuration can be explained in a manner similar to those of the equivalent circuit model in which the resonators reso1 and reso2 are connected in parallel with each other where $f_{r\_reso1} < f_{r\_reso2}$ (see FIG. 12B). That is, the parallel arm resonators 22p1 and 22p2 in this parallel arm circuit correspond to the resonators reso1 and reso2, respectively, in this equivalent circuit model where $f_{r\_reso1} < f_{r\_reso2}$. Hence, the resonant frequency frp1on on the lower-frequency side is expressed by the above-described equation 7, and the resonant frequency frp2on on the higher-frequency side is expressed by the above-described equation 9. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In the above-described configuration, when the switch 22SW is OFF, in the parallel arm circuit, the parallel arm resonator 22p2 is connected in parallel with the series circuit of the parallel arm resonator 22p1 and the inductor. In this case, the resonant frequencies and the anti-resonant frequencies of the parallel arm circuit can be explained in a manner similar to those of the equivalent circuit model in which the resonator reso2 is connected in parallel with the series circuit of the resonator reso1 and the inductor La where $f_{r\_reso1} > f_{r\_reso2}$ (see FIG. 12E). That is, the parallel arm resonators 22p1 and 22p2 and the inductor in this parallel arm circuit correspond to the resonators reso1 and reso2 and the inductor La, respectively, in the equivalent circuit model where $f_{r\_reso1} < f_{r\_reso2}$. More specifically, in this parallel arm circuit, the lowest resonant frequency is expressed by $f_{rm1}$ in the above-described equations 37, the second lowest resonant frequency is expressed by the above-described equation 39, and the highest resonant frequency is expressed by $f_{rm3}$ in the above-described equations 37. The anti-resonant frequency is found by solving the above-described equation 42. This parallel arm circuit has three anti-resonant frequencies, though the equations thereof based on frequency analysis are not indicated.

Consequently, as a result of the switch 22SW being switched between ON and OFF, both of the resonant frequency of the parallel arm circuit 120D which forms the attenuation pole on the lower-frequency side of the pass band and the anti-resonant frequency of the parallel arm circuit 120D which forms the pass band are shifted to the lower-frequency side or the higher-frequency side together. In the configuration in which an inductor is provided instead of the capacitor 22C in the filter 22D, it is possible to shift both of the frequency at the low edge of the pass band and that of the attenuation pole on the lower-frequency side of the pass band to the lower-frequency side or the higher-frequency side together without substantially increasing the insertion loss at the low edge of the pass band.

(vi) Provision of Inductors Instead of Capacitors in Filter 22E

The configuration in which inductors are provided instead of the capacitors 22C1 and 22C2 in the filter 22E will be described below. When the switches 22SW1 and 22SW2 are ON, the resonant frequencies and the anti-resonant frequencies of the parallel arm circuit in this configuration can be explained in a manner similar to those of the equivalent circuit model in which the resonators reso1 and reso2 are connected in parallel with each other where $f_{r\_reso1} < f_{r\_reso2}$ (see FIG. 12B). That is, the parallel arm resonators 22p1 and 22p2 in this parallel arm circuit correspond to the resonators reso1 and reso2, respectively, in this equivalent circuit model where $f_{r\_reso1} < f_{r\_reso2}$. Hence, the resonant frequency frp1on on the lower-frequency side is expressed by the above-described equation 7, and the resonant frequency frp2on on the higher-frequency side is expressed by the above-described equation 9. The anti-resonant frequency fap1on on the lower-frequency side is expressed by $f_{amL}$ in the above-described equations 15, and the anti-resonant frequency fap2on on the higher-frequency side is expressed by $f_{amH}$ in the above-described equations 15.

In the above-described configuration, when the switches 22SW1 and 22SW2 are both OFF, in the parallel arm circuit, the series circuit of the parallel arm resonator 22p2 and one inductor is connected in parallel with the series circuit of the parallel arm resonator 22p1 and the other inductor. In this case, the resonant frequencies and the anti-resonant frequencies of the parallel arm circuit can be explained in a manner similar to those of the equivalent circuit model in which the series circuit of the resonator reso2 and the inductor Lb is connected in parallel with the series circuit of the resonator reso1 and the inductor La where $f_{r\_reso1} < f_{r\_reso2}$ (see FIG. 12F). That is, the parallel arm resonators 22p1 and 22p2, the inductor connected in series with the parallel arm resonator 22p1, and the inductor connected in series with the parallel arm resonator 22p2 in this parallel arm circuit correspond to the resonators reso1 and reso2 and the inductors La and Lb, respectively, in the equivalent circuit model where $f_{r\_reso1} < f_{r\_reso2}$. More specifically, in this parallel arm circuit, the lowest resonant frequency is expressed by $f_{rm1}$ in the above-described equations 44, and the second lowest resonant frequency is expressed by $f_{rm2}$ in the above-described equations 46. The anti-resonant frequency is found by solving the above-described equation 49.

Consequently, as a result of the switches 22SW1 and 22SW2 being switched between ON and OFF, the resonant frequency of the parallel arm circuit which forms the attenuation pole on the lower-frequency side of the pass band, the anti-resonant frequency of the parallel arm circuit which forms the pass band, and the resonant frequency of the parallel arm circuit which forms the attenuation pole on the higher-frequency side of the pass band are shifted to the lower-frequency side or the higher-frequency side together. In the configuration in which inductors are provided instead of the capacitors 22C1 and 22C2 in the filter 22E, it is possible to shift both of the frequency at the low edge of the pass band and that of the attenuation pole on the lower-frequency side of the pass band and the frequency at the high edge of the pass band and that of the attenuation pole on the higher-frequency side of the pass band to the lower-frequency side or the higher-frequency side together without substantially increasing the insertion loss at the edges of the pass band.

9. Relationship Concerning Bandwidth Ratios

Concerning the series arm resonator 22s and the parallel arm resonators 22p1 and 22p2 constituted by the above-described elastic wave resonators, the bandwidth ratio of the series arm resonator 22s may be smaller than that of at least one of the parallel arm resonators 22p1 and 22p2 (first and second parallel arm resonators). The bandwidth ratio of a resonator is defined as the value (or the percentage) obtained by dividing the frequency difference fa-fr between the anti-resonant frequency fa and the resonant frequency fr by the resonant frequency fr, that is, as the value (fa-fr)/fr.

If the bandwidth ratio of the series arm resonator is smaller than that of at least one of the parallel arm resonators, it is possible to increase the frequency difference between the lower anti-resonant frequency in a parallel arm circuit which forms a pass band and the lower resonant frequency in the parallel arm circuit which forms the attenuation pole on the lower-frequency side of the pass band and also to increase the frequency difference between the higher resonant frequency in the parallel arm circuit which forms the attenuation pole on the higher-frequency side of the pass band and the lower anti-resonant frequency in the parallel arm circuit which forms the pass band. As a result, the pass band width can be increased.

The bandwidth ratio is adjusted in the following manner, for example.

Figure 13:
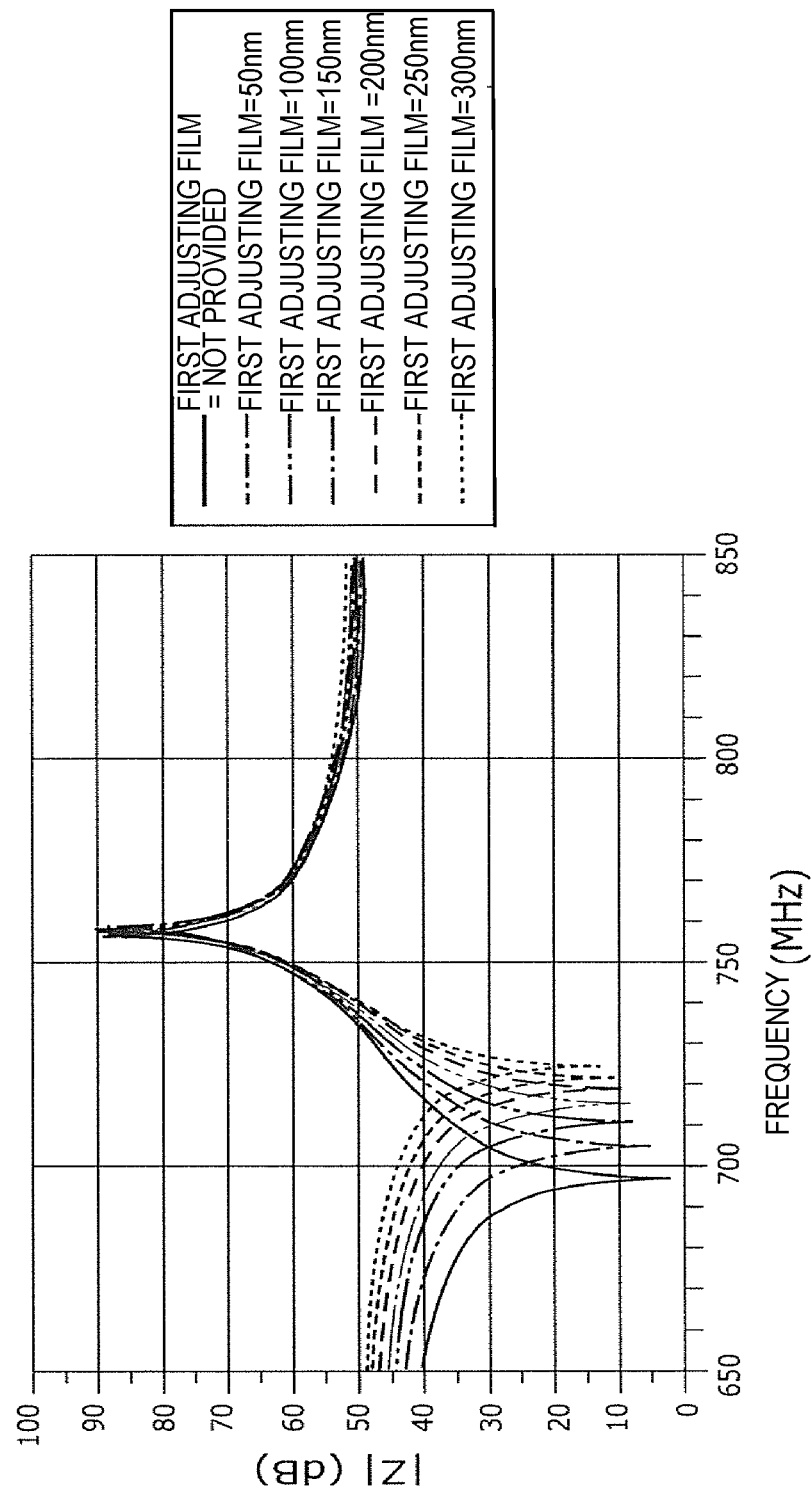
FIG. 13 is a graph illustrating the relationship between the film thickness of a first adjusting film which forms the electrode structure and the impedance of a surface acoustic wave resonator.
Figure 14:
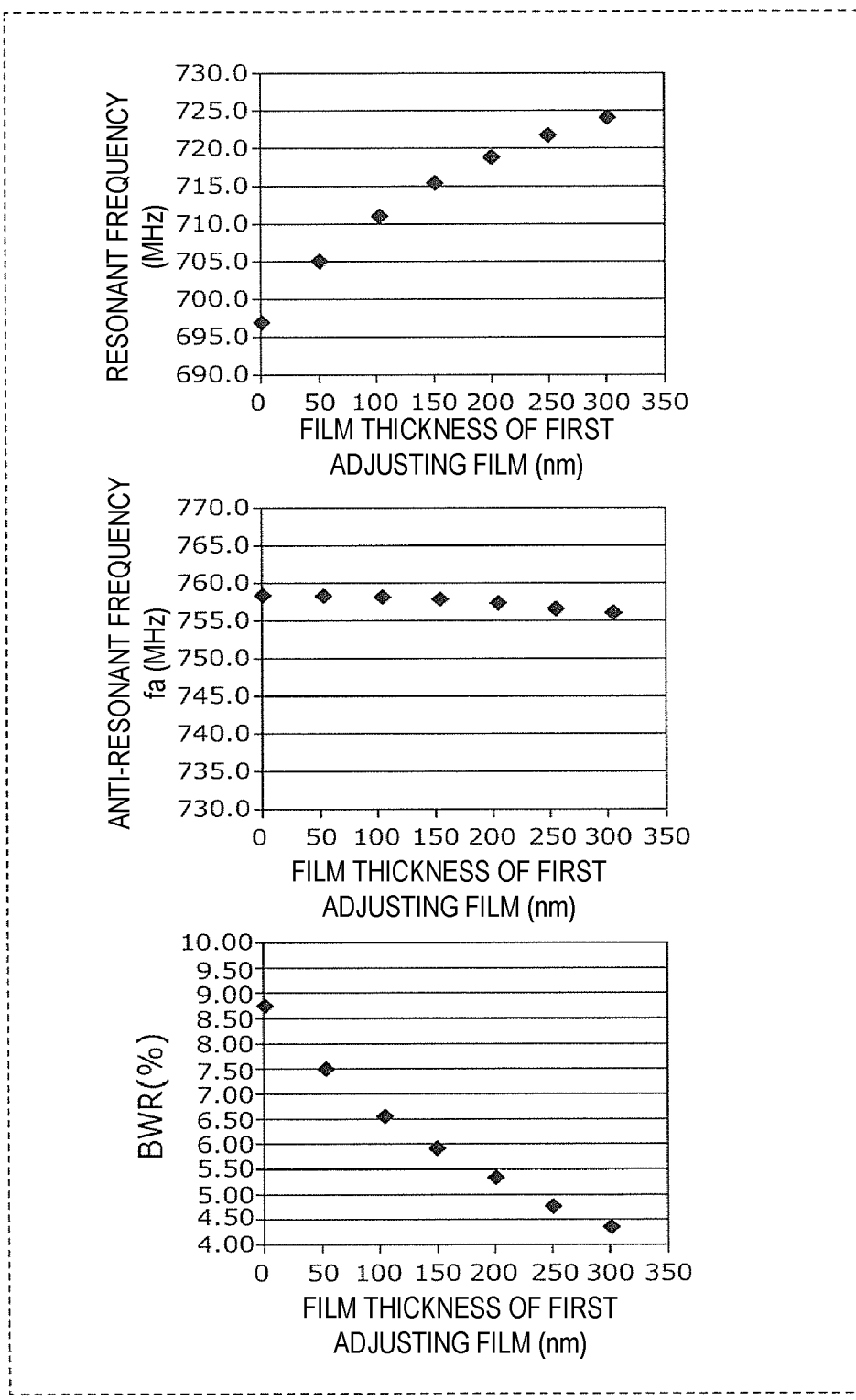
FIG. 14 shows graphs illustrating the relationships of the film thickness of the first adjusting film to the resonant frequency, anti-resonant frequency, and bandwidth ratio of the surface acoustic wave resonator.

FIG. 13 is a graph illustrating the relationship between the film thickness of the first adjusting film forming the electrode structure (FIGS. 4A and 4B) of the surface acoustic wave resonator according to the first embodiment and the impedance of the surface acoustic wave resonator. FIG. 14 shows graphs illustrating the relationships of the film thickness of the first adjusting film (Ksaw adjusting film 122) to the resonant frequency, anti-resonant frequency, and bandwidth ratio of the surface acoustic wave resonator. FIG. 13 shows the frequency characteristics with respect to the impedance of the surface acoustic wave resonator when the film thickness of the first adjusting film shown in FIG. 4B is changed. As the substrate 101 having piezoelectric properties, a −10°-Y-cut LiNbO$_3$ substrate is used, and the film thickness of the IDT electrode 121 is 400 nm. The top portion of FIG. 14 shows the relationship between the film thickness of the first adjusting film and the resonant frequency fr. The intermediate portion of FIG. 14 shows the relationship between the film thickness of the first adjusting film and the anti-resonant frequency fa. The bottom portion of FIG. 14 shows the relationship between the film thickness of the first adjusting film and the bandwidth ratio BWR.

As shown in FIG. 13, when the film thickness of the first adjusting film is varied, the resonant frequency fr is shifted, while the anti-resonant frequency fa remains almost the same. More specifically, as shown in FIG. 14, as the film thickness of the first adjusting film is thicker, the resonant frequency fr becomes higher and the bandwidth ratio BWR becomes smaller. That is, adjusting of the film thickness of the first adjusting film can set the bandwidth ratio of the surface acoustic wave resonator.

Based on the above-described results, in order to set the bandwidth ratio of the series arm resonator 22s to be smaller than that of at least one of the parallel arm resonators 22p1 and 22p2, the first adjusting film may be formed in the series arm resonator 22s. More specifically, (1) the first adjusting film to be provided for the IDT electrode of at least one of the parallel arm resonators 22p1 and 22p2 is made thinner than that of the series arm resonator 22s, or (2) the first adjusting film is not provided for the IDT electrode of at least one of the parallel arm resonators 22p1 and 22p2.

This configuration can set the bandwidth ratio of the series arm resonator 22s to be smaller than that of at least one of the parallel arm resonators 22p1 and 22p2.

Figure 15:
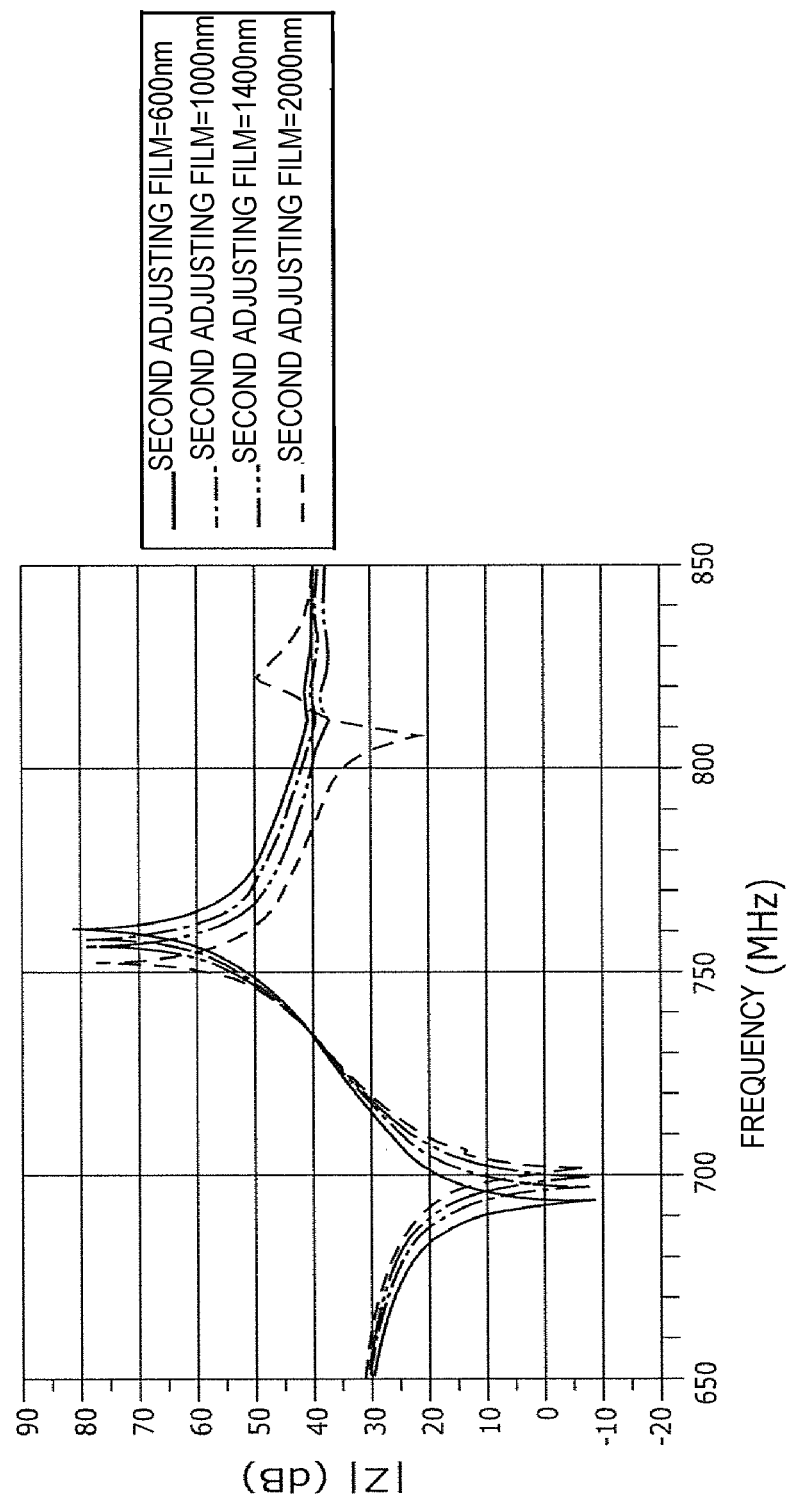
FIG. 15 is a graph illustrating the relationship between the film thickness of a second adjusting film which forms the electrode structure and the impedance of the surface acoustic wave resonator.
Figure 16:
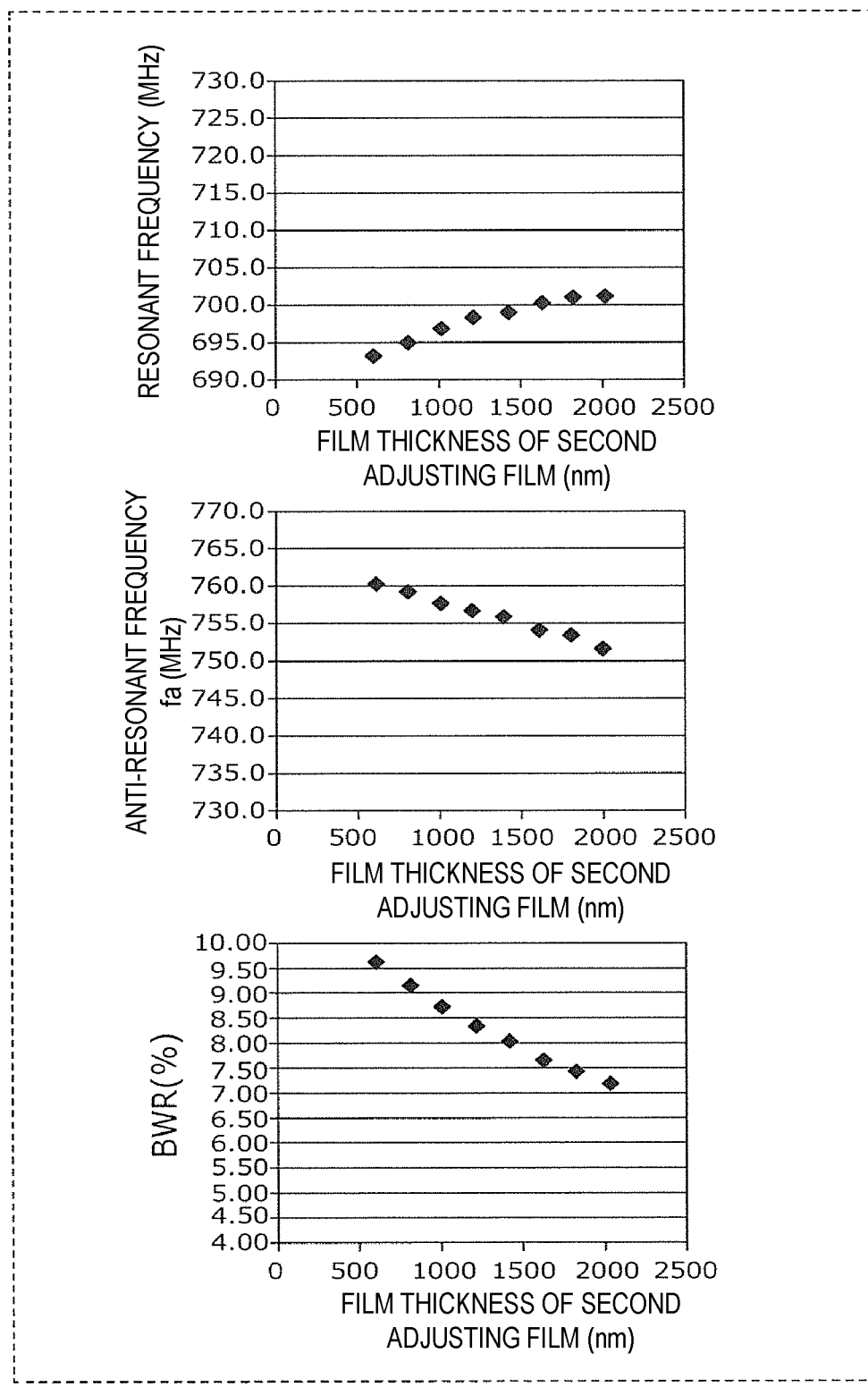
FIG. 16 shows graphs illustrating the relationships of the film thickness of the second adjusting film to the resonant frequency, anti-resonant frequency, and bandwidth ratio of the surface acoustic wave resonator.

FIG. 15 is a graph illustrating the relationship between the film thickness of the second adjusting film (protection layers 103 and 104) forming the electrode structure and the impedance of the surface acoustic wave resonator. FIG. 16 shows graphs illustrating the relationships of the film thickness of the second adjusting film to the resonant frequency, anti-resonant frequency, and bandwidth ratio of the surface acoustic wave resonator. FIG. 15 shows the frequency characteristics with respect to the resonant impedance of the surface acoustic wave resonator when the film thickness of the second adjusting film shown in FIG. 4B is changed. As the substrate 101 having piezoelectric properties, a−10°-Y-cut LiNbO$_3$ substrate is used, and the film thickness of the IDT electrode 121 is 400 nm. The top portion of FIG. 16 shows the relationship between the film thickness of the second adjusting film and the resonant frequency fr. The intermediate portion of FIG. 16 shows the relationship between the film thickness of the second adjusting film and the anti-resonant frequency fa. The bottom portion of FIG. 16 shows the relationship between the film thickness of the second adjusting film and the bandwidth ratio BWR.

As shown in FIG. 15, when the film thickness of the second adjusting film is varied, the anti-resonant frequency fa and the resonant frequency fr are shifted. More specifically, as shown in FIG. 16, as the film thickness of the second adjusting film is thicker, the resonant frequency fr becomes higher, while the anti-resonant frequency fa becomes lower. The bandwidth ratio BWR thus becomes smaller. That is, adjusting of the film thickness of the second adjusting film can set the bandwidth ratio of the surface acoustic wave resonator.

Based on the above-described results, in order to set the bandwidth ratio of the series arm resonator 22s to be smaller than that of at least one of the parallel arm resonators 22p1 and 22p2, the second adjusting film which covers the IDT electrode of the series arm resonator 22s may be made thicker than that of at least one of the parallel arm resonators 22p1 and 22p2. More specifically, (1) the second adjusting film covering the IDT electrode of at least one of the parallel arm resonators is made thinner than that of the series arm resonator 22s, or (2) the second adjusting film is not provided on the IDT electrode of at least one of the parallel arm resonators.

This configuration can set the bandwidth ratio of the series arm resonator 22s to be smaller than that of at least one of the parallel arm resonators 22p1 and 22p2. By setting the bandwidth ratio in this manner, the sharpness on the higher-frequency side of the pass band can be enhanced.

The first and second adjusting films may suitably be set in accordance with the filter characteristics demanded for the filter. More specifically, for example, the second adjusting film also serves the function of improving the frequency-temperature and moisture-resistance characteristics, and may thus be set by reflecting these characteristics required for the filter. The bandwidth ratio may be adjusted mainly by the first adjusting film, for example, by determining whether the first adjusting film is provided or by changing the film thickness thereof.

Second Embodiment

The above-described first embodiment has been described through illustration of a ladder filter structure constituted by one series arm circuit and one parallel arm circuit. However, a similar technology may be applied to a ladder filter structure constituted by one or more series arm circuits and plural parallel arm circuits. In a second embodiment, a filter having such a filter structure will be described.

Figure 17:
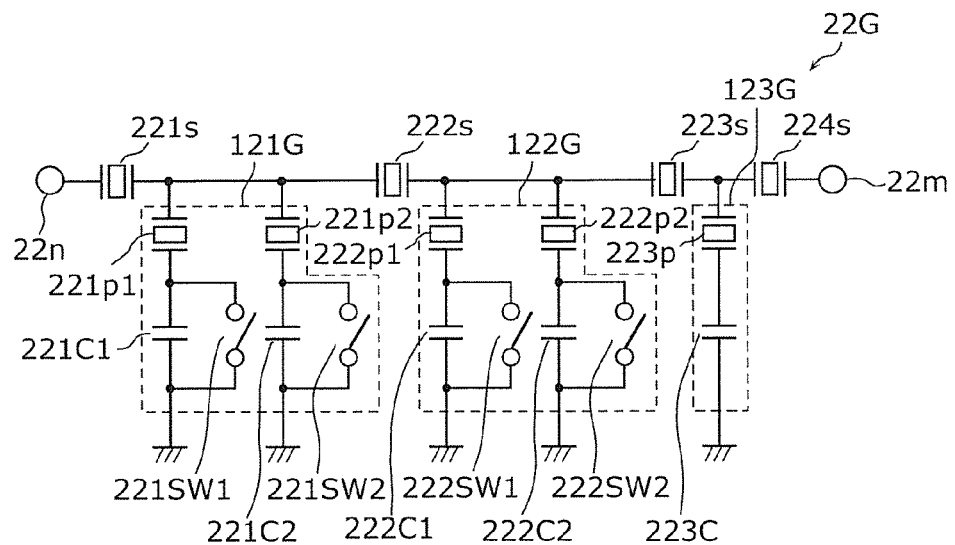
FIG. 17 is a circuit diagram illustrating the configuration of a filter according to a second embodiment.

FIG. 17 is a circuit diagram illustrating the configuration of a filter 22G according to the second embodiment.

The filter 22G shown in FIG. 17 is a radio-frequency filter circuit including series arm resonators 221s, 222s, 223s, and 2224s and a parallel arm resonator (first parallel arm resonator) 221p1, a parallel arm resonator 222p1, a parallel arm resonator (second parallel arm resonator) 221p2, a parallel arm resonator 222p2, and a parallel arm resonator 223p. The resonant frequency of the parallel arm resonator 221p2 is higher than that of the parallel arm resonator 221p1, and the resonant frequency of the parallel arm resonator 222p2 is higher than that of the parallel arm resonator 222p1. The anti-resonant frequency of the parallel arm resonator 221p2 is higher than that of the parallel arm resonator 221p1, and the anti-resonant frequency of the parallel arm resonator 222p2 is higher than that of the parallel arm resonator 222p1.

The filter 22G also includes capacitors 221C1, 221C2, 222C1, and 222C2, which are used for varying the bandpass characteristics, and switches (switch elements) 221SW1, 221SW2, 222SW1, and 222SW2. The filter 22G also includes a capacitor 223C.

The capacitor 221C1 and the switch 221SW1 are connected in parallel with each other and are connected in series with the parallel arm resonator 221p1, while the capacitor 221C2 and the switch 221SW2 are connected in parallel with each other and are connected in series with the parallel arm resonator 221p2. The capacitor 222C1 and the switch 222SW1 are connected in parallel with each other and are connected in series with the parallel arm resonator 222p1, while the capacitor 222C2 and the switch 222SW2 are connected in parallel with each other and are connected in series with the parallel arm resonator 222p2. The capacitor 223C is connected in series with the parallel arm resonator 223p.

In the filter 22G configured as described above, the parallel arm resonators 221p1 and 221p2, the capacitors 221C1 and 221C2, and the switches 221SW1 and 221SW2 form one parallel arm circuit 121G. The parallel arm resonators 222p1 and 222p2, the capacitors 222C1 and 222C2, and the switches 222SW1 and 222SW2 form one parallel arm circuit 122G. The parallel arm resonator 223p and the capacitor 223C form one parallel arm circuit 123G. Each of the series arm resonators 221s, 222s, 223s, and 2224s forms a series arm circuit. A set of the capacitor 221C1 and the switch 221SW1, a set of the capacitor 221C2 and the switch 221SW2, a set of the capacitor 222C1 and the switch 222SW1, a set of the capacitor 222C2 and the switch 222SW2 each forms a variable frequency circuit. That is, the filter 22G has a ladder filter structure constituted by the four series arm circuits and the three parallel arm circuits 121G, 122G, and 123G.

The configurations of the parallel arm circuits 121G and 122G are similar to those of the parallel arm circuits (in particular, the configuration of the parallel arm circuit 120E) of the first embodiment. The filter 22G according to this embodiment thus achieves advantages similar to those of the first embodiment.

In the filter 22G according to this embodiment, the parallel arm circuit 121G includes the first parallel arm resonator (parallel arm resonator 221p1 in this embodiment), the second parallel arm resonator (parallel arm resonator 221p2 in this embodiment), and the switch elements (221SW1 and 221SW2 in this embodiment). The parallel arm circuit 122G includes the first parallel arm resonator (parallel arm resonator 222p1 in this embodiment), the second parallel arm resonator (parallel arm resonator 222p2 in this embodiment), and the switch elements (222SW1 and 222SW2 in this embodiment).

With this configuration, each of the at least two parallel arm circuits 121G and 122G includes the above-described variable frequency circuit so that the bandpass characteristics of the overall filter 22G can be adjusted more precisely. Accordingly, as a result of appropriately switching the switch elements between ON and OFF in each of the at least two parallel arm circuits 121G and 122G, it is possible to adjust the bandpass characteristics to switch to a suitable band. Additionally, the filter 22G includes plural (three in this embodiment) parallel arm circuits which form a ladder filter structure, thereby making it possible to enhance the attenuation (attenuation in the elimination band).

The filter configured as described above may be constituted by at least one series arm circuit and plural parallel arm circuits including at least two parallel arm circuits each having the above-described variable frequency circuit. The number of parallel arm circuits and that of series arm circuits are not limited to those described above. For example, three parallel arm circuits may not necessarily be provided, and two or four or more parallel arm circuits may be provided, instead.

In this embodiment, the parallel arm circuit 123G is unable to vary the resonant frequencies and anti-resonant frequencies. However, as in the parallel arm circuits in the first embodiment, the parallel arm circuit 123G may vary the resonant frequencies and anti-resonant frequencies. That is, all the parallel arm circuits (parallel arm circuits 121G through 123G in this embodiment) forming the filter 22G may be configured similarly to some of the parallel arm circuits of the first embodiment. In this case, all the parallel arm circuits may be configured in the same manner (similarly to the parallel arm circuit 120E, for example), or a certain parallel arm circuit may be configured (similarly to the parallel arm circuit 120D, for example) differently from the other parallel arm circuits.

Third Embodiment

The above-described first and second embodiments have been discussed through illustration of a ladder filter structure. However, a similar technology may be applied to a filter having a longitudinally coupled filter structure. In a third embodiment, a filter having such a filter structure will be described below.

Figure 18:
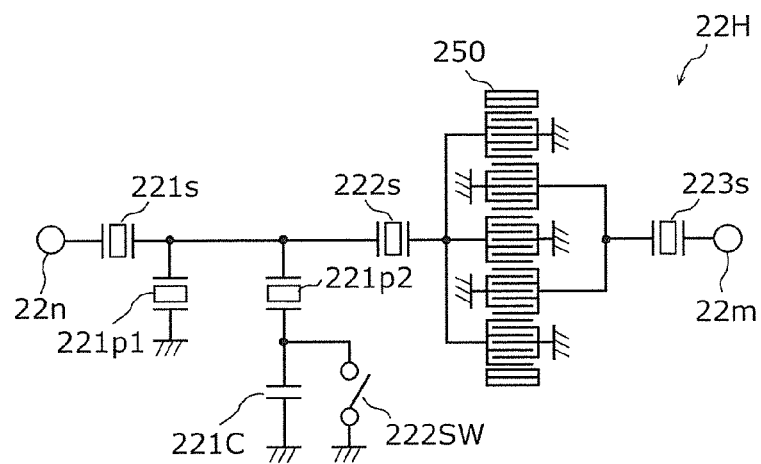
FIG. 18 is a circuit diagram illustrating the configuration of a filter according to a third embodiment.

FIG. 18 is a circuit diagram illustrating the configuration of a filter 22H according to the third embodiment.

As shown in FIG. 18, the filter 22H is a radio-frequency filter circuit including series arm resonators 221s, 222s, and 223s, a parallel arm resonator (first parallel arm resonator) 221p1, a parallel arm resonator (second parallel arm resonator) 221p2, and a longitudinally coupled resonator 250. The resonant frequency of the parallel arm resonator 221p2 is higher than that of the parallel arm resonator 221p1.

The filter 22H also includes a capacitor 221C for varying the bandpass characteristics and a switch (switch element) 221SW. The capacitor 221C and the switch 221SW are connected in parallel with each other and are connected in series with the parallel arm resonator 221p2.

That is, the filter 22H is a filter including the longitudinally coupled resonator 250 which is added to the ladder filter structure (in particular, filter 22A) of the first embodiment.

The longitudinally coupled resonator 250 is a longitudinally coupled filter circuit disposed between the input-output terminals 22m and 22n. In this embodiment, the longitudinally coupled resonator 250 is disposed between the ladder filter structure and the input-output terminal 22m, and is constituted by five IDTs and reflectors located on both sides thereof. The longitudinally coupled resonator 250 may not necessarily be located at a position between the ladder filter structure and the input-output terminal 22m, and may be located between the input-output terminal 22n and the ladder filter structure, for example.

The above-described configuration of the filter 22H (radio-frequency filter circuit) is similar to that of the parallel arm circuit (in particular, parallel arm circuit 120A) of the first embodiment. The filter 22H according to this embodiment thus achieves advantages similar to those of the first embodiment.

In the filter 22H according to this embodiment, adding the longitudinally coupled resonator 250 makes it possible to respond to the required filter characteristics, such as enhanced attenuation. In this embodiment, the longitudinally coupled resonator 250 is added to the ladder filter structure, in which case, the series arm circuits forming this ladder filter structure may be omitted. That is, the longitudinally coupled resonator 250 serves as a series arm circuit connected between the input-output terminals 22n and 22m. The filter 22H may be thus constituted by the longitudinally coupled resonator 250 and the parallel arm circuits.

Fourth Embodiment

The radio-frequency filter circuits according to the first through third embodiments may be applicable to a multiplexer including plural radio-frequency filter circuits. In this case, the radio-frequency filter circuits according to the first through third embodiments may be used as at least one of the radio-frequency filter circuits of the multiplexer. In this embodiment, such a multiplexer will be described below through illustration of a duplexer. In this duplexer, some of the radio-frequency filter circuits according to the first through third embodiments are used as a transmitting filter and a receiving filter.

Figure 19:
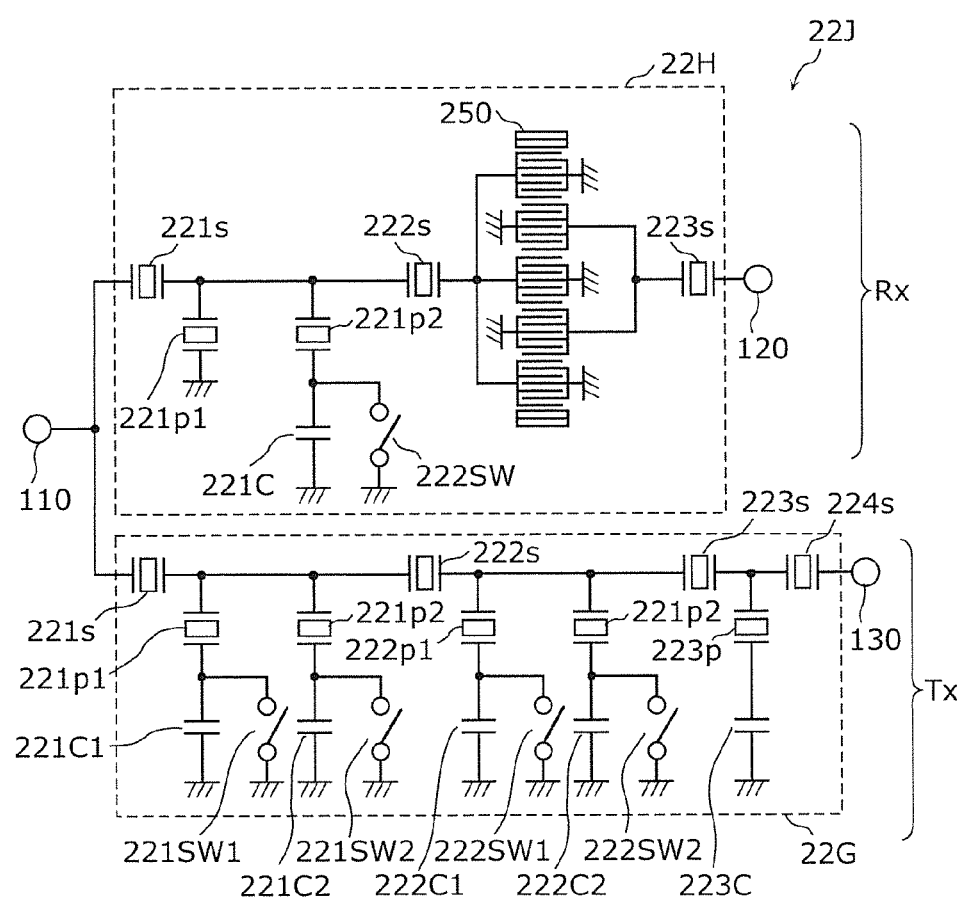
FIG. 19 is a circuit diagram illustrating the configuration of a duplexer according to a fourth embodiment.

FIG. 19 is a circuit diagram illustrating the configuration of a duplexer 22J according to a fourth embodiment. The duplexer 22J shown in FIG. 19 includes the filter 22H according to the third embodiment as the receiving filter and the filter 22G according to the second embodiment as the transmitting filter. That is, the filter 22H is connected between an antenna common terminal 110 and a receiving terminal 120, while the filter 22G is connected between the antenna common terminal 110 and a transmitting terminal 130. The duplexer 22J configured in this manner is able to switch both of the transmit pass band and the receive pass band without substantially increasing the insertion loss at the edges of the pass bands.

As described above, the multiplexer according to this embodiment (duplexer 22J in this case) includes some of the radio-frequency filter circuits according to the first through third embodiments (filters 22G and 22H in this case). The multiplexer is thus able to switch the pass bands without substantially increasing the insertion loss at the edges of the pass bands. Fewer radio-frequency filter circuits are required than the configuration in which radio-frequency filter circuits are individually provided for the respective pass bands. The size of the multiplexer can accordingly be reduced.

The multiplexer including some of the radio-frequency filter circuits according to the first through third embodiments is not limited to a duplexer, and may be a triplexer including three radio-frequency filter circuits, for example. The multiplexer includes a transmitting filter and a receiving filter. However, the multiplexer may alternatively include plural receiving filters or plural transmitting filters.

The use of some of the radio-frequency filter circuits according to the first through third embodiments as at least one of the plural filters of the multiplexer is sufficient. For example, the multiplexer may include a filter that is not able to switch the pass band. That is, plural radio-frequency filter circuits forming the multiplexer may include a radio-frequency filter circuit with the above-described variable frequency circuit and a radio-frequency filter circuit without the above-described variable frequency circuit.

Such a multiplexer may be configured in the following manner. The radio-frequency filter circuit without the variable frequency circuit may be constituted by an elastic wave resonator. The bandwidth ratio of at least one of the parallel arm resonators 22p1 and 22p2 forming the radio-frequency filter circuit with the variable frequency circuit may be greater than that of the elastic wave resonator forming the radio-frequency filter circuit without the variable frequency circuit.

Many radio-frequency filter circuits without the variable frequency circuit support only one of the 3GPP bands. In contrast, radio-frequency filter circuits with the variable frequency circuits support multiple 3GPP bands. This will be explained more specifically. When the switch element of the variable frequency circuit of a radio-frequency filter circuit is ON, the frequency difference (second bandwidth) between the lower anti-resonant frequency and the lower resonant frequency of the parallel arm circuit including the parallel arm resonator 22p1 and the frequency difference (third bandwidth) between the higher resonant frequency and the lower anti-resonant frequency of this parallel arm circuit are smaller than the frequency difference (first bandwidth) between the anti-resonant frequency and the resonant frequency of the parallel arm resonator 22p1.

When the switch element of the variable frequency circuit of the radio-frequency filter circuit is OFF, one of the second and third bandwidths becomes even smaller. The variable frequency range of the resonant frequency or the anti-resonant frequency of the parallel arm circuit that can be changed as a result of the switch element being switched between ON and OFF is even smaller than the second bandwidth or the third bandwidth.

By setting the bandwidth ratio of the first parallel arm resonator to be greater than that of the elastic wave resonator forming the radio-frequency filter circuit without the variable frequency circuit, the variable frequency range can be increased, so that more bands can be supported.

In each of the plural radio-frequency filter circuits forming the multiplexer, one terminal is connected to a common terminal, such as the antenna common terminal, directly or indirectly via a connection circuit. The connection circuit is a phase shifter, a switch for selecting at least one of the radio-frequency filter circuits, or a circulator.

Fifth Embodiment

The radio-frequency filter circuits discussed in the first through third embodiments and the multiplexer discussed in the fourth embodiment may be applicable to a radio-frequency front-end circuit that supports a system using more bands than the radio-frequency front-end circuit 2 of the first embodiment. Such a radio-frequency front-end circuit will be described below in a fifth embodiment.

Figure 20:
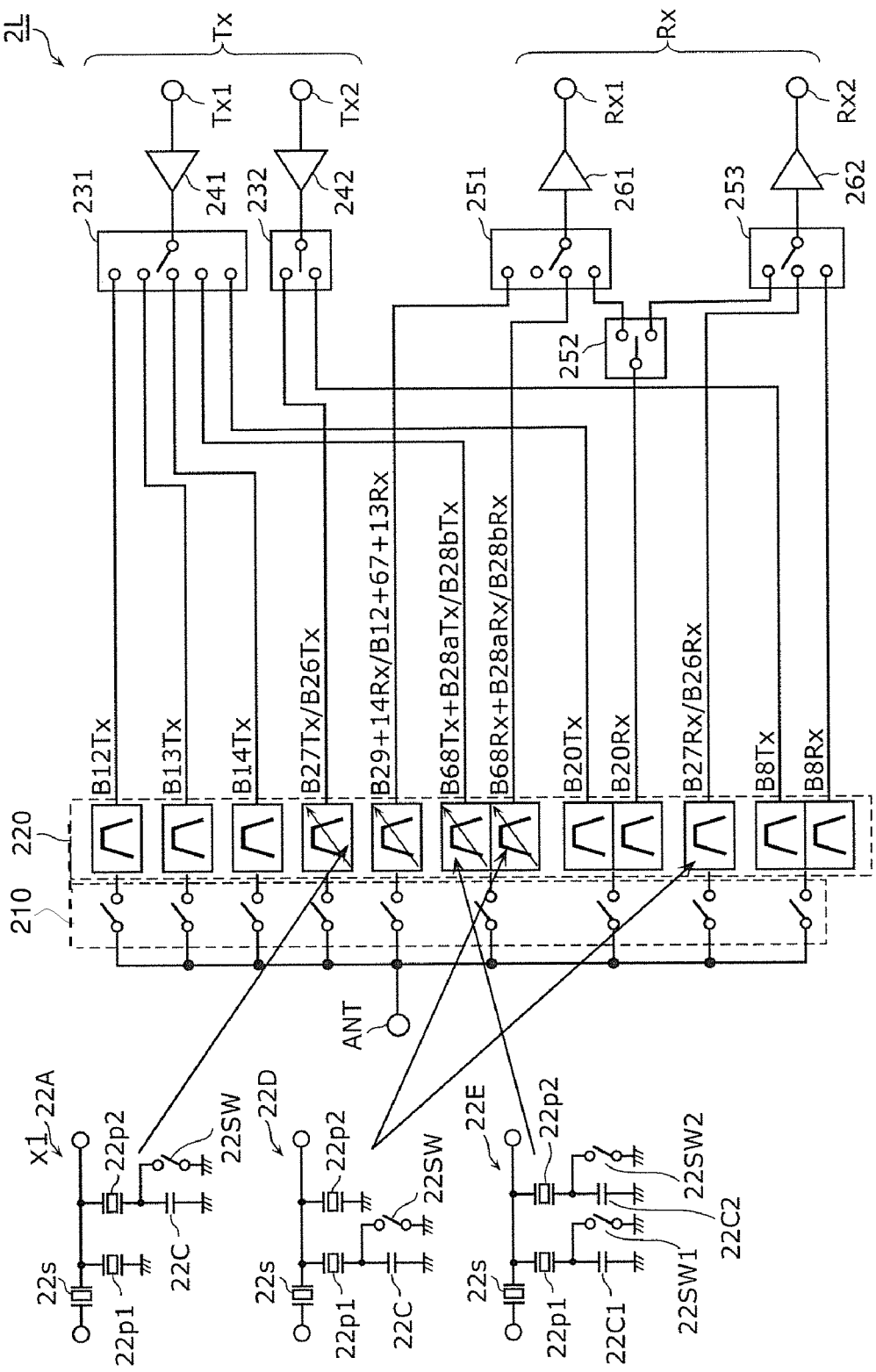
FIG. 20 is a diagram illustrating the configuration of a radio-frequency front-end circuit according to a fifth embodiment.

FIG. 20 is a diagram illustrating the configuration of a radio-frequency front-end circuit 2L according to the fifth embodiment.

As shown in FIG. 20, the radio-frequency front-end circuit 2L includes an antenna terminal ANT, transmitting terminals Tx' and Tx2, and receiving terminals Rx1 and Rx2. The radio-frequency front-end circuit 2L also includes a switch group 210 constituted by multiple switches, a filter group 220 constituted by multiple filters, transmitting switches 231 and 232, receiving switches 251, 252, and 253, transmitting amplifier circuits 241 and 242, and receiving amplifier circuits 261 and 262 in this order from the antenna terminal ANT.

The switch group 210 connects the antenna terminal ANT and a signal path corresponding to a predetermined band in accordance with a control signal outputted from a controller (not shown). The switch group 210 is constituted by plural SPST switches. The switch group 210 may not necessarily connect the antenna terminal ANT to only one signal path and may connect it to multiple signal paths. That is, the radio-frequency front-end circuit 2L may support carrier aggregation.

The filter group 220 is constituted by multiple filters (including duplexers) having pass bands in: (i) the transmission band of Band 12; (ii) the transmission band of Band 13; (iii) the transmission band of Band 14; (iv) the transmission band of Band 27 (or Band 26); (v) the reception bands of Band 29 and Band 14 (or Band 12, Band 67, and Band 13); (vi-Tx) the transmission bands of Band 68 and Band 28a (or Band 68 and Band 28b); (vi-Rx) the reception bands of Band 68 and Band 28a (or Band 68 and Band 28b); (vii-Tx) the transmission band of Band 20; (vii-Rx) the reception band of Band 20; (viii) the reception band of Band 27 (or Band 26); (ix-Tx) the transmission band of Band 8; and (ix-Rx) the reception band of Band 8.

The transmitting switch 231 is a switch circuit including plural selection terminals connected to plural low-band transmitted signal paths and a common terminal connected to the transmitting amplifier circuit 241. The transmitting switch 232 is a switch circuit including plural selection terminals connected to plural high-band transmitted signal paths and a common terminal connected to the transmitting amplifier circuit 242. The transmitting switches 231 and 232 are switch circuits that are disposed at a stage preceding the filter group 220 (at a stage preceding the filter group 220 in the transmitted signal paths, in this case) and that are connected or disconnected in accordance with a control signal from the controller (not shown). Radio-frequency signals (radio-frequency transmitted signals in this case) amplified by the transmitting amplifier circuits 241 and 242 pass through predetermined filters of the filter group 220 and are outputted to the antenna element 1 (see FIG. 1) via the antenna terminal ANT.

The receiving switch 251 is a switch circuit including plural selection terminals connected to plural low-band received signal paths and a common terminal connected to the receiving amplifier circuit 261. The receiving switch 252 is a switch circuit including a common terminal connected to the received signal path of a predetermined band (Band 20 in this case) and two selection terminals connected to the selection terminal of the receiving switch 251 and that of the receiving switch 252. The receiving switch 253 is a switch circuit including plural selection terminals connected to plural high-band received signal paths and a common terminal connected to the receiving amplifier circuit 262. The receiving switches 251 through 253 are disposed at a stage following the filter group 220 (at a stage following the filter group 220 in the received signal path, in this case) and are connected or disconnected in accordance with a control signal from the controller (not shown). Radio-frequency signals (radio-frequency received signals in this case) inputted into the antenna terminal ANT pass through predetermined filters of the filter group 220, and are amplified in the receiving amplifier circuits 261 and 262, and are then outputted to the RFIC 3 (see FIG. 1) via the receiving terminals Rx1 and Rx2. A low-band RFIC and a high-band RFIC may individually be provided.

The transmitting amplifier circuit 241 is a power amplifier which amplifies the power of a low-band radio-frequency transmitted signal. The transmitting amplifier circuit 242 is a power amplifier which amplifies the power of a high-band radio-frequency transmitted signal.

The receiving amplifier circuit 261 is a low-noise amplifier which amplifies the power of a low-band radio-frequency received signal. The receiving amplifier circuit 262 is a low-noise amplifier which amplifies the power of a high-band radio-frequency received signal.

The radio-frequency front-end circuit 2L configured as described above includes the filter 22A of the first embodiment as the filter using (iv) the transmission band of Band 27 (or Band 26) as the transmission band. That is, this filter switches the pass band between the transmission band of Band 27 and that of Band 26 in accordance with a control signal.

The radio-frequency front-end circuit 2L configured as described above also includes the filter 22D of the first modified example of the first embodiment as the transmitting filter using (vi-Tx) the transmission bands of Band 68 and Band 28a (or Band 68 and Band 28b) as the pass bands, and also includes the filter 22E of the second modified example of the first embodiment as the receiving filter using (vi-Rx) the reception bands of Band 68 and Band 28a (or Band 68 and Band 28b) as the pass bands. That is, the duplexer including this transmitting filter and this receiving filter switches the pass band between the transmission bands of Band 68 and Band 28a and those of Band 68 and Band 28b in accordance with a control signal and also switches the pass band between the reception bands of Band 68 and Band 28a and those of Band 68 and Band 28b in accordance with a control signal.

The radio-frequency front-end circuit 2L also includes the filter 22D of the first modified example of the first embodiment as the filter using (viii) the reception band of Band 27 (or Band 26) as the pass band. That is, this filter switches the pass band between the transmission band of Band 27 and that of Band 26 in accordance with a control signal.

The radio-frequency front-end circuit 2L configured as described above includes the filters 22A, 22D, and 22E (radio-frequency filter circuits) according to some of the first through third embodiments. Fewer filters are thus required than the configuration in which filters are individually provided for the respective bands. The size of the radio-frequency front-end circuit 2L can accordingly be reduced.

The radio-frequency front-end circuit 2L according to this embodiment includes the transmitting switches 231 and 232 (switch circuits) disposed at a stage preceding the filter group 220 (plural radio-frequency filter circuits) and the receiving switches 251 through 253 (switch circuits) disposed at a stage following the filter group 220. With this configuration, it is possible to handle together some of the signal paths through which radio-frequency signals are transferred. Hence, the same transmitting amplifier circuit 241 (amplifier circuit) can be used for some of the radio-frequency filter circuits, and the same transmitting amplifier circuit 242 (amplifier circuit) can be used for some of the radio-frequency filter circuits. Similarly, the same receiving amplifier circuit 261 (amplifier circuit) can be used for some of the radio-frequency filter circuits, and the same receiving amplifier circuit 262 (amplifier circuit) can be used for some of the radio-frequency filter circuits. As a result, the size and the cost of the radio-frequency front-end circuit 2L can be reduced.

The provision of at least one of the transmitting switches 231 and 232 may be sufficient, and the provision of at least one of the receiving switches 251 through 253 may be sufficient. The number of transmitting switches 231 and 232 and that of the receiving switches 251 through 253 are not limited to those discussed in this embodiment. For example, one transmitting switch and one receiving switch may be provided. The number of terminals such as selection terminals of the transmitting switches and that of the receiving switches are not restricted to those discussed in this embodiment. The transmitting switches and receiving switches may each have two selection terminals.

OTHER EMBODIMENTS

The radio-frequency filter circuits, the multiplexer, and the radio-frequency front-end circuit according to embodiments of the present disclosure have been discussed above through illustration of the first through fifth embodiments and modified examples of the first embodiment. However, the present disclosure is not restricted to the above-described embodiments and modified examples. Other embodiments implemented by combining certain elements in the above-described embodiments and modified examples, and modified examples obtained by making various modifications to the above-described embodiments by those skilled in the art without departing from the scope and spirit of the disclosure are also encompassed in the disclosure. Various devices integrating some of the radio-frequency filter circuits, the multiplexer, and the radio-frequency front-end circuit according to the present disclosure are also encompassed in the disclosure.

For example, the communication device 4 including the above-described radio-frequency front-end circuit 2 and RFIC 3 (RF signal processing circuit) is also encompassed within the present disclosure. The multiband-support communication device 4 can switch the frequency of a pass band and that of an attenuation pole in accordance with the required frequency specifications without substantially increasing the insertion loss at an edge of the pass band.

The parallel arm circuit may have plural parallel arm resonators including the first and second parallel arm resonators. The parallel arm circuit may include three or more parallel arm resonators.

The parallel arm resonator may not necessarily be connected to a node between the series arm resonator 22s and the input-output terminal 22m, but may be connected to a node between the series arm resonator and the input-output terminal 22n.

The magnitude relationship between the frequency interval between the resonant frequency and the anti-resonant frequency of the single series arm resonator (resonator bandwidth of the series arm resonator) and the frequency interval between the resonant frequency and the anti-resonant frequency of the single first parallel arm resonator or the single second parallel arm resonator (resonator bandwidth of the parallel arm resonator) is not particularly restricted. However, from the viewpoint of increasing the variable frequency range, it is preferable that the resonator bandwidth of the parallel arm resonator and that of the series arm resonator be almost the same or the resonator bandwidth of the parallel arm resonator be greater than that of the series arm resonator. "Almost the same" includes, not only the meaning of completely the same, but also that of substantially the same. The above-described magnitude relationship may be applied to one of the first and second parallel arm resonators (parallel arm resonator connected in series with an impedance element, for example) or to both of the first and second parallel arm resonators.

Each of the above-described series arm resonator and first and second parallel arm resonators is not limited to one solid resonator, and may be constituted by plural resonator portions divided from one resonator.

The controller may be disposed outside the RFIC 3 (RF signal processing circuit). For example, the controller may be provided in the radio-frequency front-end circuit. That is, the radio-frequency front-end circuit is not limited to the above-described configuration, and may include a radio-frequency filter circuit having a variable frequency circuit and a controller that controls ON and OFF operations of the switch element of the variable frequency circuit. The radio-frequency front-end circuit configured as described above can switch the pass band in accordance with the required frequency specifications without substantially increasing the insertion loss at an edge of the pass band.

The above-described radio-frequency filter circuit with the variable frequency circuit may be a TDD (Time Division Duplex) filter.

The above-described series arm circuit is not limited to a resonance circuit, and may be an impedance element, such as an inductor or a capacitor.

In the radio-frequency front-end circuit or the communication device, an inductor or a capacitor may be connected between the components of the radio-frequency front-end circuit or the communication device. In this case, a wiring inductor constituted by wiring for connecting the components may be an example of the inductor.

The present disclosure can widely be used in communication devices, such as cellular phones, as a small filter, multiplexer, front-end circuit, and communication device applicable to a multiband system.

1 antenna element
2, 2L radio-frequency front-end circuit
3 RFIC (RF signal processing circuit)
4 communication device
10, 10D, 10E first circuit
20, 20D, 20E second circuit
22A, 22B, 22D through 22H filter (radio-frequency filter circuit)
22C, 22C1, 22C2, 221C1, 221C2, 222C1, 222C2, 223C capacitor (impedance element)
22J duplexer
22L inductor (impedance element)
22m input-output terminal (first input-output terminal)
22n input-output terminal (second input-output terminal)
22p1, 22p2, 221p1, 221p2, 222p1, 222p2, 223p parallel arm resonator
22SW, 22SW1, 22SW2, 221SW1, 221SW2, 222SW1, 222SW2, 223SW switch (switch element)
22s, 221s through 224s series arm resonator
22T, 22Ta, 22Tb variable frequency circuit
24, 241, 242 transmitting amplifier circuit 26, 261, 262 receiving amplifier circuit
101 substrate having piezoelectric properties
103, 104 protection layer
110 antenna common terminal
120, Rx, Rx1, Rx2 receiving terminal
120A, 120D through 120F, 120Z, 121G through 123G parallel arm circuit
121 IDT electrode
121a, 121b comb-shaped electrode
121f electrode finger
122 Ksaw adjusting film
130, Tx, Tx1, Tx2 transmitting terminal
210 switch group
211, 212, 213, 214, 215 metal film
220 filter group
231, 232 transmitting switch (switch circuit)
251 through 253 receiving switch (switch circuit)
250 longitudinally coupled resonator
ANT antenna terminal
reso surface acoustic wave resonator
reso1, reso2 resonator

The invention claimed is:

1. A radio-frequency filter circuit comprising:
a series arm circuit having a path connected between first and second input-output terminals; and
a parallel arm circuit that is connected between ground and the path, wherein:
the parallel arm circuit comprises:
a first circuit connected between ground and the path and comprising a first parallel arm resonator, and
a second circuit connected in parallel with the first circuit between ground and the path and comprising a second parallel arm resonator,
the first circuit, the second circuit, or the first and second circuits further comprise:
a variable frequency circuit comprising an impedance element and a switch element connected in parallel with each other, and
the second parallel arm resonator has:
a resonant frequency different from a resonant frequency of the first parallel arm resonator, and
an anti-resonant frequency different from an anti-resonant frequency of the first parallel arm resonator, wherein:
the parallel arm circuit has at least two resonant frequencies and at least two anti-resonant frequencies; and
at least one of the resonant frequencies of the parallel arm circuit or at least one of the anti-resonant frequencies of the parallel arm circuit vary in accordance with a state of the switch element.

2. The radio-frequency filter circuit according to claim 1, wherein:
at least one of the resonant frequencies of the parallel arm circuit and at least one of the anti-resonant frequencies of the parallel arm circuit increases, or at least one of the resonant frequencies of the parallel arm circuit and at least one of the anti-resonant frequencies of the parallel arm circuit decreases, in accordance with a state of the switch element.

3. The radio-frequency filter circuit according to claim 1, wherein:
the resonant frequency of the first parallel arm resonator is lower than the resonant frequency of the second parallel arm resonator;
the anti-resonant frequency of the first parallel arm resonator is lower than the anti-resonant frequency of the second parallel arm resonator; and
the first circuit does not include the variable frequency circuit, and the second circuit includes the variable frequency circuit.

4. The radio-frequency filter circuit according to claim 1, wherein:
the resonant frequency of the first parallel arm resonator is lower than the resonant frequency of the second parallel arm resonator;
the anti-resonant frequency of the first parallel arm resonator is lower than the anti-resonant frequency of the second parallel arm resonator; and
the first circuit includes the variable frequency circuit, and the second circuit does not include the variable frequency circuit.

5. The radio-frequency filter circuit according to claim 1, wherein:
the resonant frequency of the first parallel arm resonator is lower than the resonant frequency of the second parallel arm resonator;
the anti-resonant frequency of the first parallel arm resonator is lower than the anti-resonant frequency of the second parallel arm resonator; and
each of the first and second circuits includes the variable frequency circuit.

6. The radio-frequency filter circuit according to claim 5, wherein:
the switch element of the variable frequency circuit included in the first circuit and the switch element of the variable frequency circuit included in the second circuit have a same state; and
the resonant frequencies of the first and second circuits and the anti-resonant frequencies of the first and second circuits increase, or the resonant frequencies of the first and second circuits and the anti-resonant frequencies of the first and second circuits decrease, in accordance with the states of the switch elements of the variable frequency circuits included in the first and second circuits.

7. The radio-frequency filter circuit according to claim 1, wherein the impedance element is a capacitor.

8. The radio-frequency filter circuit according to claim 1, wherein the impedance element is an inductor.

9. The radio-frequency filter circuit according to claim 1, wherein the radio-frequency filter circuit has a ladder filter structure comprising:
at least two parallel arm circuits, and
at least one series arm circuit.

10. The radio-frequency filter circuit according to claim 1, wherein:
the series arm circuit comprises a series arm resonator;
the resonant frequency of the first parallel arm resonator is lower than a resonant frequency of the series arm circuit; and
the resonant frequency of the second parallel arm resonator is higher than the resonant frequency of the series arm circuit.

11. The radio-frequency filter circuit according to claim 1, wherein the series arm circuit comprises a longitudinally coupled resonator disposed between the first and second input-output terminals.

12. The radio-frequency filter circuit according to claim 1, wherein:
each of the first and second parallel arm resonators is an elastic wave resonator, and
the elastic wave resonator of the first parallel arm resonator is a surface acoustic wave resonator or a bulk acoustic wave resonator, and the elastic wave resonator of the second parallel arm resonator is a surface acoustic wave resonator or a bulk acoustic wave resonator.

13. The radio-frequency filter circuit according to claim 1, wherein the switch element is a field-effect transistor (FET) switch made of gallium arsenide (GaAs) or complementary metal oxide semiconductor (CMOS), or is a diode switch.

14. The radio-frequency filter circuit according to claim 1, wherein the impedance element is a variable capacitor or a variable inductor.

15. A multiplexer comprising:
a plurality of radio-frequency filter circuits including the radio-frequency filter circuit according to claim 1, and a second radio-frequency filter circuit.

16. A radio-frequency front-end circuit comprising:
a plurality of radio-frequency filter circuits including the radio-frequency filter circuit according to claim 1; and
a switch circuit comprising a plurality of selection terminals and a common terminal, the plurality of selection terminals being individually connected to corresponding ones of the plurality of radio-frequency filter circuits and the common terminal being selectively connected to the plurality of selection terminals.

17. A communication device comprising:
an RF signal processing circuit configured to process radio-frequency signals transmitted and received by an antenna; and
the radio-frequency front-end circuit according to claim 16 configured to transfer the radio-frequency signals between the antenna and the RF signal processing circuit.

18. A radio-frequency front-end circuit comprising:
The radio-frequency filter circuit according to claim 1; and
a controller configured to control a state of the switch element.

19. A communication device comprising:
an RF signal processing circuit configured to process radio-frequency signals transmitted and received by an antenna; and
the radio-frequency front-end circuit according to claim 18 configured to transfer the radio-frequency signals between the antenna and the RF signal processing circuit.

20. A radio-frequency filter circuit comprising:
a series arm circuit having a path connected between first and second input-output terminals; and
a parallel arm circuit that is connected between ground and the path, wherein:
the parallel arm circuit comprises:
a first circuit connected between ground and the path and comprising a first parallel arm resonator, and
a second circuit connected in parallel with the first circuit between ground and the path and comprising a second parallel arm resonator,
the first circuit, the second circuit, or the first and second circuits further comprise:
a variable frequency circuit comprising an impedance element and a switch element connected in parallel with each other, and
the second parallel arm resonator has:
a resonant frequency different from a resonant frequency of the first parallel arm resonator, and
an anti-resonant frequency different from an anti-resonant frequency of the first parallel arm resonator, wherein:

the series arm circuit comprises a series arm resonator;
the resonant frequency of the first parallel arm resonator is lower than a resonant frequency of the series arm circuit; and
the resonant frequency of the second parallel arm resonator is higher than the resonant frequency of the series arm circuit, and wherein:
a bandwidth ratio of the series arm resonator is less than a bandwidth ratio of the first parallel arm resonator or the second parallel arm resonator,
the bandwidth ratio of the series arm resonator is equal to a frequency difference between the anti-resonant frequency and the resonant frequency of the series arm resonator divided by the resonant frequency of the series arm resonator,
the bandwidth ratio of the first parallel arm resonator is equal to a frequency difference between the anti-resonant frequency and the resonant frequency of the first parallel arm resonator divided by the resonant frequency of the first parallel arm resonator, and
the bandwidth ratio of the second parallel arm resonator is equal to a frequency difference between the anti-resonant frequency and the resonant frequency of the second parallel arm resonator divided by the resonant frequency of the second parallel arm resonator.

21. The radio-frequency filter circuit according to claim 20, wherein:
the radio-frequency filter circuit comprises a plurality of surface acoustic wave resonators, each of the surface acoustic wave resonators comprising an interdigital transducer (IDT) electrode having a plurality of electrode fingers formed on a substrate having piezoelectric properties; and
at least one of the plurality of surface acoustic wave resonators forms the series arm resonator.

22. The radio-frequency filter circuit according to claim 21, wherein the series arm resonator comprises a first adjusting film between the IDT electrode and the substrate, and wherein adjustment of the first adjusting film being causes and adjustment of the bandwidth ratio of the series arm resonator.

23. The radio-frequency filter circuit according to claim 21, wherein the IDT electrode of the series arm resonator is covered with a second adjusting film, and wherein adjustment of the second adjusting film causes and adjustment of the bandwidth ratio of the series arm resonator.

24. A multiplexer comprising:
a plurality of radio-frequency filter circuits, each radio-frequency filter circuit comprising:
a series arm circuit having a path connected between first and second input-output terminals, and
a parallel arm circuit that is connected between ground and the path, wherein:
the parallel arm circuit comprises:
a first circuit connected between ground and the path and comprising a first parallel arm resonator, and
a second circuit connected in parallel with the first circuit between ground and the path and comprising a second parallel arm resonator,
the first circuit, the second circuit, or the first and second circuits further comprise:
a variable frequency circuit comprising an impedance element and a switch element connected in parallel with each other, and
the second parallel arm resonator has:
a resonant frequency different from a resonant frequency of the first parallel arm resonator, and an anti-resonant frequency different from an anti-resonant frequency of the first parallel arm resonator; and and a second radio-frequency filter circuit, wherein:

the second radio-frequency filter circuit does not include a variable frequency circuit, the second radio-frequency filter circuit comprises an elastic wave resonator, and a bandwidth ratio of at least one of the first and second parallel arm resonators is greater than a bandwidth ratio of the elastic wave resonator, the bandwidth ratio of the first parallel arm resonator is equal to a frequency difference between the anti-resonant frequency and the resonant frequency of the first parallel arm resonator divided by the resonant frequency of the first parallel arm resonator, and the bandwidth ratio of the second parallel arm resonator is equal to a frequency difference between the anti-resonant frequency and the resonant frequency of the second parallel arm resonator divided by the resonant frequency of the second parallel arm resonator, and the bandwidth ratio of the elastic wave resonator is equal to a frequency difference between an anti-resonant frequency and a resonant frequency of the elastic wave resonator divided by the resonant frequency of the elastic wave resonator.

\* \* \* \* \*